(12) United States Patent
Kutsukake

(10) Patent No.: US 12,178,049 B2
(45) Date of Patent: Dec. 24, 2024

(54) SEMICONDUCTOR STORAGE DEVICE

(71) Applicant: Kioxia Corporation, Tokyo (JP)

(72) Inventor: Hiroyuki Kutsukake, Yokkaichi Mie (JP)

(73) Assignee: KIOXIA CORPORATION, Tokyo (JP)

( * ) Notice: Subject to any disclaimer, the term of this patent is extended or adjusted under 35 U.S.C. 154(b) by 98 days.

(21) Appl. No.: 17/891,386

(22) Filed: Aug. 19, 2022

(65) Prior Publication Data

US 2023/0292519 A1 Sep. 14, 2023

(51) Int. Cl.
| | |
|---|---|
| H10B 41/23 | (2023.01) |
| G11C 16/08 | (2006.01) |
| G11C 16/26 | (2006.01) |
| H10B 41/35 | (2023.01) |
| H10B 43/23 | (2023.01) |
| H10B 43/35 | (2023.01) |

(52) U.S. Cl.
CPC ............. *H10B 43/35* (2023.02); *G11C 16/08* (2013.01); *G11C 16/26* (2013.01); *H10B 41/23* (2023.02); *H10B 41/35* (2023.02); *H10B 43/23* (2023.02)

(58) Field of Classification Search
CPC ..... G11C 16/08; G11C 16/26; G11C 16/0483; G11C 11/4063; H10B 43/35; H10B 43/40; H10B 43/27; H10B 41/23; H10B 41/35; H10B 43/23; H01L 21/823475; H01L 27/0207
See application file for complete search history.

(56) References Cited

U.S. PATENT DOCUMENTS

| | | | | |
|---|---|---|---|---|
| 7,119,413 B2* | 10/2006 | Kutsukake | ............ | H01L 29/404 257/E27.103 |
| 7,830,715 B2* | 11/2010 | Taniwaki | ............... | H01L 27/105 365/185.23 |
| 7,911,844 B2* | 3/2011 | Nakamura | ............. | G11C 16/24 365/185.11 |
| 9,595,331 B1* | 3/2017 | Lee | .................... | G11C 16/0483 |
| RE49,274 E * | 11/2022 | Nakamura | ............. | G11C 16/24 |
| 2005/0036361 A1 | 2/2005 | Fukuzumi | | |

(Continued)

FOREIGN PATENT DOCUMENTS

| | | |
|---|---|---|
| TW | 200509367 A | 3/2005 |
| TW | 200733310 A | 9/2007 |

(Continued)

*Primary Examiner* — Khamdan N. Alrobaie
(74) *Attorney, Agent, or Firm* — Foley & Lardner LLP

(57) ABSTRACT

A semiconductor storage device includes a semiconductor substrate including a first region, a second region, and a third region, located apart from each other in such an order in a first direction in an element region. Each of the first to third regions including a source and/or drain region. The semiconductor storage device further includes a first conductor layer provided above the element region and having a first opening; a second conductor layer provided above the element region, having a second opening, and located apart from the first conductor layer in the first direction; a first contact, in the first opening, that is connected to the first region; a second contact, in the second opening, that is connected to the third region; a first memory cell connected to the first contact; and a second memory cell connected to the second contact.

19 Claims, 39 Drawing Sheets

(56) References Cited

U.S. PATENT DOCUMENTS

| | | |
|---|---|---|
| 2007/0210334 A1 | 9/2007 | Lim et al. |
| 2012/0236619 A1* | 9/2012 | Kutsukake ............. H10B 41/41 365/72 |
| 2014/0063953 A1* | 3/2014 | Sakurai .............. G11C 16/0483 365/185.11 |
| 2014/0284713 A1* | 9/2014 | Kutsukake ........ H01L 29/42392 257/337 |
| 2020/0006328 A1 | 1/2020 | Yamazaki et al. |
| 2020/0111916 A1 | 4/2020 | Karda et al. |
| 2021/0167068 A1 | 6/2021 | Wang et al. |
| 2022/0045094 A1 | 2/2022 | Lee et al. |
| 2024/0046994 A1* | 2/2024 | Lee ....................... H10B 41/40 |

FOREIGN PATENT DOCUMENTS

| | | |
|---|---|---|
| TW | 200807725 A | 2/2008 |
| TW | 201834149 A | 9/2018 |
| TW | 202036912 A | 10/2020 |
| TW | 202123388 A | 6/2021 |
| TW | 202209634 A | 3/2022 |

\* cited by examiner

SEMICONDUCTOR STORAGE DEVICE

CROSS-REFERENCE TO RELATED APPLICATION(S)

This application is based upon and claims the benefit of priority from Japanese Patent Application No. 2022-035564, filed Mar. 8, 2022, the entire contents of which are incorporated herein by reference.

FIELD

Embodiments described herein relate generally to a semiconductor storage device.

BACKGROUND

NAND flash memory, which is generally referred to as a semiconductor storage device, can store data non-volatilely. In a semiconductor storage device such as a NAND flash memory, a three-dimensional memory structure has been adopted for high integration and large capacity.

DETAILED DESCRIPTION

Figure 1:
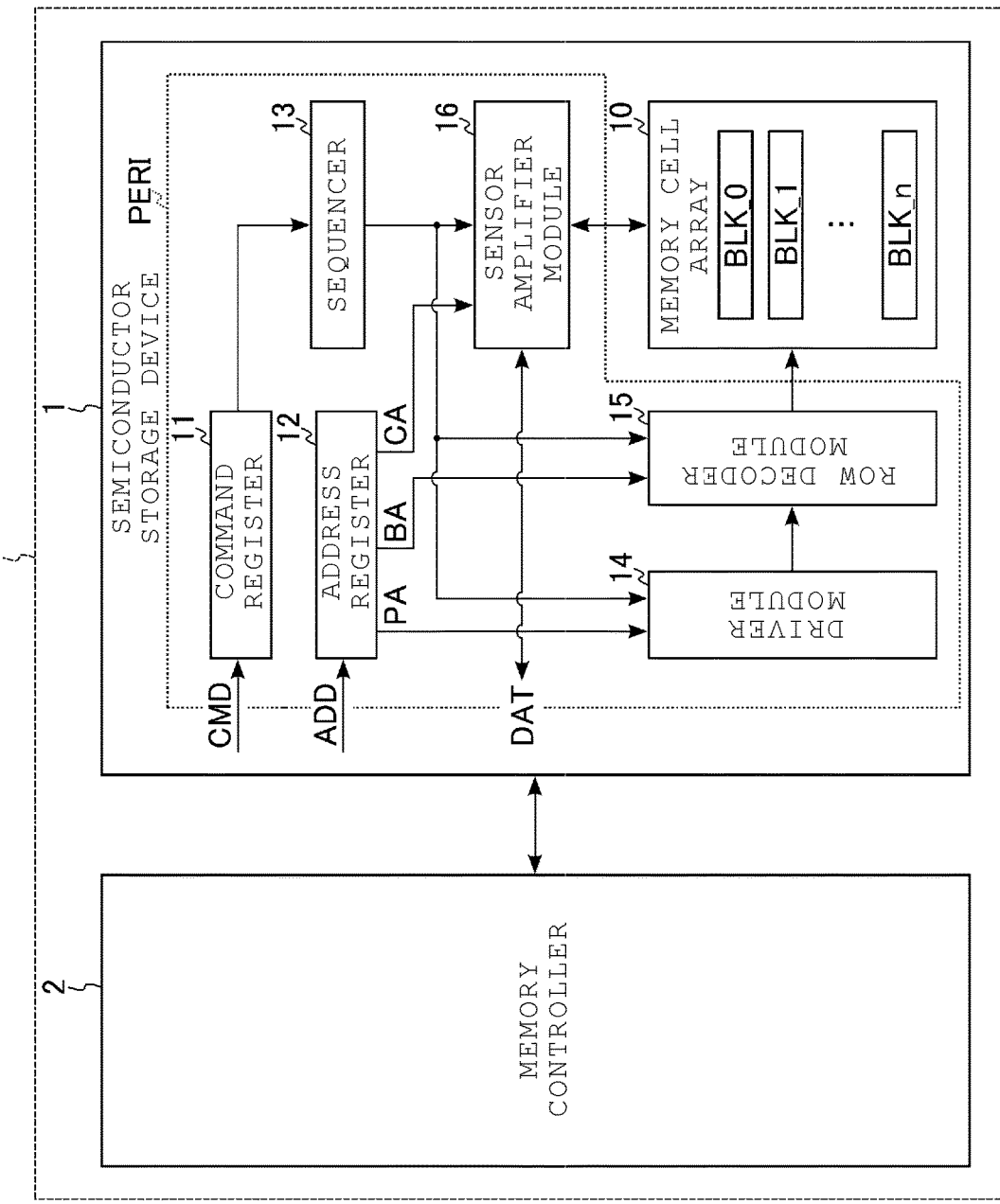
FIG. 1 is a block diagram showing an example of a configuration of a memory system including a semiconductor storage device according to an embodiment.

Embodiments provide a semiconductor storage device capable of preventing the deterioration of reliability.

In general, according to one embodiment, the semiconductor storage device includes a semiconductor substrate including a first region, a second region, and a third region, located apart from each other in such an order in a first direction in an element region. Each of the first to third regions including a source and/or drain region. The semiconductor storage device further includes a first conductor layer provided above the element region and having a first opening; a second conductor layer provided above the element region, having a second opening, and located apart from the first conductor layer in the first direction; a first contact, in the first opening, that is connected to the first region; a second contact, in the second opening, that is connected to the third region; a first memory cell connected to the first contact; and a second memory cell connected to the second contact.

Hereinafter, embodiments will be described with reference to the drawings. The dimensions and proportions of the drawings are not always the same as the actual ones.

In the following descriptions, components having substantially the same function and configuration are designated by the same reference numerals. When distinguishing elements having the same configuration from each other, different letters or numbers may be added to the end of the same reference numerals.

1. Embodiment 1.1 Configuration 1.1.1 Memory System

FIG. 1 is a block diagram showing an example of a configuration of a memory system including a semiconductor storage device according to an embodiment.

A memory system 3 includes a semiconductor storage device 1 and a memory controller 2.

The memory system 3 is, for example, a memory card such as an SD™ card, UFS (universal flash storage), and SSD (solid state drive). The memory system 3 is configured to be connected to an external host device (not shown).

The memory controller 2 is composed of, for example, an integrated circuit such as an SoC (system-on-a-chip). The memory controller 2 controls the semiconductor storage device 1 based on a request from the host device. Specifically, for example, the memory controller 2 writes the data requested to be written by the host device to the semiconductor storage device 1. Further, the memory controller 2 reads the data requested to be read from the host device from the semiconductor storage device 1 and transmits the read data to the host device.

The semiconductor storage device 1 is, for example, a NAND flash memory. The semiconductor storage device 1 stores data non-volatilely. The semiconductor storage device 1 is connected to the memory controller 2 via a NAND bus.

The NAND bus is, for example, a bus according to an SDR (single data rate) interface, a toggle DDR (double data rate) interface, or an ONFI (Open NAND flash interface).

1.1.2 Semiconductor Storage Device

Next, the internal configuration of the semiconductor storage device 1 according to the embodiment will be described with reference to the block diagram shown in FIG. 1. The semiconductor storage device 1 includes, for example, a memory cell array 10 and a peripheral circuit PERI. The peripheral circuit PERI includes a command register 11, an address register 12, a sequencer 13, a driver module 14, a row decoder module 15, and a sense amplifier module 16.

The memory cell array 10 includes a plurality of blocks BLK0 to BLKn (n is an integer of 1 or more). The block BLK is a set of a plurality of memory cell transistors capable of storing data non-volatilely and is used, for example, as a data erasing unit. Further, the memory cell array 10 is provided with a plurality of bit lines and a plurality of word lines. One memory cell transistor is associated with, for example, one bit line and one word line.

The command register 11 holds a command CMD received from the memory controller 2 by the semiconductor storage device 1. The command CMD includes, for example, a command for causing the sequencer 13 to execute a read operation, a write operation, an erasing operation, and the like.

The address register 12 holds an address information ADD received from the memory controller 2 by the semiconductor storage device 1. The address information ADD includes, for example, a page address PA, a block address BA, and a column address CA. For example, the page address PA, the block address BA, and the column address CA are used to select word lines, blocks BLK, and bit lines, respectively.

The sequencer 13 controls the operation of the entire semiconductor storage device 1. For example, the sequencer 13 controls the driver module 14, the row decoder module 15, the sense amplifier module 16, and the like based on the command CMD stored in the command register 11 and executes a read operation, a write operation, an erasing operation, and the like.

The driver module 14 generates a voltage used in a read operation, a write operation, an erasing operation, and the like. Then, the driver module 14 applies a generated voltage to the signal line corresponding to the selected word line based on, for example, the page address PA stored in the address register 12.

The row decoder module 15 selects one block BLK in the corresponding memory cell array 10 based on the block address BA stored in the address register 12. Then, the row decoder module 15 transfers, for example, the voltage applied to the signal line corresponding to the selected word line, to the selected word line in the selected block BLK.

The sense amplifier module 16 transfers data DAT between the memory controller 2 and the memory cell array 10. The data DAT includes write data and read data. More specifically, the sense amplifier module 16 transfers the write data received from the memory controller 2 to the memory cell array 10 in the write operation. Further, the sense amplifier module 16 executes the determination of data stored in the memory cell transistor based on the voltage of the bit line in the read operation. Then, the sense amplifier module 16 transfers the result of the determination as read data to the memory controller 2.

1.1.3 Circuit Configuration of Memory Cell Array

Figure 2:
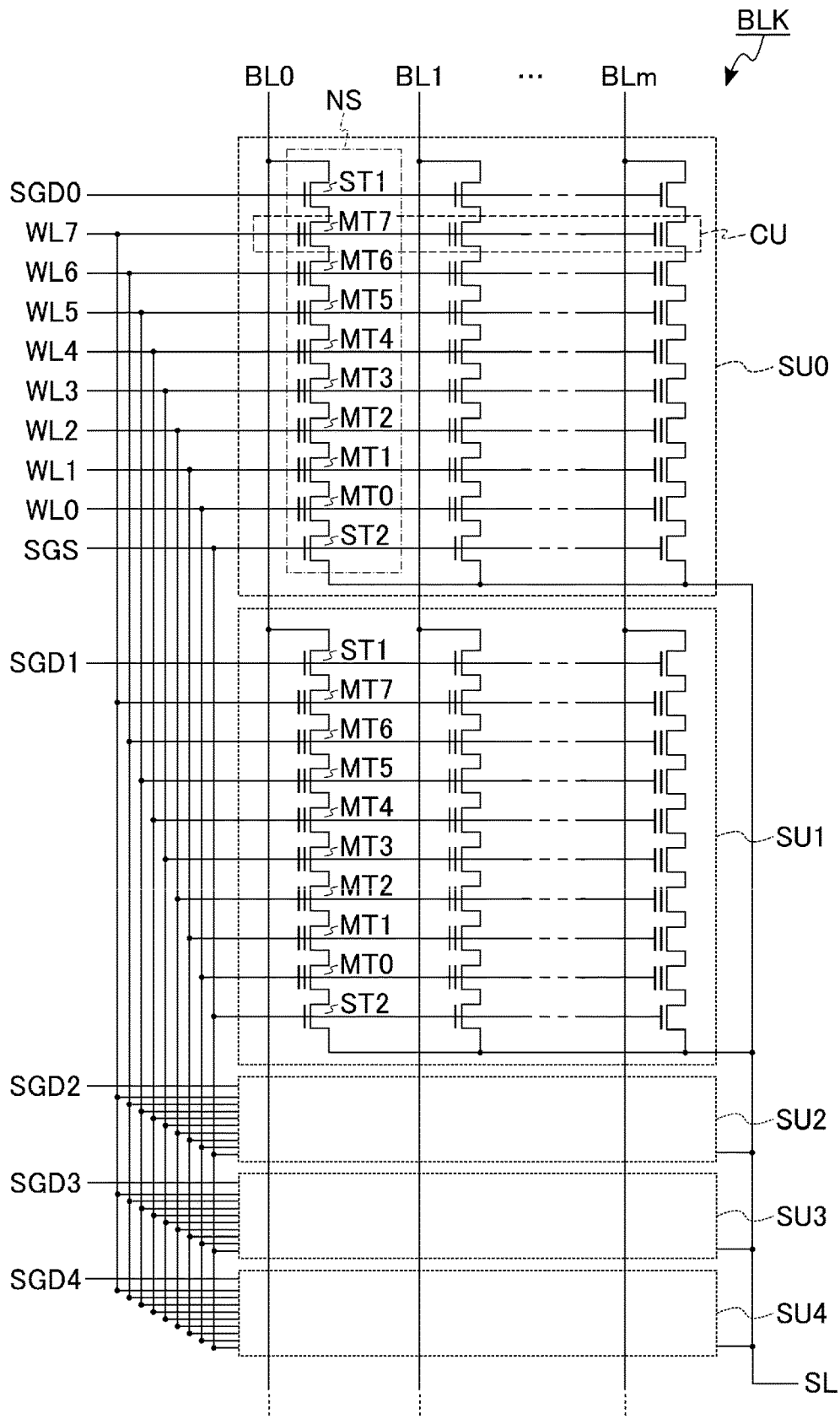
FIG. 2 is a circuit diagram showing an example of a circuit configuration of a memory cell array provided in the semiconductor storage device according to the embodiment.

FIG. 2 is a circuit diagram showing an example of the circuit configuration of the memory cell array provided in the semiconductor storage device according to the embodiment. FIG. 2 shows one block BLK out of a plurality of blocks BLK provided in the memory cell array 10. In the example shown in FIG. 2, the block BLK includes, for example, five string units SU0 to SU4.

Each string unit SU includes a plurality of NAND strings NS associated with bit lines BL0 to BLm (m is an integer of 1 or more), respectively. Each NAND string NS includes, for example, memory cell transistors MT0 to MT7, and select transistors ST1 and ST2. Each of the memory cell transistors MT0 to MT7 includes a control gate and a charge storage layer and stores data non-volatilely. Each of the select transistors ST1 and ST2 is used to select the string unit SU during various operations. In the following description, the memory cell transistors MT0 to MT7 are also referred to as a memory cell transistor MT, respectively.

In each NAND string NS, the memory cell transistors MT0 to MT7 are connected in series. One end of the select transistor ST1 is connected to the associated bit line BL, and the other end of the select transistor ST1 is connected to one end of the memory cell transistors MT0 to MT7 connected in series. One end of the select transistor ST2 is connected to the other end of the memory cell transistors MT0 to MT7 connected in series. The other end of the select transistor ST2 is connected to the source line SL.

In the same block BLK, the control gates of the memory cell transistors MT0 to MT7 are connected to the word lines WL0 to WL7, respectively. The gates of the select transistors ST1 in the string units SU0 to SU4 are connected to the select gate lines SGD0 to SGD4, respectively. On the other hand, the gates of the plurality of select transistors ST2 are commonly connected to the select gate line SGS. However, the present disclosure is not limited thereto and the gates of the plurality of select transistors ST2 may be connected to a plurality of select gate lines different for each string unit SU. In the following description, when the word lines WL0 to WL7 are not distinguished, they are simply referred to as the word line WL. When the select gate lines SGD0 to SGD4 are not distinguished, they are simply referred to as the select gate line SGD.

Each of the bit lines BL0 to BLm commonly connects one NAND string NS provided in each string unit SU between the plurality of blocks BLK. Each of the word lines WL0 to WL7 is provided for each block BLK. The source line SL is shared, for example, between the plurality of blocks BLK.

A set of a plurality of memory cell transistors MT connected to a common word line WL in one string unit SU is called, for example, a cell unit CU. For example, the storage capacity of the cell unit CU including the memory cell transistors MT, each of which stores 1-bit data, is defined as "1-page data". The cell unit CU may have a storage capacity of two pages or more data depending on the number of bits of data stored in a memory cell transistor MT.

The circuit configuration of the memory cell array 10 provided in the semiconductor storage device 1 according to the embodiment is not limited to the configuration described above. For example, the number of string units SU provided in each block BLK may be designed to be any number. The number of memory cell transistors MT and select transistors ST1 and ST2 provided in each NAND string NS may be designed to be any number.

1.1.4 Cross-Sectional Structure of Semiconductor Storage Device

Figure 3:
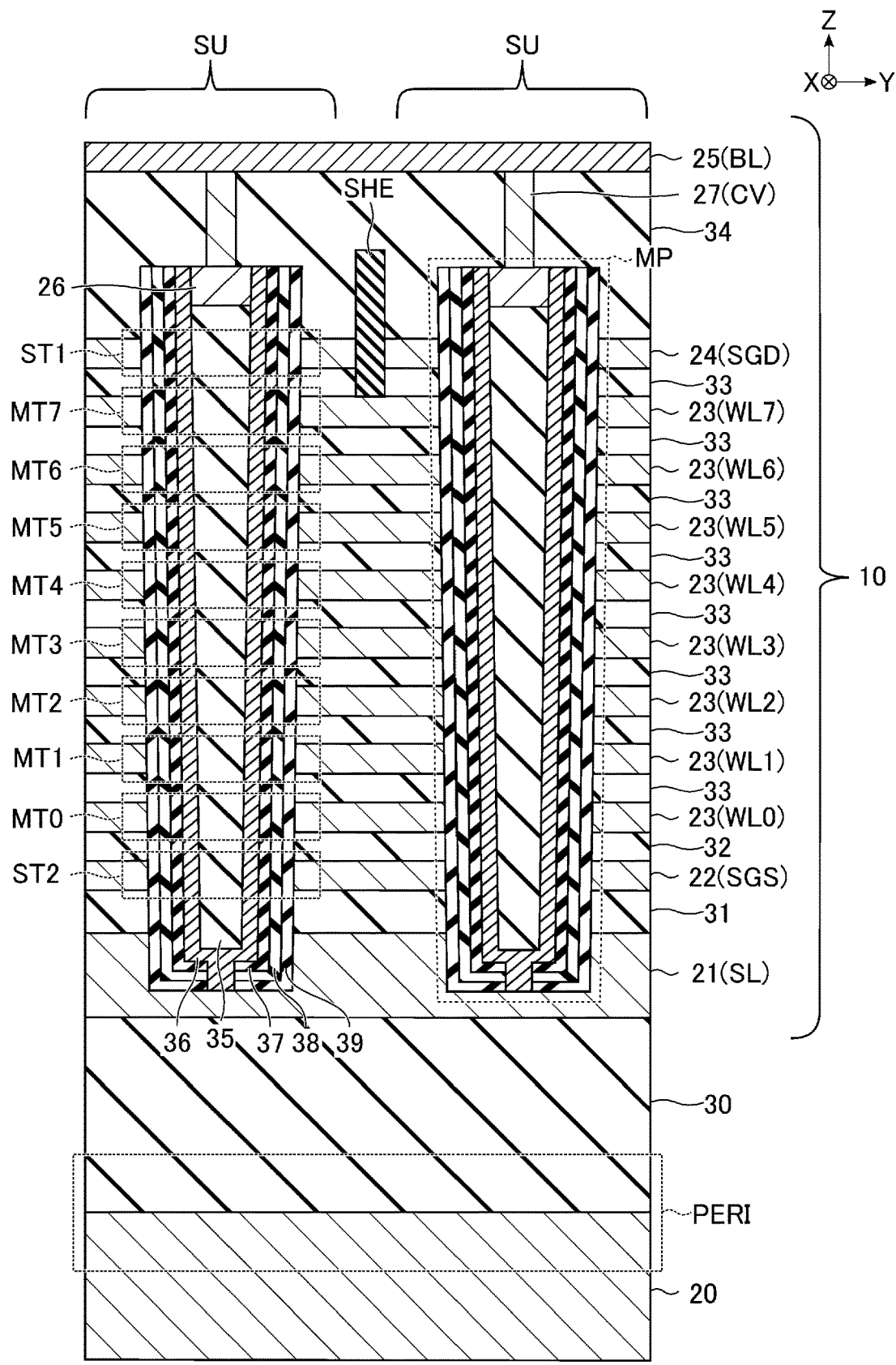
FIG. 3 is a cross-sectional view showing an example of a cross-sectional structure of the semiconductor storage device according to an embodiment.

Next, the cross-sectional structure of the semiconductor storage device 1 according to the embodiment will be described with reference to FIG. 3. FIG. 3 is a cross-sectional view showing an example of the cross-sectional structure of the semiconductor storage device according to the embodiment. FIG. 3 shows a cross-sectional structure including two string units SU out of five string units SU provided in one block BLK.

In the drawings referred to below, an X direction corresponds to the stretching direction of the word line WL, a Y direction corresponds to the stretching direction of the bit line BL, and a Z direction corresponds to the vertical direction with respect to the surface of the semiconductor substrate on which the semiconductor storage device 1 is formed.

The memory cell array 10 includes conductor layers 21, 22, 24, and 25 provided above a semiconductor substrate 20, a plurality of conductor layers 23, and a plurality of memory pillars MP (only two are shown in FIG. 3). In the following description, the direction in which the memory cell array 10 is provided with respect to the semiconductor substrate 20 is the upward direction. In addition, the opposite direction is the downward direction.

An insulator layer 30 is provided on the semiconductor substrate 20. The insulator layer 30 includes the peripheral circuit PERI corresponding to, for example, the row decoder module 15 and the like.

The conductor layer 21 is stacked on the insulator layer 30. The conductor layer 21 is formed in a plate shape extending along an XY plane, for example. The conductor layer 21 is used as the source line SL. The conductor layer 21 is made of a conductive material, and, for example, an N-type semiconductor to which impurities have been added, or metallic materials such as titanium nitride (TiN), tantalum nitride (TaN), aluminum (Al), a stacked film of tantalum nitride (TaN) and tantalum (Ta), a stacked film of titanium (Ti), titanium nitride (TiN), and tungsten (W), and a stacked film of titanium nitride (TiN) and tungsten silicide (WSi).

Further, the conductor layer 21 may have a stacked structure of a semiconductor and a metallic material such as a stacked film of titanium nitride (TiN), tungsten silicide (WSi), and poly-Si.

An insulator layer 31 is provided on the conductor layer 21. The conductor layer 22 is stacked on the insulator layer 31. The conductor layer 22 is formed in a plate shape extending along the XY plane, for example. The conductor layer 22 is used as the select gate line SGS. The conductor layer 22 contains, for example, tungsten (W).

An insulator layer 32 is provided on the conductor layer 22. On the insulator layer 32, eight conductor layers 23 and eight insulator layers 33 are stacked in the order of the conductor layer 23, the insulator layer 33, ..., the conductor layer 23, and the insulator layer 33. The conductor layer 23 is formed in a plate shape extending along the XY plane, for example. The eight stacked conductor layers 23 are used as word lines WL0 to WL7 in order from the conductor layer 21 side. The conductor layer 23 contains, for example, tungsten (W).

The conductor layer 24 and the insulator layer 34 are stacked in this order on the insulator layer 33 of the uppermost layer. The conductor layer 24 is formed in a plate shape extending along the XY plane, for example. The stacked conductor layer 24 is used as the select gate line SGD. The conductor layer 24 contains, for example, tungsten (W). The conductor layer 24 is electrically separated for each string unit SU by, for example, a slit SHE.

An insulator layer 34 is provided on the conductor layer 24. The conductor layer 25 is provided on the insulator layer 34. The conductor layer 25 is formed in a line shape extending in the Y direction, for example, and functions as a bit line BL. The conductor layer 25 contains, for example, copper (Cu).

The plurality of memory pillars MP are extended in the Z direction below the conductor layer 25 and penetrate the conductor layers 22 and 24, and the plurality of conductor layers 23. Further, the bottom of each of the memory pillars MP is located below the insulator layer 31 and is in contact with the conductor layer 21.

Each of the memory pillars MP includes, for example, a core member 35, a semiconductor film 36, a tunnel insulating film 37, a charge storage film 38, a block insulating film 39, and a semiconductor portion 26.

The core member 35 is provided, for example, to extend in the Z direction. The upper end of the core member 35 is provided in the layer above the conductor layer 24, and the lower end of the core member 35 is provided in the layer below the conductor layer 22. The core member 35 contains, for example, silicon oxide ($SiO_2$).

The semiconductor film 36 covers the side surface and the lower surface of the core member 35. The upper end of the semiconductor film 36 reaches a position equivalent to the position of the upper end of the core member 35. The lower end of the semiconductor film 36 is in contact with the conductor layer 21. The semiconductor film 36 contains, for example, polysilicon.

The tunnel insulating film 37 covers the side surface of the semiconductor film 36. The tunnel insulating film 37 contains, for example, silicon oxide ($SiO_2$).

The charge storage film 38 covers the side surface of the tunnel insulating film 37. The charge storage film 38 includes, for example, an insulator capable of storing charges. The insulator is, for example, silicon nitride (SiN).

The block insulating film 39 covers the side surface of the charge storage film 38. The block insulating film 39 contains, for example, silicon oxide ($SiO_2$).

The semiconductor portion 26 is in contact with the semiconductor film 36 and to cover the upper end of the core member 35. A conductor layer 27 that functions as a columnar contact CV is provided at the upper end of the semiconductor portion 26. The upper end of the conductor layer 27 is in contact with the conductor layer 25.

In the structure of the memory pillar MP described above, the portion where the memory pillar MP and the conductor layer 22 intersect each other functions as the select transistor ST2. Further, the portion where the memory pillar MP and the conductor layer 23 intersect each other functions as the memory cell transistor MT. Further, the portion where the memory pillar MP and the conductor layer 24 intersect each other functions as the select transistor ST1. Further, the semiconductor film 36 functions as channels of the memory cell transistors MT0 to MT7 and the select transistors ST1 and ST2, respectively. Further, the charge storage film 38 functions as a charge storage layer of the memory cell transistor MT.

1.1.5 Row Decoder Module

Next, a configuration example of the row decoder module 15 provided in the peripheral circuit PERI will be described.

1.1.5.1 Overall Configuration

Figure 4:
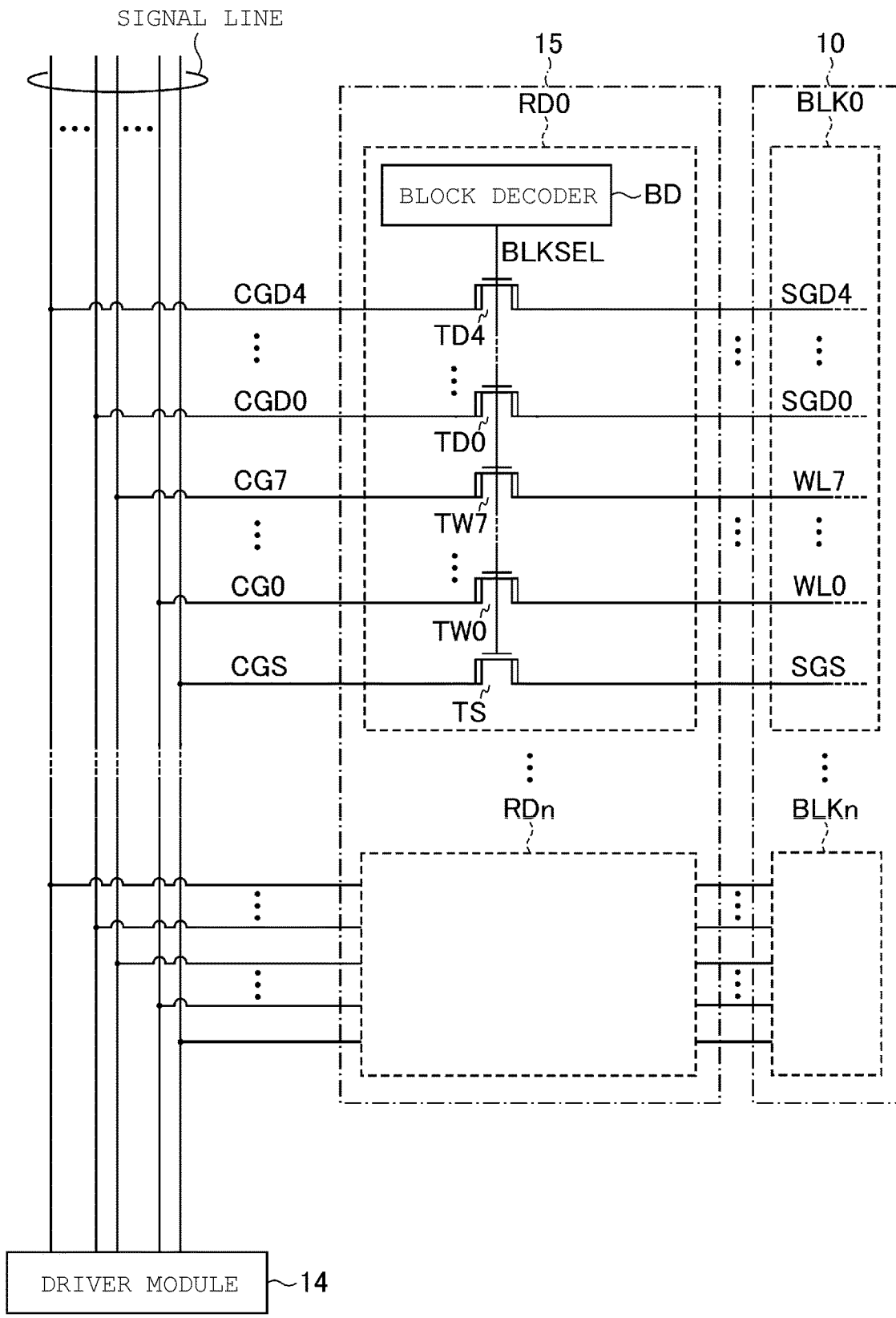
FIG. 4 is a circuit diagram showing an example of the configuration of a row decoder module, a driver module, and the memory cell array of the semiconductor storage device according to the embodiment.

The overall configuration of the row decoder module 15 will be described with reference to FIG. 4. FIG. 4 is a circuit diagram for illustrating an example of the configuration of the row decoder module, the driver module, and the memory cell array of the semiconductor storage device according to the embodiment.

The row decoder module 15 includes row decoders RD0 to RDn. The row decoders RD0 to RDn are used to select the block BLK. The row decoders RD0 to RDn are associated with the blocks BLK0 to BLKn, respectively.

Each row decoder RD includes, for example, a block decoder BD, and transfer transistors TW0 to TW7, TS, and TD0 to TD4. The transfer transistors TW0 to TW7, TS, and TD0 to TD4 are, for example, high breakdown voltage N-channel MOSFET (Metal-Oxide-Semiconductor Field Effect Transistor). The transfer transistors TW0 to TW7 are associated with the word lines WL0 to WL7, respectively. In the following description, when the transfer transistors TW0 to TW7 are not distinguished, they are simply referred to as the transfer transistor TW. The transfer transistors TS and TD0 to TD4 are associated with the select gate lines SGS and SGD0 to SGD4, respectively. In the following description, when the transfer transistors TD0 to TD4 are not distinguished, they are simply referred to as the transfer transistor TD. The high breakdown voltage MOSFET is a MOSFET having a gate insulating film having a physical film thickness of 10 nm or more. The gate-source voltage of the high breakdown voltage N-channel MOSFET may be, for example, a voltage of 10 V or more.

The block decoder BD decodes the block address BA. The block decoder BD applies an "H (High)" level voltage and an "L (Low)" level voltage to the transfer gate line BLK-SEL, for example, based on the result of the decoding.

The transfer transistors TW0 to TW7, TS, and TD0 to TD4 each connect the driver module 14 and the corresponding block BLK via signal lines CG0 to CG7, CGS, and CGD0 to CGD4. In the following description, when the signal lines CG0 to CG7, CGS, and CGD0 to CGD4 are not distinguished, they are simply referred to as the signal line CG.

More specifically, in each row decoder RD, the gate of the transfer transistor TD is connected to the transfer gate line BLKSEL. A first end of each transfer transistor TD is connected to the driver module 14 via the corresponding signal line CG among the signal lines CGD0 to CGD4. A second end of the transfer transistor TD is connected to the corresponding select gate line SGD of the select gate lines SGD0 to SGD4.

Each gate of the transfer transistor TW is connected to the transfer gate line BLKSEL. A first end of each transfer transistor TW is connected to the driver module 14 via the corresponding signal line CG among the signal lines CG0 to CG7. A second end of each transfer transistor TW is connected to the corresponding word line WL among the word lines WL0 to WL7.

The gate of the transfer transistor TS is connected to the transfer gate line BLKSEL. A first end of the transfer transistor TS is connected to the driver module 14 via the signal line CGS. A second end of the transfer transistor TS is connected to the select gate line SGS.

When an "H" level voltage is applied to the transfer gate line BLKSEL, the transfer transistors TW, TS, and TD are turned on. As a result, the voltages of the signal lines CG0 to CG7, CGS, and CGD0 to CGD4 are transferred to the word lines WL0 to WL7, the select gate line SGS, and the select gate lines SGD0 to SGD4 via the transfer transistors TW0 to TW7, TS, and TD0 to TD4, respectively. When an "L" level voltage is applied to the transfer gate line BLKSEL, the transfer transistors TW, TS, and TD are turned off.

1.1.5.2 Block Decoder

Figure 5:
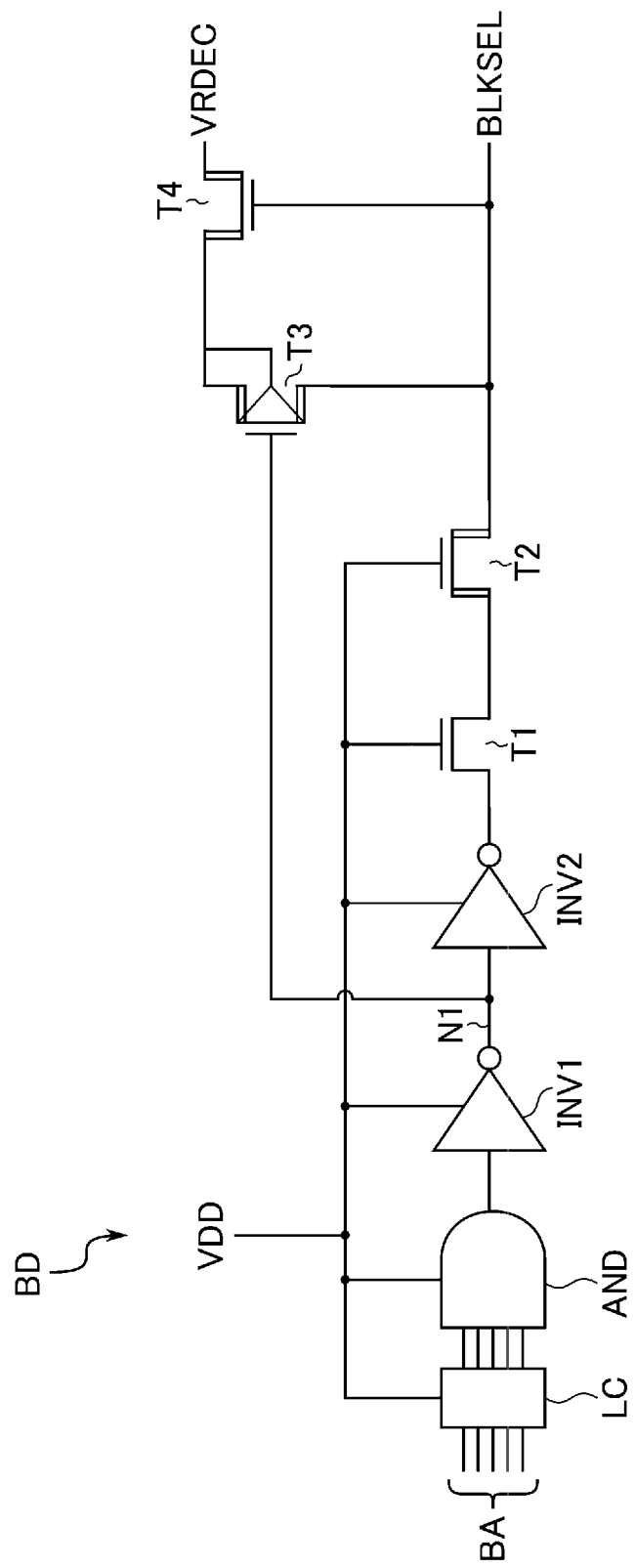
FIG. 5 is a circuit diagram showing an example of the configuration of a block decoder provided in the semiconductor storage device according to the embodiment.

The configuration of the block decoder BD provided in each row decoder RD will be described with reference to FIG. 5. FIG. 5 is a circuit diagram for illustrating an example of the configuration of the block decoder provided in the semiconductor storage device according to the embodiment.

As shown in FIG. 5, the block decoder BD includes a logic circuit LC, a logical product circuit AND, inverters INV1 and INV2, and transistors T1, T2, T3, and T4. The transistors T1, T2, and T4 are N-channel MOSFETs. The transistor T3 is a P-channel MOSFET. The transistors T2, T3, and T4 are high breakdown voltage MOSFETs having a gate insulating film having physical film thickness thicker than the transistor T1. The physical film thickness of each gate insulating film of the transistors T2, T3, and T4 is, for example, 10 nm or more. Further, the gate-source voltage of each of the transistors T2, T3, and T4 may be, for example, a voltage of 10 V or more. On the other hand, the physical film thickness of the gate insulating film of the transistor T1 is thinner than, for example, 10 nm. Further, the gate-source voltage of the transistor T1 is a voltage lower than, for example, 10 V.

The block address BA is input from the address register 12 to a first end of the logic circuit LC. For example, a power supply voltage VDD is applied to a second end of the logic circuit LC. The logic circuit LC is driven by the power supply voltage VDD. A signal based on the block address BA is output from a third end of the logic circuit LC. When the block address BA input to the logic circuit LC is the block address BA assigned to the block BLK corresponding to the logic circuit LC, an "H" level signal is output from the second end of the logic circuit LC. When the block address BA input to the logic circuit LC is not the block address BA assigned to the block BLK corresponding to the logic circuit LC, an "L" level signal is output from the second end of the logic circuit LC.

A first end of the logical product circuit AND is connected to the third end of the logic circuit LC. For example, the power supply voltage VDD is applied to a second end of the logical product circuit AND. The logical product circuit AND is driven by the power supply voltage VDD. From a third end of the logical product circuit AND, a signal based on the logical product operation of the signal output from the third end of the logic circuit LC is output.

A first end of the inverter INV1 is connected to the third end of the logical product circuit AND. For example, the power supply voltage VDD is applied to a second end of the inverter INV1. The inverter INV1 is driven by the power supply voltage VDD. A third end of the inverter INV1 is connected to a node N1. The third end of the inverter INV1 outputs the inverted signal of the signal output from the third end of the logical product circuit AND.

A first end of the inverter INV2 is connected to the node N1. For example, the power supply voltage VDD is applied to a second end of the inverter INV2. The inverter INV2 is driven by the power supply voltage VDD. A third end of the inverter INV2 outputs the inverted signal of the signal output from the third end of the inverter INV1.

A first end of the transistor T1 is connected to the third end of the inverter INV2. The power supply voltage VDD is applied to the gate of the transistor T1. A second end of the transistor T1 is connected to the transistor T2.

A first end of the transistor T2 is connected to the second end of the transistor T1. The power supply voltage VDD is applied to the gate of the transistor T2. A second end of the transistor T2 is connected to the transfer gate line BLKSEL.

A first end of the transistor T3 is connected to the transfer gate line BLKSEL. The gate of the transistor T3 is connected to the node N1. A second end of the transistor T3 is connected to the transistor T4 together with the back gate of the transistor T3.

A first end of the transistor T4 is connected to the second end of the transistor T3 and the back gate of the transistor T3. The gate of the transistor T4 is connected to the transfer gate line BLKSEL. A second end of the transistor T4 is connected to a node VRDEC. The node VRDEC is applied with a high voltage, which is set so that the voltage to be supplied to the corresponding signal line CG to the word line WL, the select gate line SGS, and the select gate line SGD can be transferred by the transfer transistors TW, TS, and TD, respectively, by being transferred to the transfer gate line BLKSEL via the transistors T3 and T4.

With the above configuration, the block decoder BD outputs an "H" level signal to the transfer gate line BLKSEL when the corresponding block BLK is selected. The block decoder BD outputs an "L" level signal to the transfer gate line BLKSEL when the corresponding block BLK is not selected.

1.1.5.3 Plane Configuration of Row Decoder Module

Figure 6:
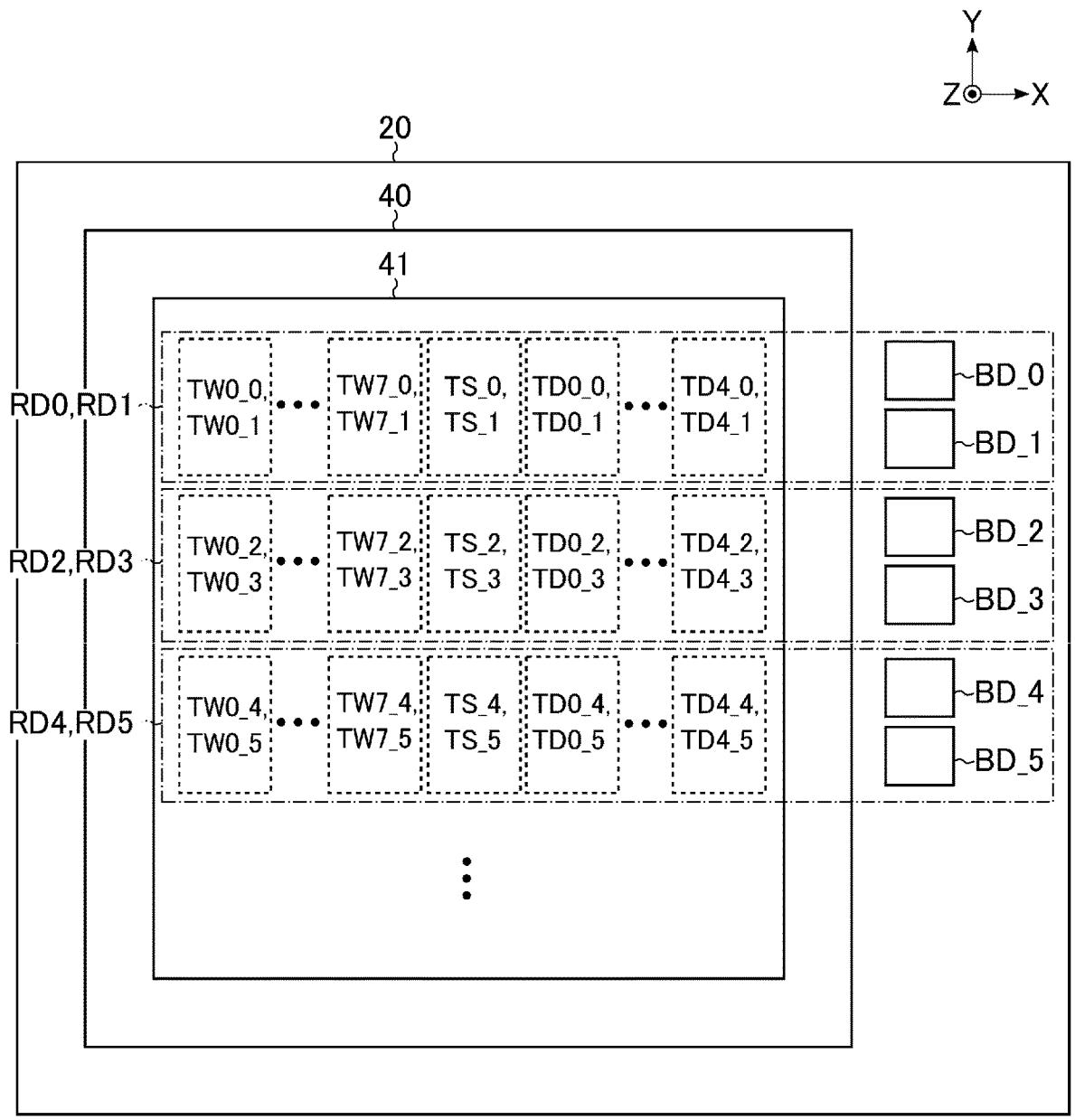
FIG. 6 is a plan view showing an example of a planar structure of the row decoder module of the semiconductor storage device according to the embodiment.

The planar structure of the row decoder module 15 of the semiconductor storage device 1 according to the embodiment will be described with reference to FIG. 6. FIG. 6 is a plan view showing an example of the planar structure of the row decoder module of the semiconductor storage device according to the embodiment. In the following description, the transfer transistors TW0 to TW7, TS, and TD0 to TD4 provided in the row decoder RDi, and the block decoder BD are referred to as transfer transistors TW0_i to TW7_i, TS_i, and TD0_i to TD4_i, and the block decoder BD_i, respectively. i is an integer of 0 or more and n or less.

The row decoder module 15 is provided on the semiconductor substrate 20.

The semiconductor substrate 20 is provided with an N-type well region 40. The N-type well region 40 is a region containing N-type impurities. The N-type well region 40 is provided in, for example, a rectangular region.

The N-type well region 40 is provided with a P-type well region 41. The P-type well region 41 is a region containing P-type impurities. The P-type well region 41 is provided in, for example, a rectangular region.

The set including the row decoders RD (2j) and RD (2j+1) is provided in, for example, a rectangular region. j is an integer of 0 or more and (n−1)/2 or less.

The set including the row decoders RD0 and RD1, the set including the row decoders RD2 and RD3, the set including the row decoders RD4 and RD5, . . . are located in this order, for example, along the Y direction.

In the set including row decoders RD (2j) and RD (2j+1), transfer transistors TS_(2j) and TS_(2j+1), TW0_(2j) and TW0_(2j+1), . . . , TW7_(2j) and TW7_(2j+1), TD0_(2j) and TD0_(2j+1), . . . , and TD4_(2j) and TD4_(2j+1) are provided in, for example, the P-type well region 41, respectively.

In the set including row decoders RD_(2j) and RD_(2j+1), the block decoders BD_(2j) and BD_(2j+1) are provided, for example, outside the N-type well region 40.

The set including transfer transistors TW_(2j) and TW_(2j+1), the set including TS_(2j) and TS_(2j+1), and the set including TD_(2j) and TD_(2j+1) are provided in plural, for example, in a matrix lined up in the X direction and the Y direction.

1.1.5.4 Transfer Transistor

The configuration of the transfer transistors TW, TS, and TD provided in the semiconductor storage device 1 according to the embodiment will be described.

(Planar Structure)

Figure 7:
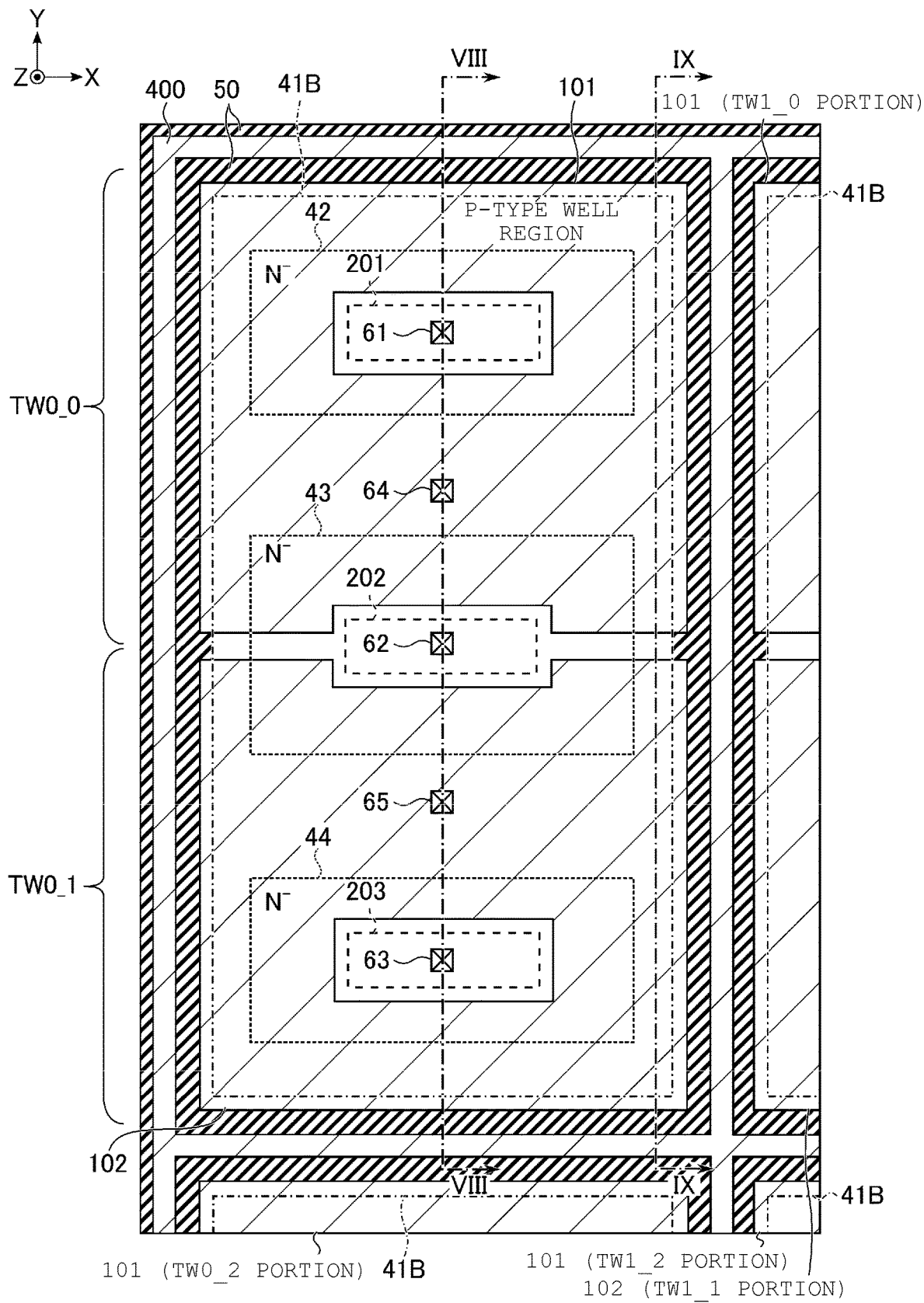
FIG. 7 is a plan view showing an example of a planar structure of a transfer transistor provided in the semiconductor storage device according to the embodiment.

The planar structure of the transfer transistors TW, TS, and TD will be described with reference to FIG. 7. FIG. 7 is a plan view showing an example of the planar structure of the transfer transistor provided in the semiconductor storage device according to the embodiment. In the example shown in FIG. 7, among the configurations shown in FIG. 6, a planar structure including transfer transistors TW0_0 and TW0_1 is mainly shown. FIG. 7 also shows a portion of the transfer transistor TW1_0, a portion of the transfer transistor TW1_1, a portion of the transfer transistor TW0_2, and a portion of the transfer transistor TW1_2. The structure of the set including transfer transistors TW_(2j) and TW_(2j+1), the structure of the set including TS_(2j) and TS_(2j+1), and the structure of the set including TD_(2j) and TD_(2j+1) are structures substantially equivalent to each other. In the following, the structures of the transfer transistors TW0_0 and TW0_1 will be mainly described.

The P-type well region 41 is electrically divided into P-type well regions 41A and 41B by, for example, an insulator layer 50 that functions as an element isolation area. In plan view, the insulator layer 50 surrounds the P-type well region 41B. The P-type well region 41B is a region surrounded by the alternate long and short dash line in FIG. 7. The P-type well region 41A is provided outside the region surrounded by the insulator layer 50 in a region not shown. Further, the insulator layer 50 is provided in a grid pattern to separate a plurality of sets of transfer transistors TW, TS, and TD located in a matrix, for example.

In the P-type well region 41B, the transfer transistors TW0_0 and TW0_1 are located in this order along the Y direction. In the following description, among the transfer transistors TW0_0 and TW0_1, the end where the transfer transistor TW0_0 is provided is assumed to be one end. Further, among the transfer transistors TW0_0 and TW0_1, the end where the transfer transistor TW0_1 is provided is assumed to be the other end.

In the P-type well region 41B, N⁻ impurity diffusion regions 42, 43, and 44 are provided apart from each other in this order in the Y direction. The N⁻ impurity diffusion regions 42, 43, and 44 are diffusion regions of N-type impurities such as phosphorus (P) and arsenic (As).

An electrode 201 is provided in the N⁻ impurity diffusion region 42. An electrode 202 is provided in the N⁻ impurity diffusion region 43. An electrode 203 is provided in the N⁻ impurity diffusion region 44. The region where the electrodes 201, 202, and 203 are provided is a region surrounded by a broken line in FIG. 7.

The electrode 201 functions as a first end of the transfer transistor TW0_0. The electrode 203 functions as a first end of the transfer transistor TW0_1. The electrode 202 functions as a second end of the transfer transistor TW0_0 and a second end of the transfer transistor TW0_1. In this way, the transfer transistors TW0_0 and TW0_1 share the electrode 202.

A contact 61 is connected on the electrode 201. The contact 61 is connected to the word line WL0 of the block BLK0. A contact 62 is connected on the electrode 202. The contact 62 is connected to the signal line CG0. A contact 63 is connected on the electrode 203. The contact 63 is connected to the word line WL0 of the block BLK1. In the example shown in FIG. 7, the number of contacts provided in each of the electrodes 201, 202, and 203 is one, but the number of contacts is not limited thereto. The number of contacts provided on each of the electrodes 201, 202, and 203 may be two or more.

Above the P-type well region 41B, two electrodes 101 and 102 are provided in this order from one end side to the other end side along the Y direction via a gate insulating film.

The electrode 101 functions as a gate for the transfer transistor TW0_0. The electrode 101 includes a first portion, a second portion, and a third portion. The first portion of the electrode 101 is a rectangular portion aligned with the contact 62 in the Y direction. The first portion of the electrode 101 has an opening that is open to surround the contact 61. The opening corresponds to the region where the electrode 201 is provided. The second portion and the third portion of the electrode 101 are rectangular portions connected to the first portion of the electrode 101 on the other end side of the first portion of the electrode 101, respectively. The second portion and the third portion of the electrode 101 sandwich at least a part of the electrode 202 in the X direction, and are provided apart from each other along the X direction. A sidewall (not shown in FIG. 7) is provided on the outer peripheral side surface of the electrode 101 and the inner peripheral side surface of the electrode 101 corresponding to the opening.

The electrode 102 functions as a gate for the transfer transistor TW0_1. The electrode 102 includes a first portion, a second portion, and a third portion. The first portion of the electrode 102 is a rectangular portion that is located with the contact 62 in the Y direction and is sandwiched the contact 62 in the Y direction together with the first portion of the electrode 101. The first portion of the electrode 102 has an opening that is open to surround the contact 63. The opening corresponds to the region where the electrode 203 is provided. The second portion and the third portion of the electrode 102 are rectangular portions connected to the first portion of the electrode 102 on one end side of the first portion of the electrode 102, respectively. The second portion and the third portion of the electrode 102 sandwich at least a part of the electrode 202 in the X direction and are provided apart from each other in the X direction. A sidewall (not shown in FIG. 7) is provided on the outer peripheral side surface of the electrode 102 and the inner peripheral side surface of the electrode 102 corresponding to the opening.

With the configuration of the electrodes 101 and 102 as described above, in a plan view, the first portion, the second portion, and the third portion of the electrode 101, and the first portion, the second portion, and the third portion of the electrode 102 are provided around the electrode 202.

A contact 64 for applying a voltage to the electrode 101 is provided on the electrode 101. The contact 64 is connected to the transfer gate line BLKSEL of the block BLK0. A contact 65 for applying a voltage to the electrode 102 is provided on the electrode 102. The contact 65 is connected to the transfer gate line BLKSEL of the block BLK1. In the example shown in FIG. 7, the number of contacts provided in each of the electrodes 101 and 102 is one but the number of contacts is not limited thereto. The number of contacts provided on each of the electrodes 101 and 102 may be two or more.

Normally, a voltage equal to or higher than the ground voltage VSS (0 V) is applied to the electrodes 101 and 102 during various operations such as write operation, read operation, and erasing operation.

In the region where the insulator layer 50 is provided, a shield conductor layer 400 is provided on the insulator layer 50 to surround, for example, the P-type well region 41B. The shield conductor layer 400 contains, for example, polysilicon. The shield conductor layer 400 may be provided in a grid pattern similar to the insulator layer 50. A sidewall (not shown in FIG. 7) is provided on the inner peripheral side surface and the outer peripheral side surface of the shield conductor layer 400.

The shield conductor layer 400 is in a state where the ground voltage VSS is applied, in a floating state, or in a state of the same potential as the P-type well region 41B. The shield conductor layer 400 prevents the generation of leakage current between transfer transistors during various operations.

(Cross-Sectional Structure)

Figure 8:
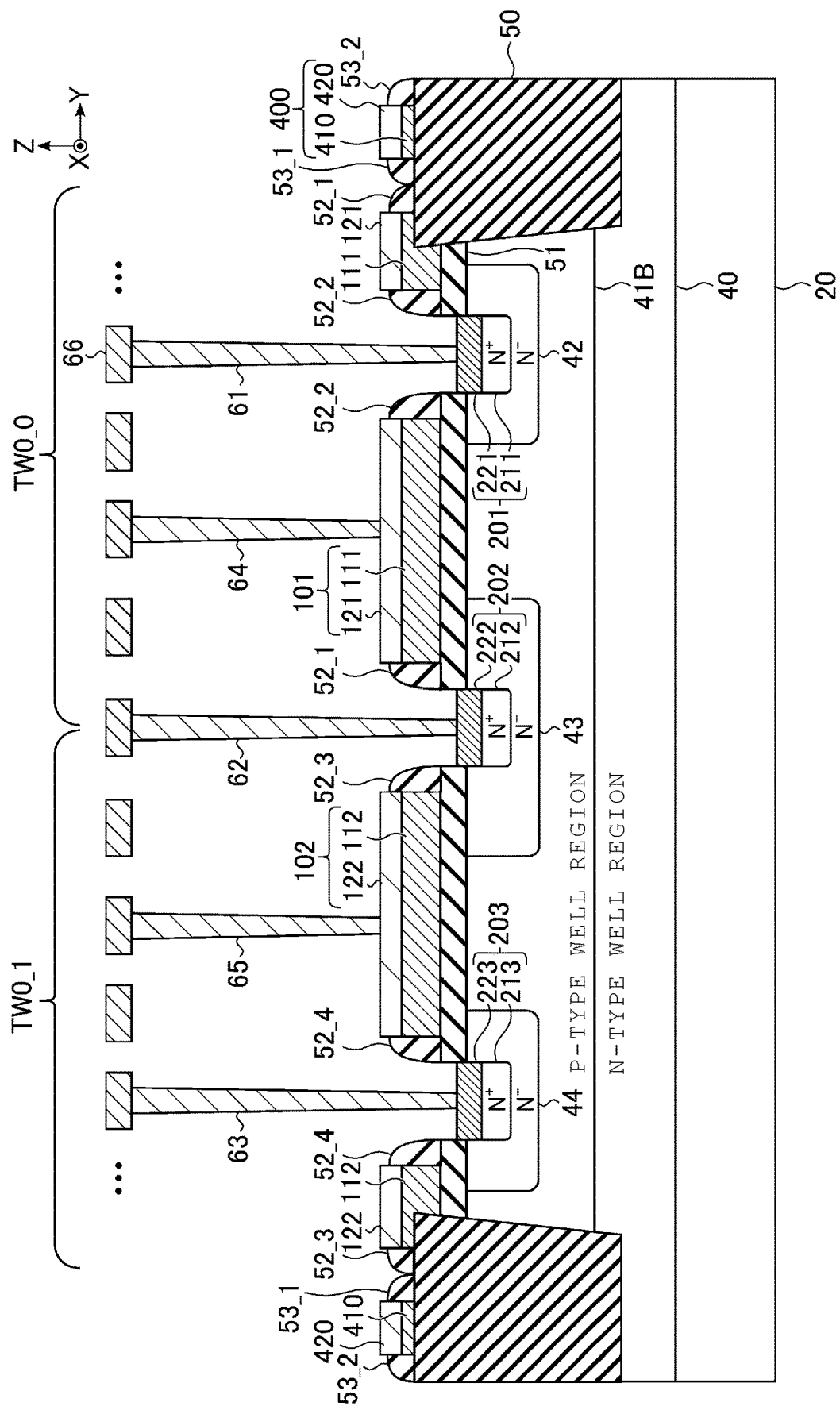
FIG. 8 is a cross-sectional view taken along the line VIII-VIII of FIG. 7 showing an example of a cross-sectional structure of the transfer transistor provided in the semiconductor storage device according to the embodiment.

The cross-sectional structures of the transfer transistors TW0_0 and TW0_1 will be described with reference to FIG. 8. FIG. 8 is a cross-sectional view taken along the line VIII-VIII of FIG. 7, showing an example of the cross-sectional structure of the transfer transistor provided in the semiconductor storage device according to the embodiment. In the following, the structure of the transfer transistor in the cross section shown in FIG. 8 will be described.

The upper end of the insulator layer 50 is provided at a position above the upper end of the P-type well region 41. The lower end of the insulator layer 50 is provided at a position above the lower end of the N-type well region 40 and below the lower end of the P-type well region 41.

The lower ends of the N⁻ impurity diffusion regions 42, 43, and 44 are provided at positions above the lower end of the P-type well region 41B.

The electrode 201 includes an N⁺ impurity diffusion region 211 and a conductor layer 221. The lower end of the N⁺ impurity diffusion region 211 is provided at a position above the lower end of the N⁻ impurity diffusion region 42. The N⁺ impurity diffusion region 211 is an impurity diffusion region containing N-type impurities such as phosphorus (P) or arsenic (As) at a higher concentration than the N⁻ impurity diffusion region 42. The conductor layer 221 is provided on the upper surface of the N⁺ impurity diffusion region 211. The upper end of the conductor layer 221 is higher than, for example, the upper end of the N⁻ impurity diffusion region 42. The conductor layer 221 contains, for example, nickel silicide (NiSi), nickel platinum silicide (NiPtSi), and cobalt silicide (CoSi).

The electrode 202 includes an N⁺ impurity diffusion region 212 and a conductor layer 222. The lower end of the N⁺ impurity diffusion region 212 is provided at a position above the lower end of the N⁻ impurity diffusion region 43. The N⁺ impurity diffusion region 212 is an impurity diffusion region containing N-type impurities such as phosphorus (P) or arsenic (As) at a higher concentration than the N⁻ impurity diffusion region 43. The conductor layer 222 is provided on the upper surface of the N⁺ impurity diffusion region 212. The upper end of the conductor layer 222 is higher than, for example, the upper end of the N⁻ impurity diffusion region 43. The conductor layer 222 is provided on the upper surface of the N⁺ impurity diffusion region 212. The conductor layer 222 contains, for example, nickel silicide (NiSi), nickel platinum silicide (NiPtSi), and cobalt silicide (CoSi).

The electrode 203 includes an N⁺ impurity diffusion region 213 and a conductor layer 223. The lower end of the N⁺ impurity diffusion region 213 is provided at a position above the lower end of the N⁻ impurity diffusion region 44. The N⁺ impurity diffusion region 213 is an impurity diffusion region containing N-type impurities such as phosphorus (P) or arsenic (As) at a higher concentration than the N⁻ impurity diffusion region 44. The conductor layer 223 is provided on the upper surface of the N⁺ impurity diffusion region 213. The upper end of the conductor layer 223 is higher than, for example, the upper end of the N⁻ impurity diffusion region 44. The conductor layer 223 is provided on the upper surface of the N⁺ impurity diffusion region 213. The conductor layer 223 contains, for example, nickel silicide (NiSi), nickel platinum silicide (NiPtSi), and cobalt silicide (CoSi).

A gate insulating film 51 is provided on the upper surface of the P-type well region 41B excluding the electrodes 201, 202, and 203. The upper end of the gate insulating film 51 is provided at a position below the upper end of the insulator layer 50.

The electrode 101 includes conductor layers 111 and 121. The upper end of the conductor layer 111 is provided at a position above the upper end of the insulator layer 50. The conductor layer 111 is provided on the upper surface of the portion of the gate insulating film 51 provided further on one end side than the electrode 202 and on the upper surface of the portion on the other end side of the portion of the insulator layer 50 provided further on one end side than the P-type well region 41B. The conductor layer 121 is provided on the upper surface of the conductor layer 111. The conductor layer 111 contains, for example, polysilicon. The conductor layer 121 contains, for example, nickel silicide (NiSi), nickel platinum silicide (NiPtSi), and cobalt silicide (CoSi).

The electrode 102 includes conductor layers 112 and 122. The upper end of the conductor layer 112 is provided at a position above the upper end of the insulator layer 50. The conductor layer 112 is provided on the upper surface of the portion of the gate insulating film 51 provided further on the other end side than the electrode 202 and on the upper surface of the portion on one end side of the portion of the insulator layer 50 provided further on the other end side than the P-type well region 41B. The conductor layer 122 is provided on the upper surface of the conductor layer 112. The conductor layer 112 contains, for example, polysilicon. The conductor layer 122 contains, for example, nickel silicide (NiSi), nickel platinum silicide (NiPtSi), and cobalt silicide (CoSi). The shield conductor layer 400 includes conductor layers 410 and 420. The conductor layer 410 is provided on the upper surface of the portion of the insulator layer 50 provided further on one end side than the P-type well region 41B and on the upper surface of the portion of the insulator layer 50 provided further on the other end side than the P-type well region 41B. The conductor layer 420 is provided on the upper surface of the conductor layer 410. The conductor layer 410 contains, for example, polysilicon. The conductor layer 420 contains, for example, nickel silicide (NiSi), nickel platinum silicide (NiPtSi), and cobalt silicide (CoSi).

Sidewalls 52_1, 52_2, 52_3, and 52_4 are provided on the respective side surfaces of the electrodes 101 and 102. In the following description, when the sidewalls 52_1, 52_2, 52_3, and 52_4 are not distinguished, they are simply referred to as the sidewall 52. The upper end of the sidewall 52 is located at a height below the upper ends of the electrodes 101 and 102.

The sidewall 52_1 includes a first portion and a second portion. The first portion of the sidewall 52_1 is provided on the upper surface of the insulator layer 50 so as to be in contact with one end of the portion of the electrode 101 provided further on one end side than the electrode 201 in the Y direction. Further, the second portion of the sidewall 52_1 is provided on the upper surface of the gate insulating film 51 so as to be in contact with the other end of the portion of the electrode 101 provided further on the other end side than the electrode 201 in the Y direction. The second portion of the sidewall 52_1 is adjacent to the electrode 202 along the Y direction.

The sidewall 52_2 includes a first portion and a second portion. The first portion of the sidewall 52_2 is provided on the upper surface of the gate insulating film 51 so as to be in contact with the other end of the portion of the electrode 101 provided further on one end side than the electrode 201 in the Y direction. Further, the second portion of the sidewall 52_2 is provided on the upper surface of the gate insulating film 51 so as to be in contact with one end of the portion of the electrode 101 provided further on the other end side than the electrode 201 in the Y direction. The first portion of the sidewall 52_2 and the second portion of the sidewall 52_2 are adjacent to the electrode 201 along the Y direction.

The sidewall 52_3 includes a first portion and a second portion. The first portion of the sidewall 52_3 is provided on the upper surface of the insulator layer 50 so as to be in contact with the other end of the portion of the electrode 102 provided further on the other end side than the electrode 203 in the Y direction. Further, the second portion of the sidewall 52_3 is provided on the upper surface of the gate insulating film 51 so as to be in contact with one end of the portion of the electrode 102 provided further on one end side than the electrode 203 in the Y direction. The second portion of the sidewall 52_3 is adjacent to the electrode 202 along the Y direction.

The sidewall 52_4 includes a first portion and a second portion. The first portion of the sidewall 52_4 is provided on the upper surface of the gate insulating film 51 so as to be in contact with the other end of the portion of the electrode 102 provided further on one end side than the electrode 203 in the Y direction. Further, the second portion of the sidewall 52_4 is provided on the upper surface of the gate insulating film 51 so as to be in contact with one end of the portion of the electrode 102 provided further on the other end side than the electrode 203 in the Y direction. The first portion of the sidewall 52_4 and the second portion of the sidewall 52_4 are adjacent to the electrode 203 along the Y direction.

Sidewalls 53_1 and 53_2 are provided on the side surface of the shield conductor layer 400. When the sidewalls 53_1 and 53_2 are not distinguished in the following description, they are simply referred to as the sidewall 53. The upper end of the sidewall 53 is located at a height below the upper end of the shield conductor layer 400.

The sidewall 53_1 includes a first portion and a second portion. The first portion of the sidewall 53_1 is provided on the upper surface of the insulator layer 50 so as to be in contact with the other end of the portion of the shield conductor layer 400 provided further on one end side than the P-type well region 41B in the Y direction. The first portion of the sidewall 53_1 is adjacent to the first portion of the sidewall 52_1 along the Y direction. Further, the second portion of the sidewall 53_1 is provided on the upper surface of the insulator layer 50 so as to be in contact with one end of the portion of the shield conductor layer 400 provided further on the other end side than the P-type well region 41B in the Y direction. The second portion of the sidewall 53_1 is adjacent to the first portion of the sidewall 52_3 along the Y direction.

The sidewall 53_2 includes a first portion and a second portion. The first portion of the sidewall 53_2 is provided on the upper surface of the insulator layer 50 so as to be in contact with one end of the portion of the shield conductor layer 400 provided further on one end side than the P-type well region 41B in the Y direction. Further, the second portion of the sidewall 53_2 is provided on the upper surface of the insulator layer 50 so as to be in contact with the other end of the portion of the shield conductor layer 400 provided further on the other end side than the P-type well region 41B in the Y direction. For example, the second portion of the sidewall 53_2 is adjacent to the sidewalls provided on the transfer transistors TW0_2 and TW0_3 along the Y direction in a region not shown.

A plurality of conductor layers 66 are provided above the electrodes 101 and 102. Each of the plurality of conductor layers 66 is connected to the corresponding wiring, for example, among select gate lines SGS and SGD0 to SGD4 for each of the plurality of blocks BLK, word lines WL0 to WL7 for each of the plurality of blocks BLK, transfer gate lines BLKSEL for each of the plurality of row decoders RD, and the signal lines CGS, CG0 to CG7, CGD0 to CGD4 and the like. Each of the plurality of conductor layers 66 is provided in a region not shown in a line shape extending along the X direction, for example.

The lower end of the contact 61 is in contact with the conductor layer 221. The upper end of the contact 61 is connected to the word line WL0 of the block BLK0 via the corresponding conductor layer 66 among the plurality of conductor layers 66.

The lower end of the contact 62 is in contact with the conductor layer 222. The upper end of the contact 62 is connected to the signal line CG0 via the corresponding conductor layer 66 among the plurality of conductor layers 66.

The lower end of the contact 63 is in contact with the conductor layer 223. The upper end of the contact 63 is connected to the word line WL0 of the block BLK1 via the corresponding conductor layer 66 among the plurality of conductor layers 66.

The lower end of the contact 64 is in contact with the conductor layer 121. The upper end of the contact 64 is connected to the transfer gate line BLKSEL of the block BLK0 via the corresponding conductor layer 66 among the plurality of conductor layers 66.

The lower end of the contact 65 is in contact with the conductor layer 122. The upper end of the contact 65 is connected to the transfer gate line BLKSEL of the block BLK1 via the corresponding conductor layer 66 among the plurality of conductor layers 66.

Figure 9:
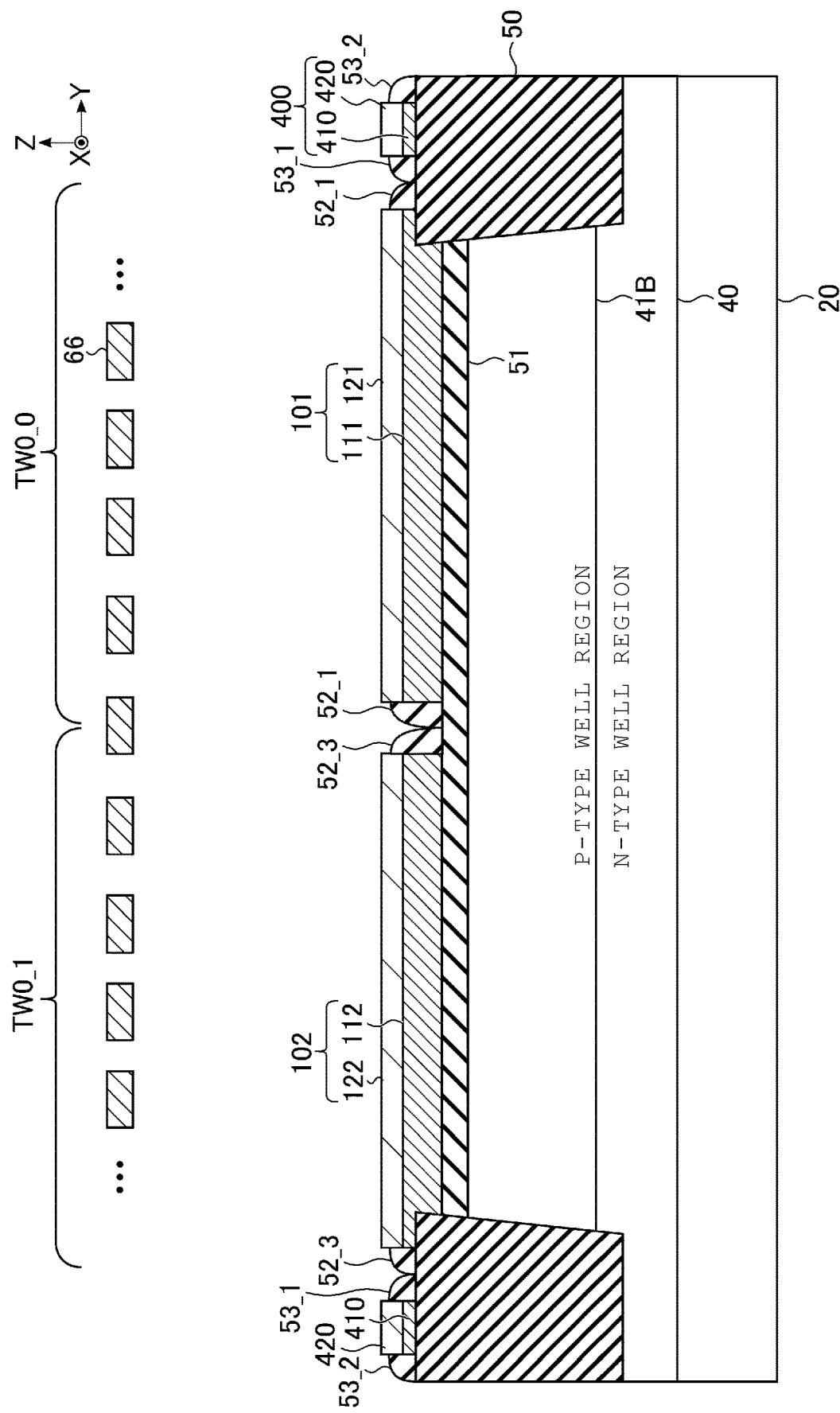
FIG. 9 is a cross-sectional view taken along the line IX-IX of FIG. 7 showing an example of a cross-sectional structure of the transfer transistor provided in the semiconductor storage device according to the embodiment.

The cross-sectional structure of the transfer transistors TW0_0 and TW0_1 will be further described with reference to FIG. 9. FIG. 9 is a cross-sectional view taken along the line IX-IX of FIG. 7, showing an example of a cross-sectional structure of the transfer transistor provided in the semiconductor storage device according to the embodiment. In the following, the structure of the transfer transistor in the cross section shown in FIG. 9 will be described.

The gate insulating film 51 is provided on the P-type well region 41B in the entire region sandwiched between the insulator layers 50.

The conductor layer 111 is provided on the upper surface of the portion on one end side of the gate insulating film 51 and on the upper surface of the portion on the other end side of the insulator layer 50 provided on one end side of the P-type well region 41B. The conductor layer 112 is provided on the upper surface of the portion on the other end side of the gate insulating film 51 and on the upper surface of the portion on one end side of the insulator layer 50 provided on the other end side of the P-type well region 41B.

In the cross section shown in FIG. 9, the second portion of the sidewall 52_1 is in contact with the other end of the conductor layer 111 in the Y direction. The second portion of the sidewall 52_3 is in contact with one end of the conductor layer 112 in the Y direction. The second portion of the sidewall 52_1 and the first portion of the sidewall 52_3 are in contact with each other along the Y direction.

1.2 Manufacturing Method of Transfer Transistor

Figure 10:
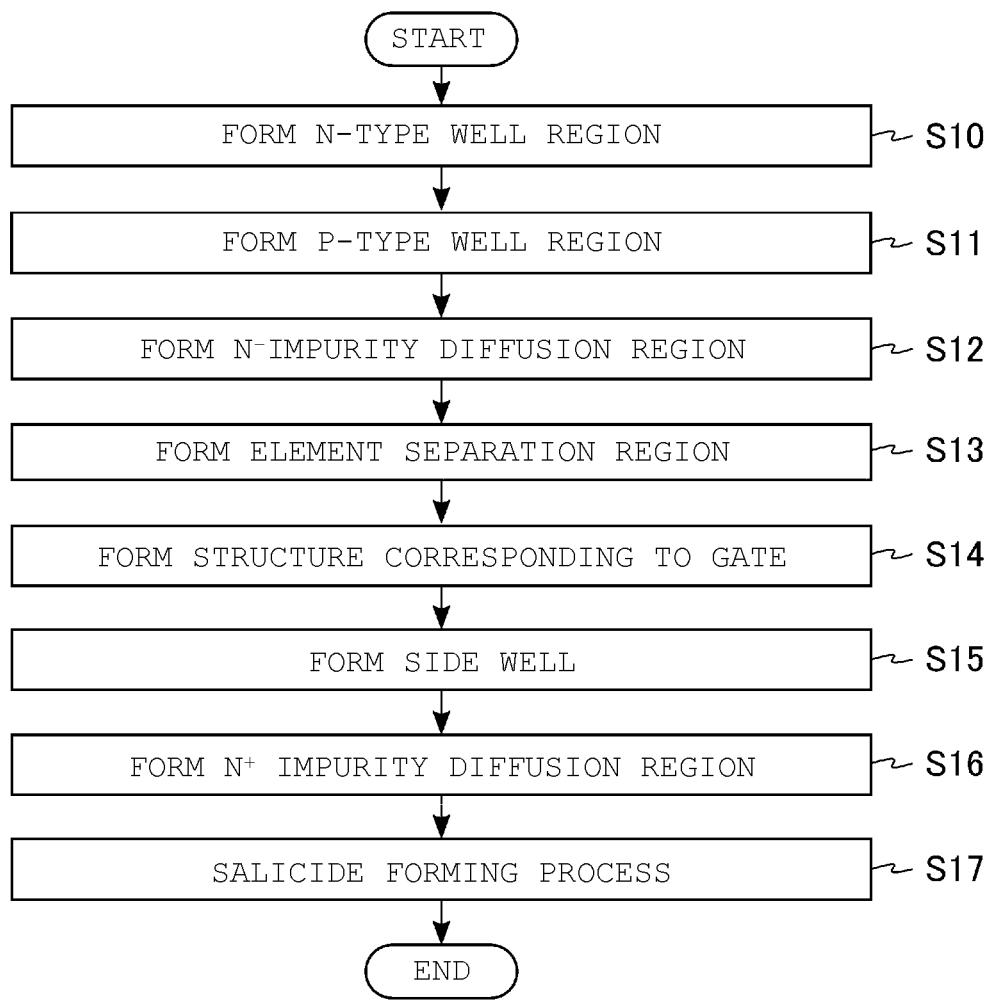
FIG. 10 is a flowchart for illustrating an example of a method of manufacturing the transfer transistor provided in the semiconductor storage device according to the embodiment.
Figure 15:
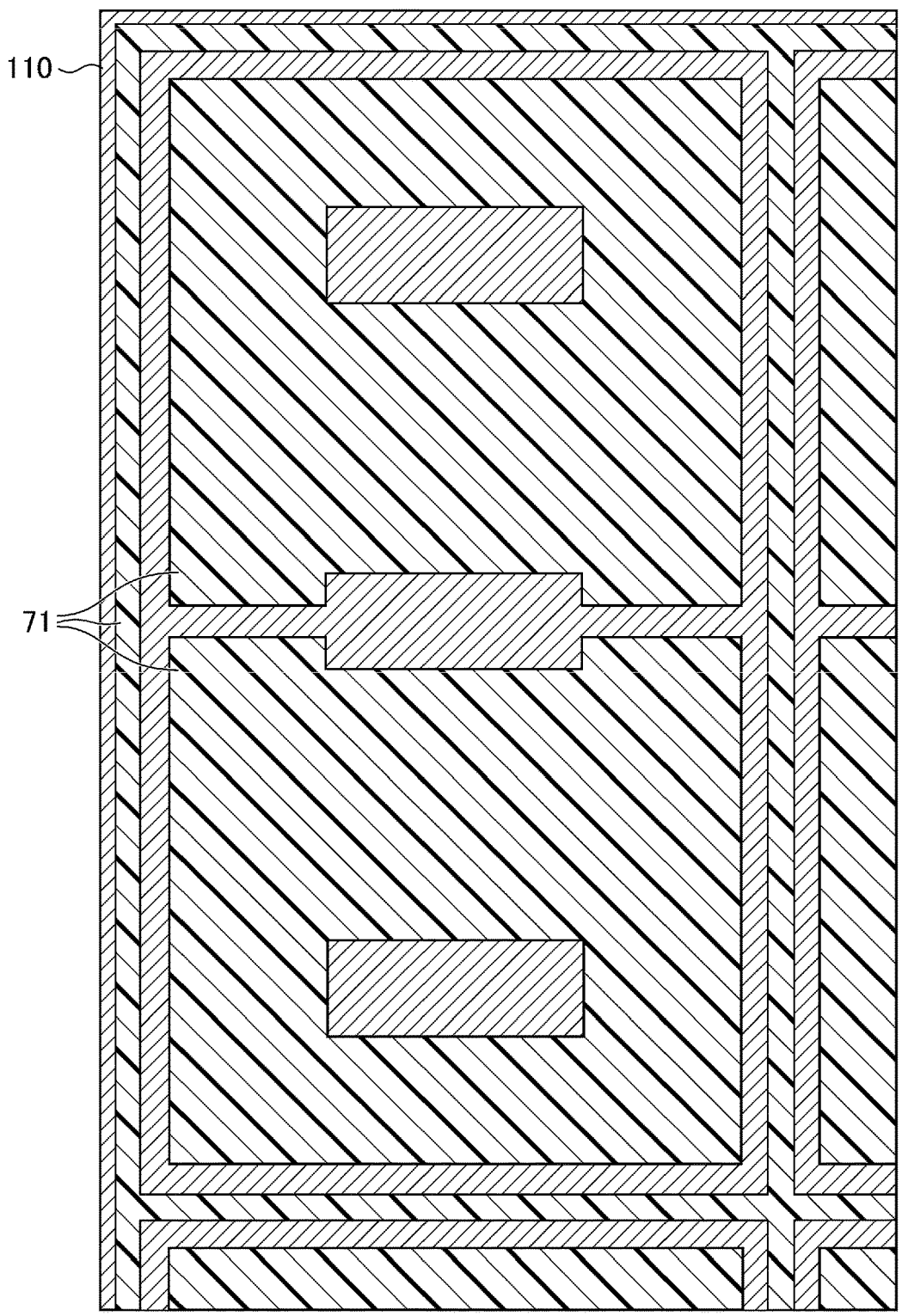
FIG. 15 is a plan view showing an example of a structure in the process of manufacturing the transfer transistor provided in the semiconductor storage device according to the embodiment.
Figure 16:
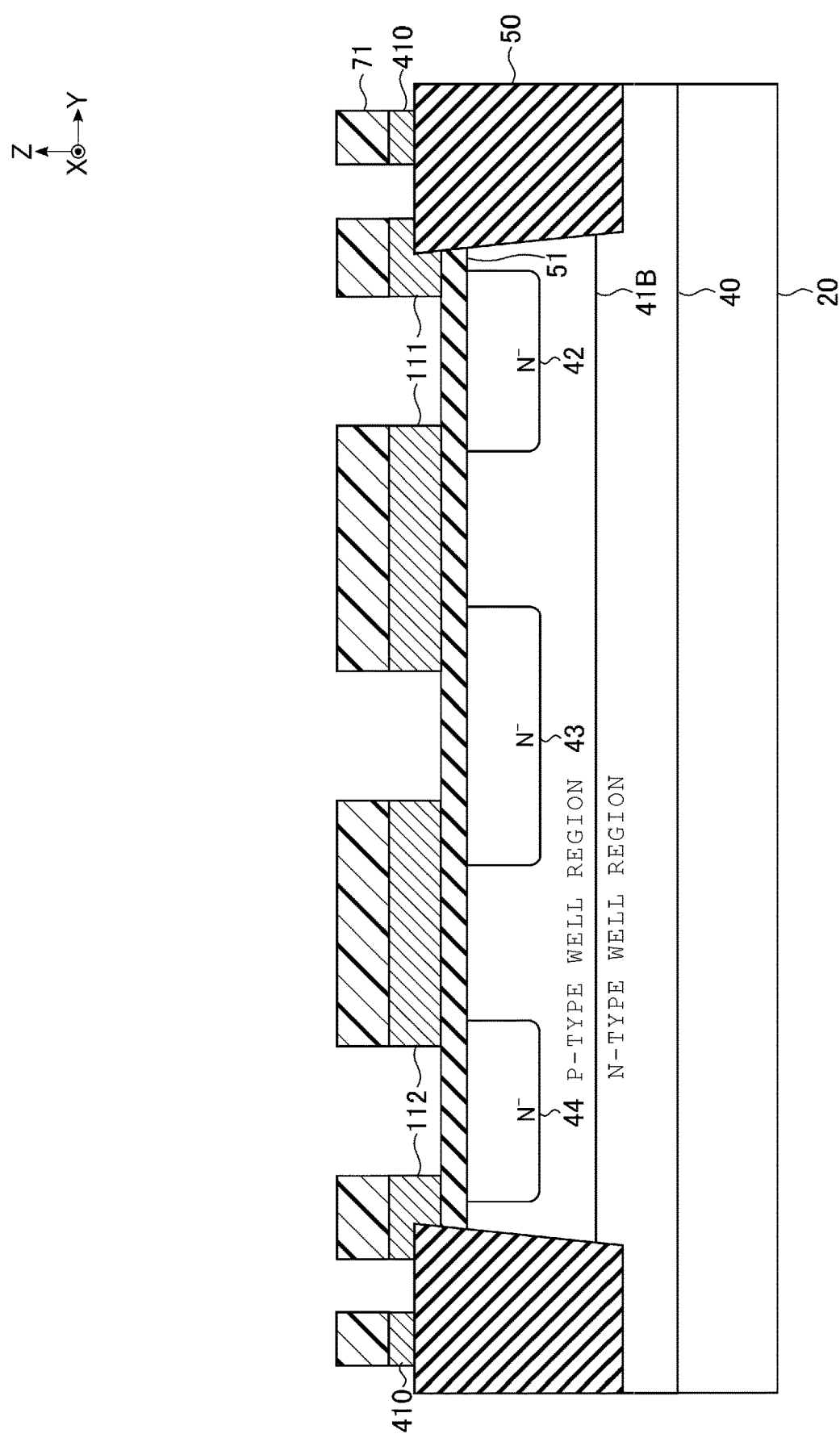
FIG. 16 is a cross-sectional view showing an example of a structure in the process of manufacturing the transfer transistor provided in the semiconductor storage device according to the embodiment.
Figure 17:
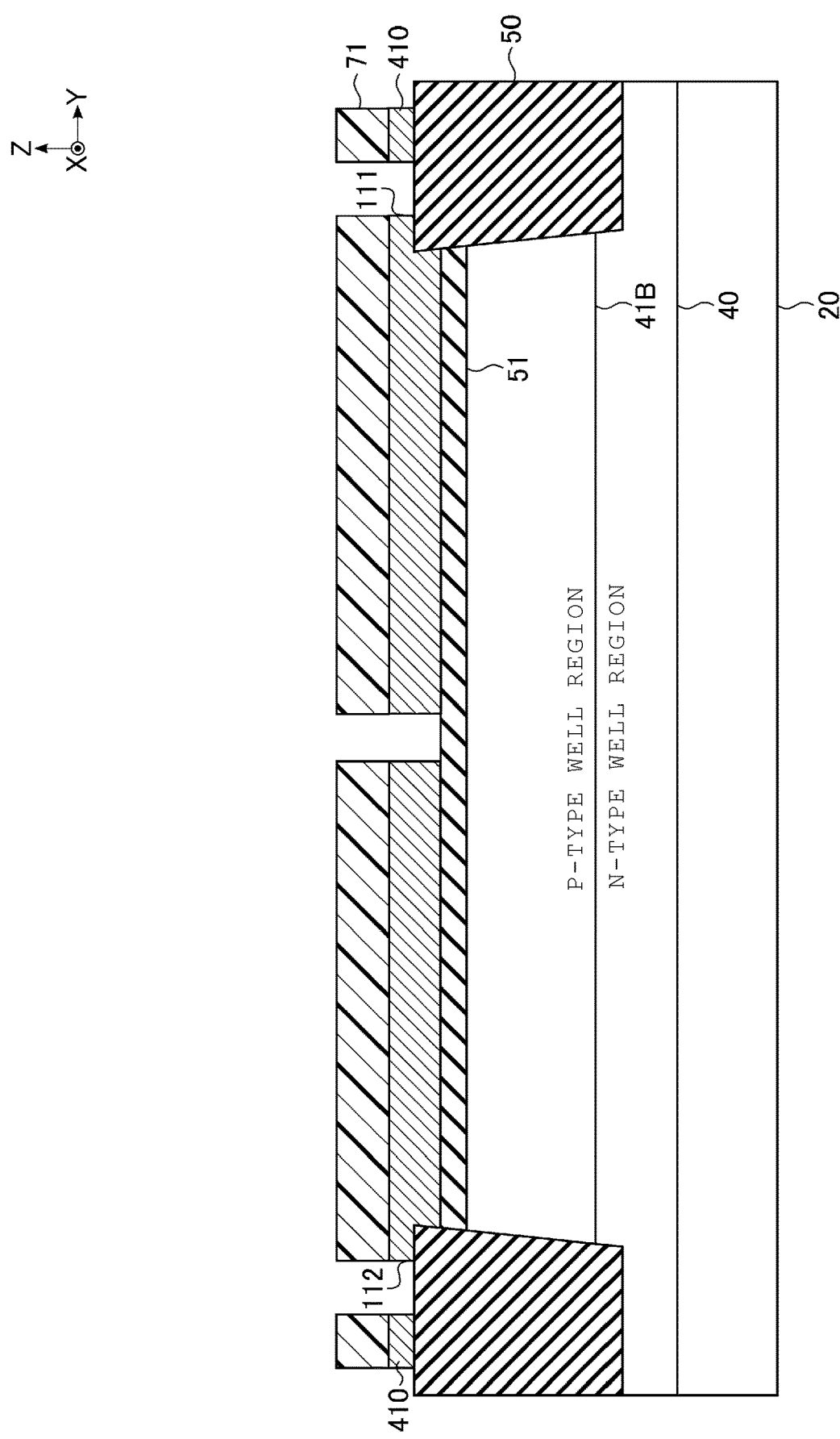
FIG. 17 is a cross-sectional view showing an example of a structure in the process of manufacturing the transfer transistor provided in the semiconductor storage device according to the embodiment.
Figure 18:
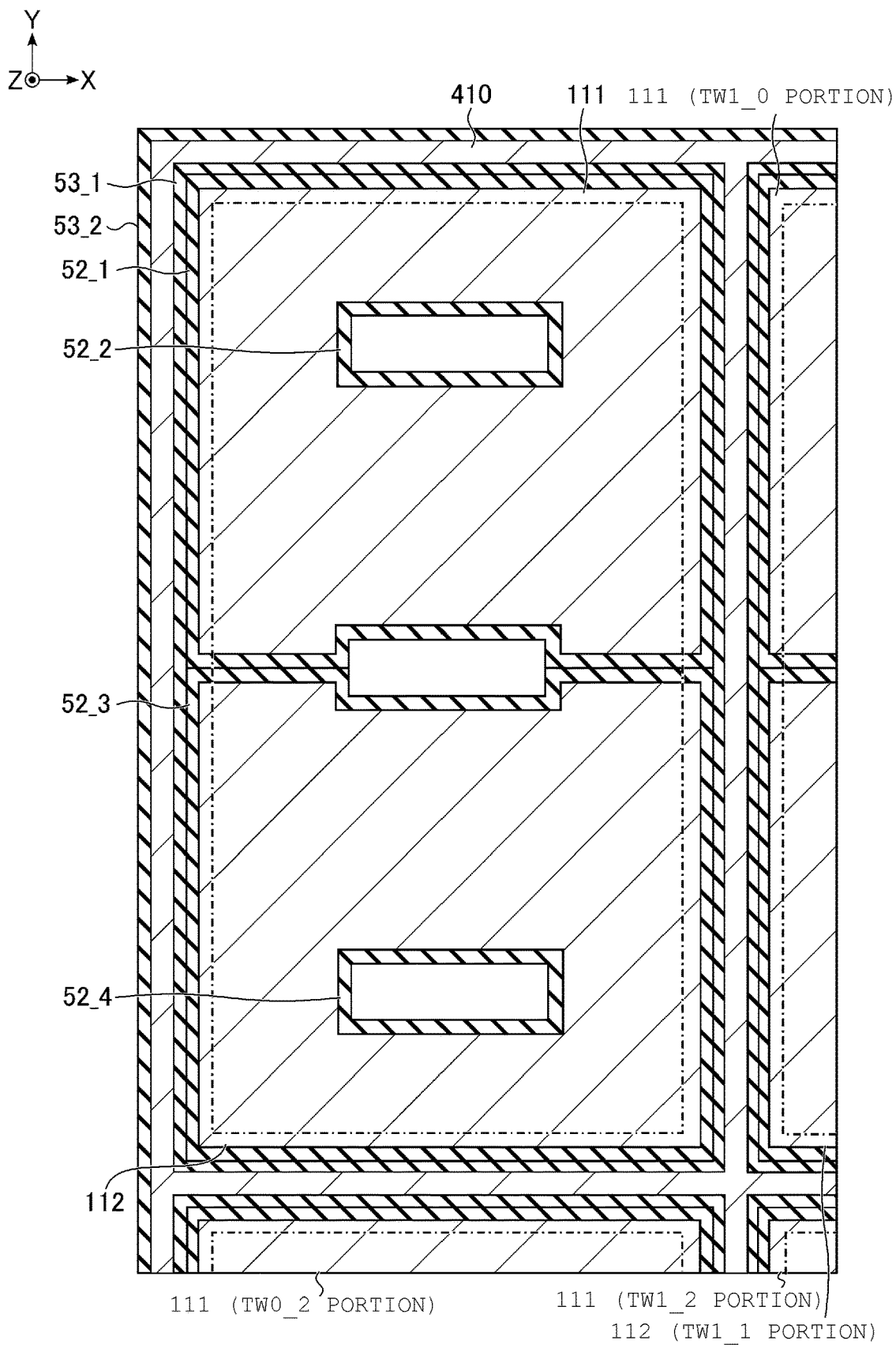
FIG. 18 is a plan view showing an example of a structure in the process of manufacturing the transfer transistor provided in the semiconductor storage device according to the embodiment.
Figure 19:
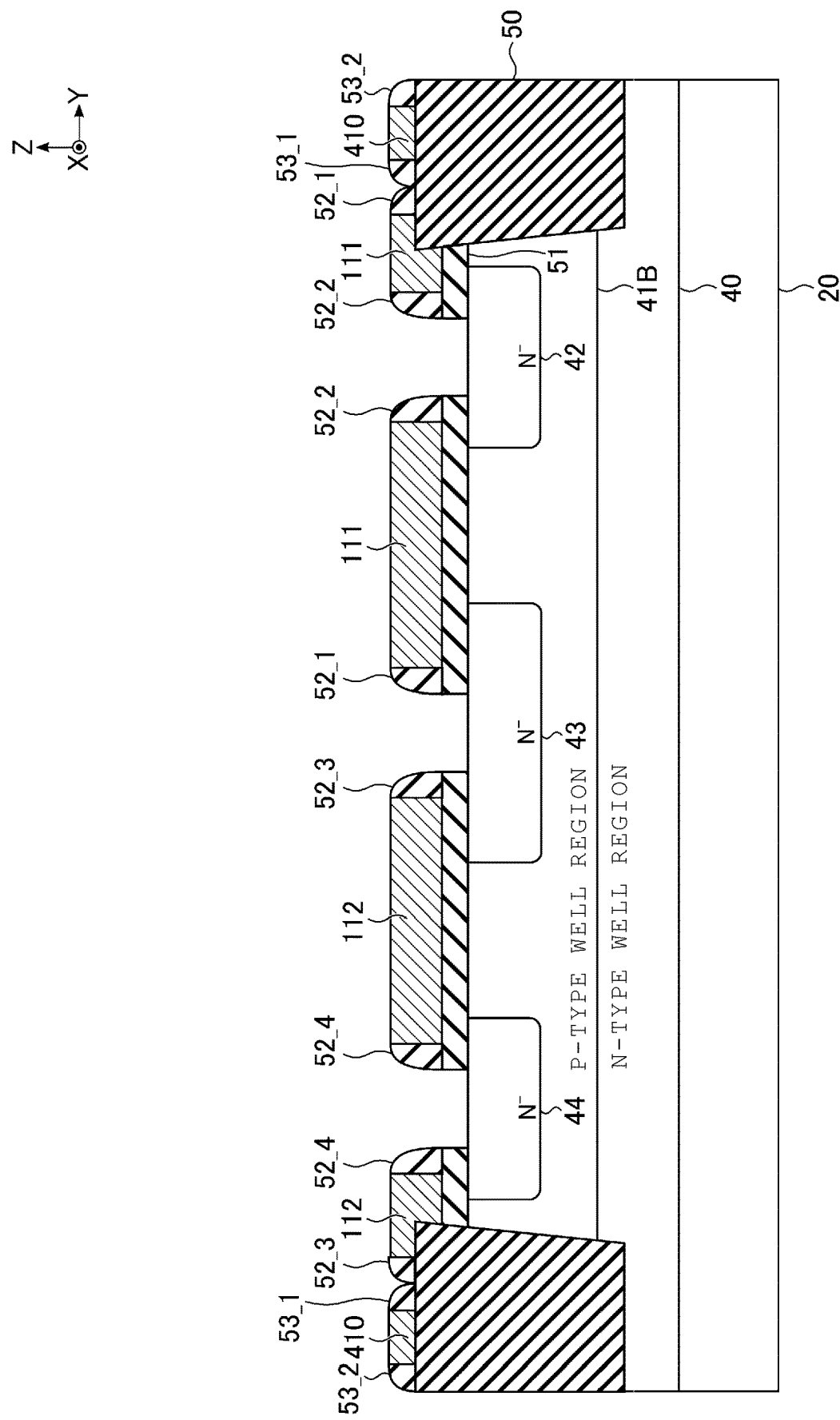
FIG. 19 is a cross-sectional view showing an example of a structure in the process of manufacturing the transfer transistor provided in the semiconductor storage device according to the embodiment.
Figure 20:
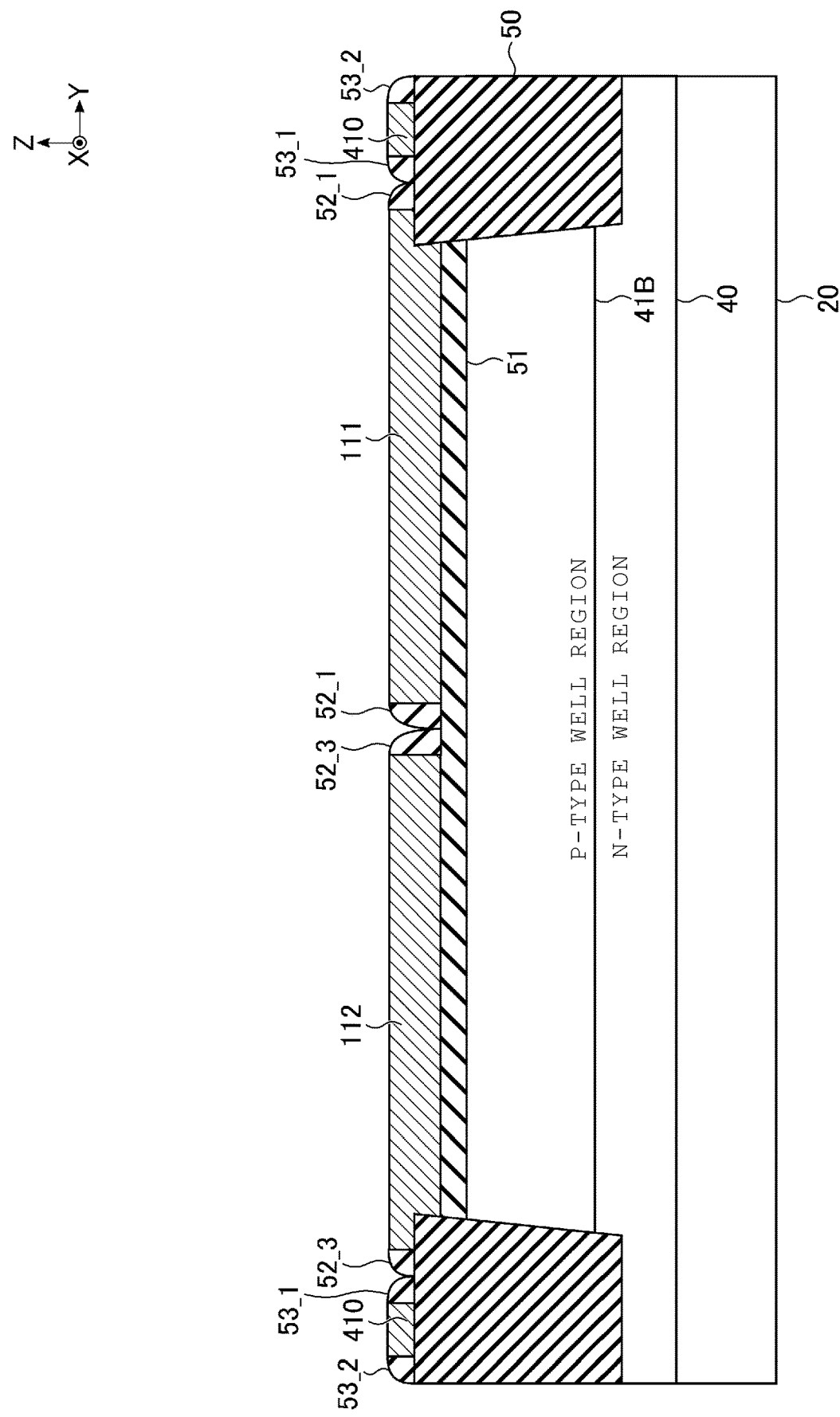
FIG. 20 is a cross-sectional view showing an example of a structure in the process of manufacturing the transfer transistor provided in the semiconductor storage device according to the embodiment.

FIG. 10 is a flowchart for illustrating an example of a manufacturing method of the semiconductor storage device according to the embodiment. FIGS. 11 to 22 are plan views or cross-sectional views showing an example of the structure in the process of manufacturing the transfer transistor TW provided in the semiconductor storage device 1 according to the embodiment. The plan views shown in FIGS. 11, 13, 15, 18, 21, and 23 show the planar structure corresponding to FIG. 7. The cross-sectional views shown in FIGS. 12, 14, 16, 19, 22, and 24 show the cross-sectional structure corresponding to FIG. 8. The cross-sectional views shown in FIGS. 17 and 20 show the cross-sectional structure corresponding to FIG. 9. Hereinafter, an example of a manufacturing method relating to the formation of the transfer transistors TW0_0 and TW0_1 according to the embodiment will be mainly described with reference to FIG. 10.

As shown in FIG. 10, in the manufacturing method of the semiconductor storage device 1 according to the embodiment, the processes of S10 to S17 are executed in order.

First, the N-type well region 40 is formed on the semiconductor substrate 20 (S10).

Then, the P-type well region 41 is formed in the N-type well region 40 (S11).

Then, N⁻ impurity diffusion regions 42, 43, and 44 are formed in the P-type well region 41 (S12).

Figure 11:
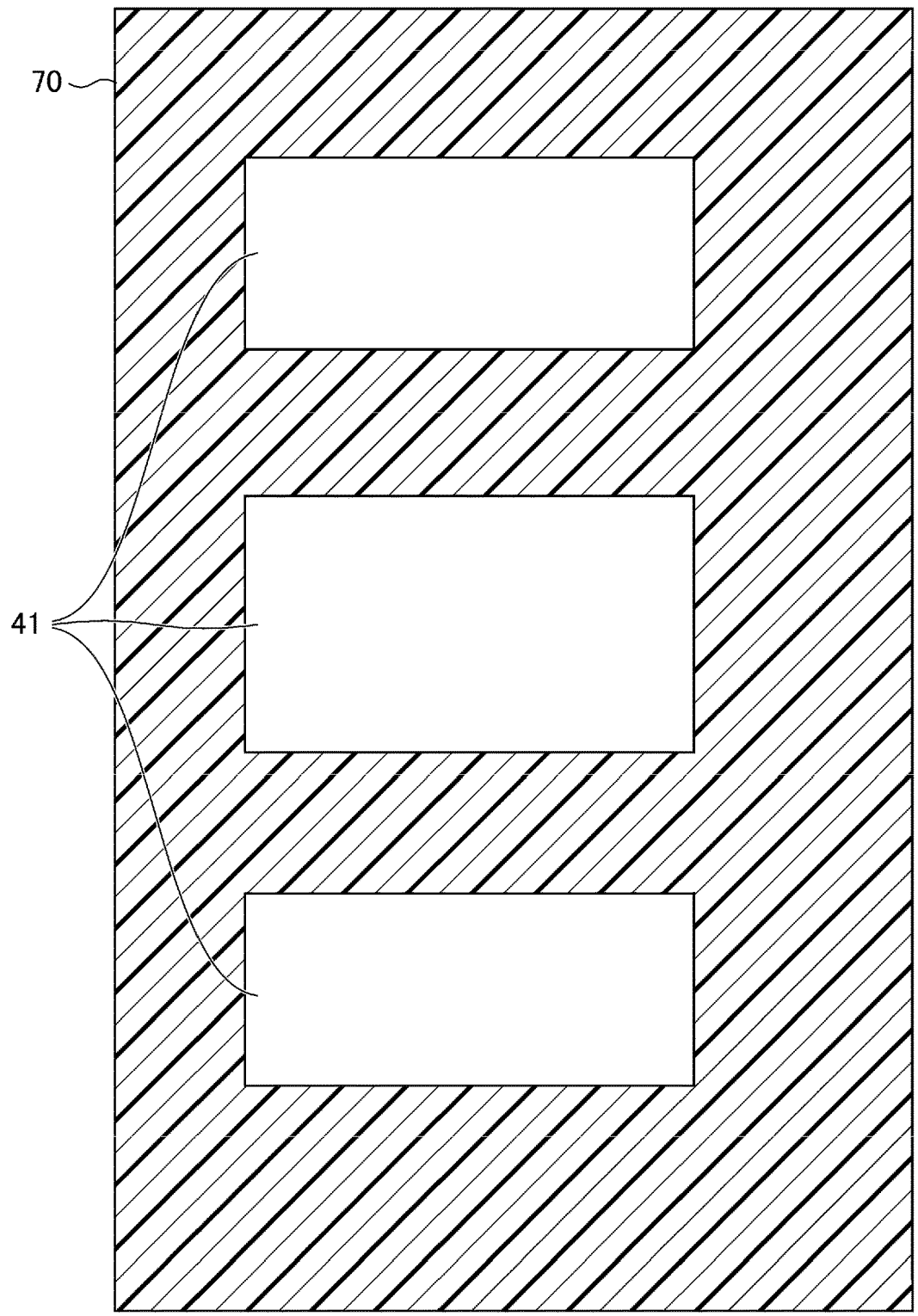
FIG. 11 is a plan view showing an example of a structure in the process of manufacturing a transfer transistor provided in the semiconductor storage device according to the embodiment.
Figure 12:
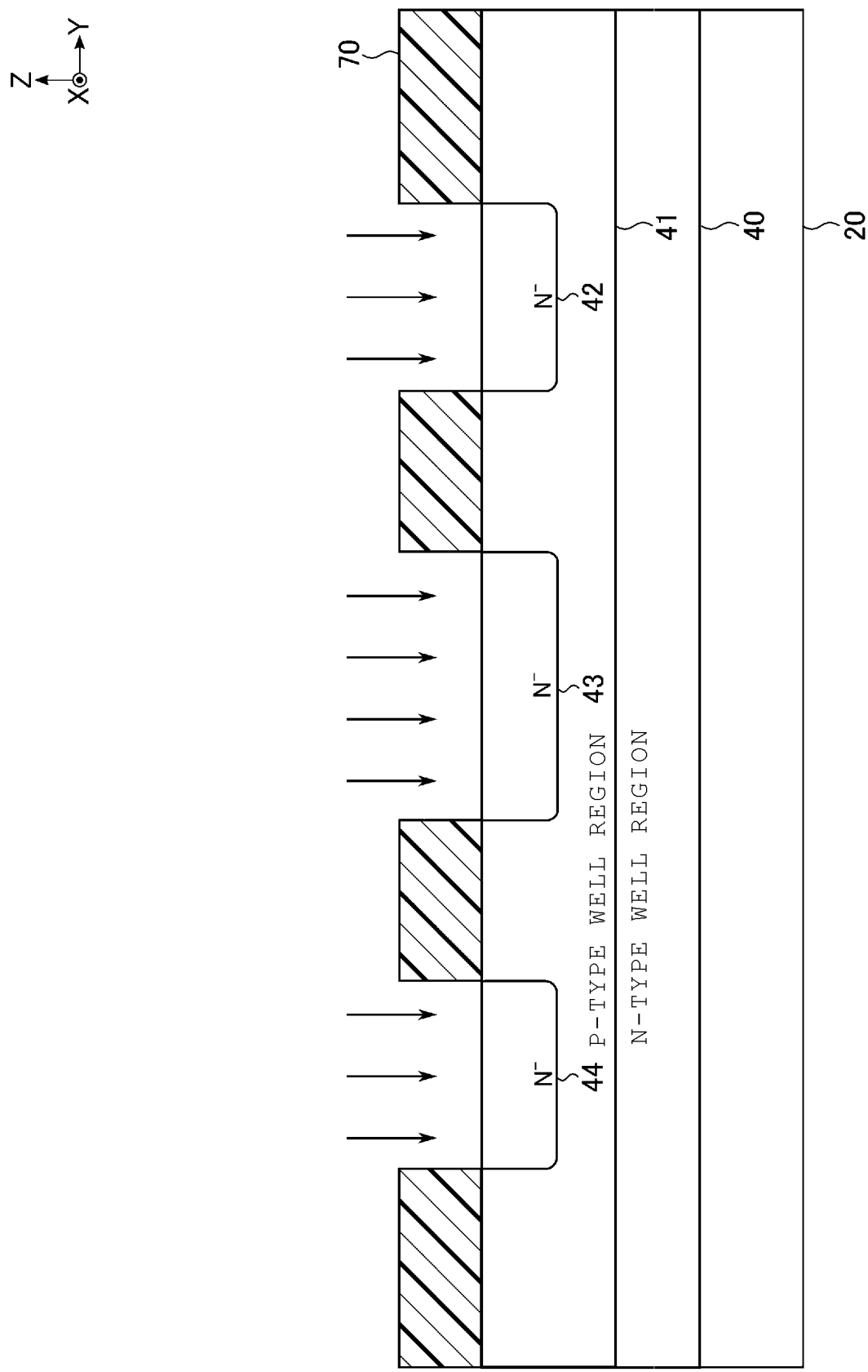
FIG. 12 is a cross-sectional view showing an example of a structure in the process of manufacturing the transfer transistor provided in the semiconductor storage device according to the embodiment.

More specifically, resist material 70 is formed on the semiconductor substrate 20. As shown in FIG. 11, the portion of the resist material 70 formed on the regions where the N⁻ impurity diffusion regions 42, 43, and 44 are to be formed is removed by, for example, photolithography, and the P-type well region 41 of the removed region is exposed. Then, as shown in FIG. 12, N-type impurities are selectively ion-implanted into the exposed P-type well region 41 to form N⁻ impurity diffusion regions 42, 43, and 44. After the N⁻ impurity diffusion regions 42, 43, and 44 are formed, the resist material 70 is removed.

Next, the insulator layer 50 which functions as an element isolation area is formed (S13).

Figure 13:
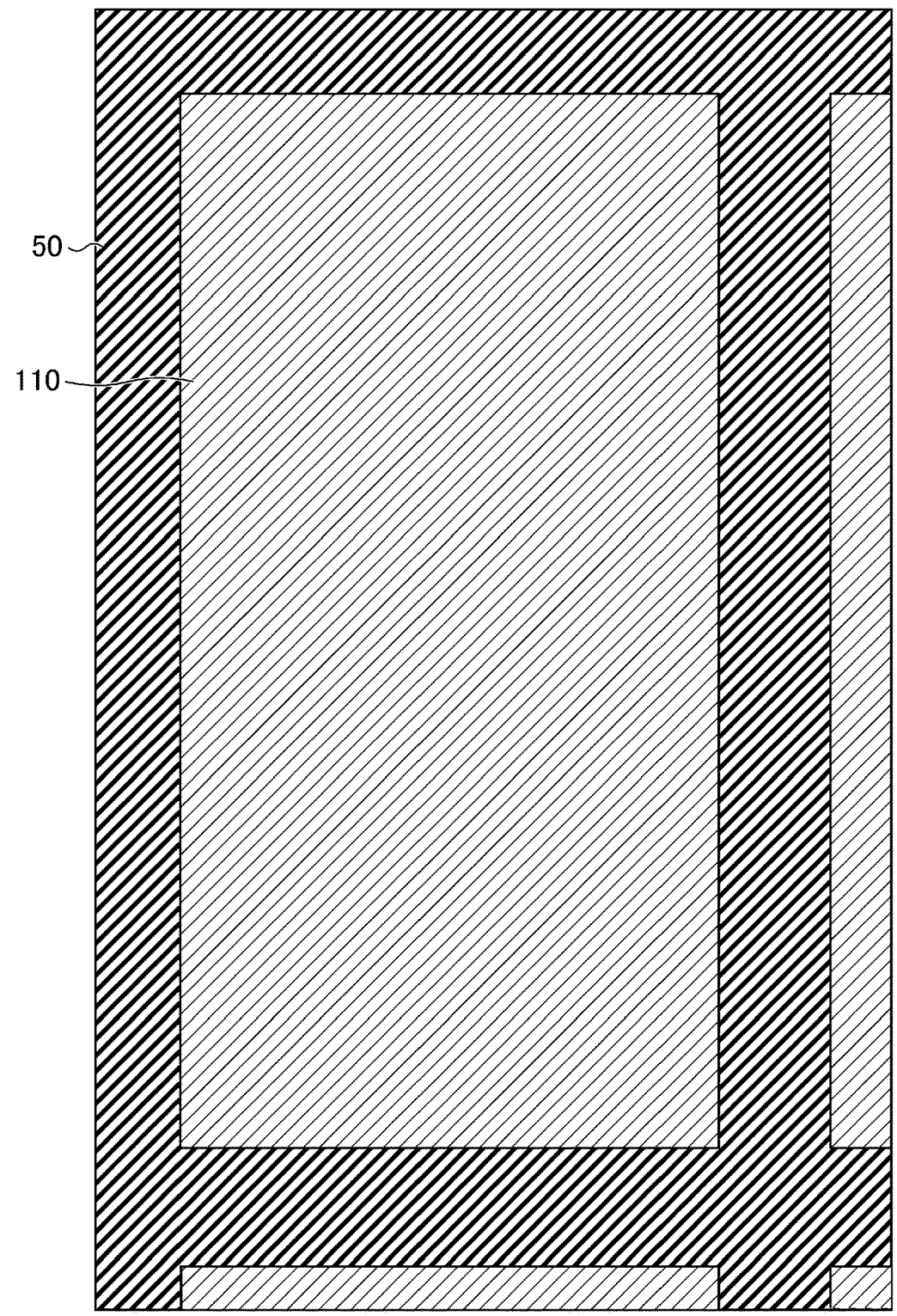
FIG. 13 is a plan view showing an example of a structure in the process of manufacturing the transfer transistor provided in the semiconductor storage device according to the embodiment.
Figure 14:
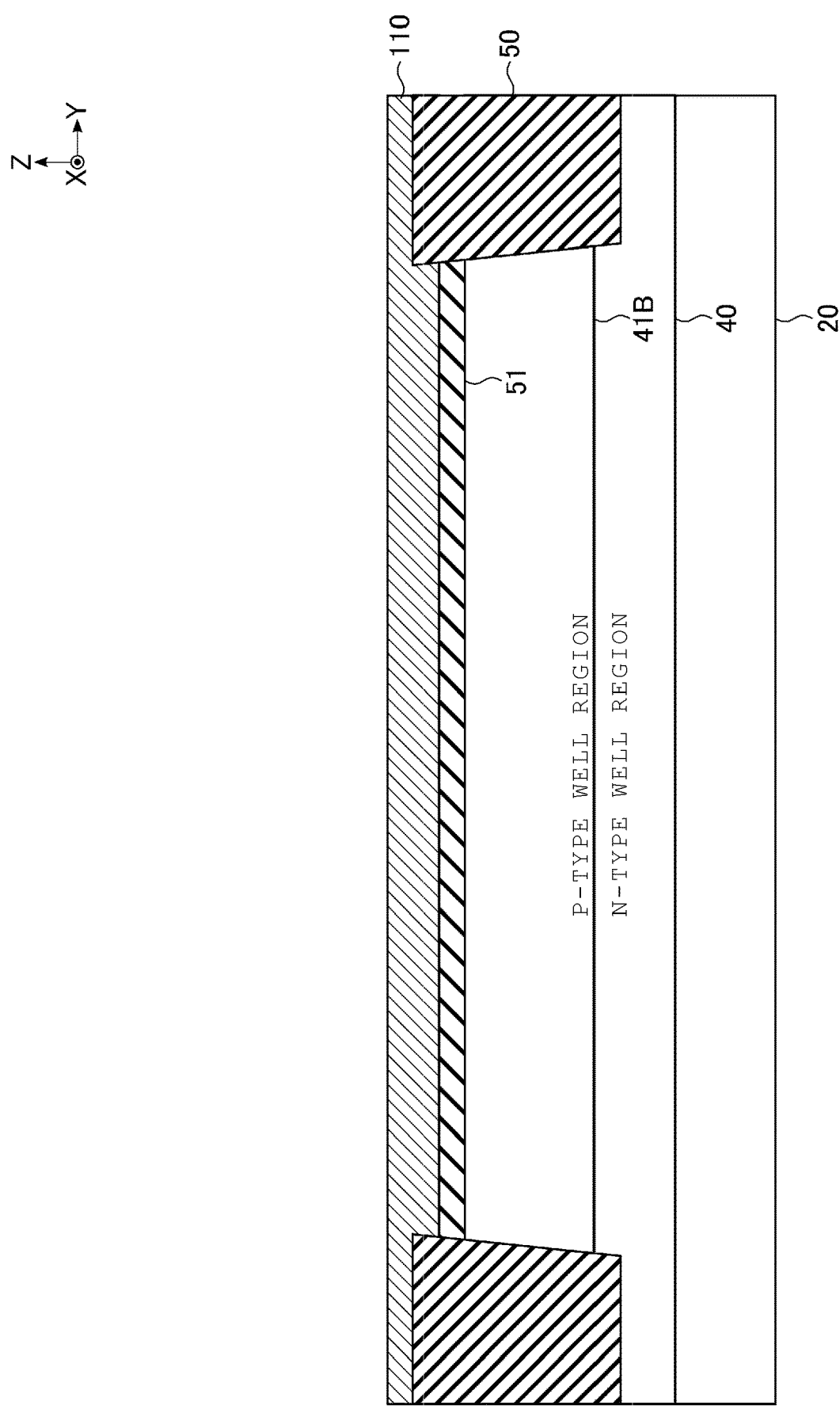
FIG. 14 is a cross-sectional view showing an example of a structure in the process of manufacturing the transfer transistor provided in the semiconductor storage device according to the embodiment.

More specifically, first, the gate insulating film 51 and the conductor layers corresponding to the conductor layers 111 and 112 are stacked in this order on the upper surface of the semiconductor substrate 20. Then, a hole is formed in the region corresponding to the insulator layer 50. By forming the hole, the P-type well region 41 is separated into the P-type well regions 41A and 41B. Then, as shown in FIG. 13, the insulator layer 50 is formed by the embedding process in the hole and the planarization process. In a plan view, the conductor layer 110 corresponding to the conductor layers 111 and 112 is exposed in the region separated by the insulator layer 50. The planarization process in this step is, for example, CMP (Chemical Mechanical Polishing). After that, as shown in FIG. 14, the conductor layer is stacked on the conductor layer 110 and the insulator layer 50. That is, the thickening process of the conductor layer 110 is executed. As a result, the insulator layer 50 is filled with the thickened conductor layer.

Then, the structure corresponding to the gate is formed (S14). That is, the conductor layer 111 corresponding to the electrode 101 and the conductor layer 112 corresponding to the electrode 102 are formed. Further, the conductor layer 410 corresponding to the shield conductor layer 400 is formed.

More specifically, resist material 71 is stacked on the structure in which the conductor layer has been thickened. Then, as shown in FIG. 15, of the resist material 71, the region where the openings of the electrodes 101 and 102 are to be provided, the region to be sandwiched by the electrodes 101 and 102 in the Y direction, and the region to be sandwiched by the shield conductor layer 400 and the electrodes 101 and 102 in the X and Y directions, and the region outside the region where the shield conductor layer 400 is to be provided are removed by, for example, photolithography to expose the thickened conductor layer 110. Then, the portion of the conductor layer 110 is removed by anisotropic etching using the pattern of the resist material 71 formed by photolithography. The anisotropic etching in this step is, for example, RIE (Reactive Ion Etching). As a result, as shown in FIGS. 16 and 17, the conductor layer 110 is separated into the conductor layers 111, 112, and 410. After the portion of the conductor layer 110 is removed, the resist material 71 is removed.

Next, sidewalls 52 and 53 are formed on the side surfaces of the conductor layers 111 and 112 (S15). Further, the portion of the gate insulating film 51 exposed on the surface of the structure after the sidewalls 52 and 53 are formed is removed by anisotropic etching using the pattern of the resist material. As a result, as shown in FIG. 18, sidewalls 52_1, 52_2, 52_3, 52_4, 53_1, and 53_2 are formed on the outer sidewall of the conductor layer 111, the sidewall of the opening of the conductor layer 111, the outer sidewall of the conductor layer 112, and the sidewall of the opening of the conductor layer 112, the inner sidewall of the conductor layer 410 surrounding each P-type well region 41B, and the outer sidewall of the conductor layer 410, respectively. Further, a cross-sectional structure of the structure as shown in FIGS. 19 and 20 is formed.

Then, N⁺ impurity diffusion regions 211, 212, and 213 are formed in each of the N⁻ impurity diffusion regions 42, 43, and 44 (S16).

Figure 21:
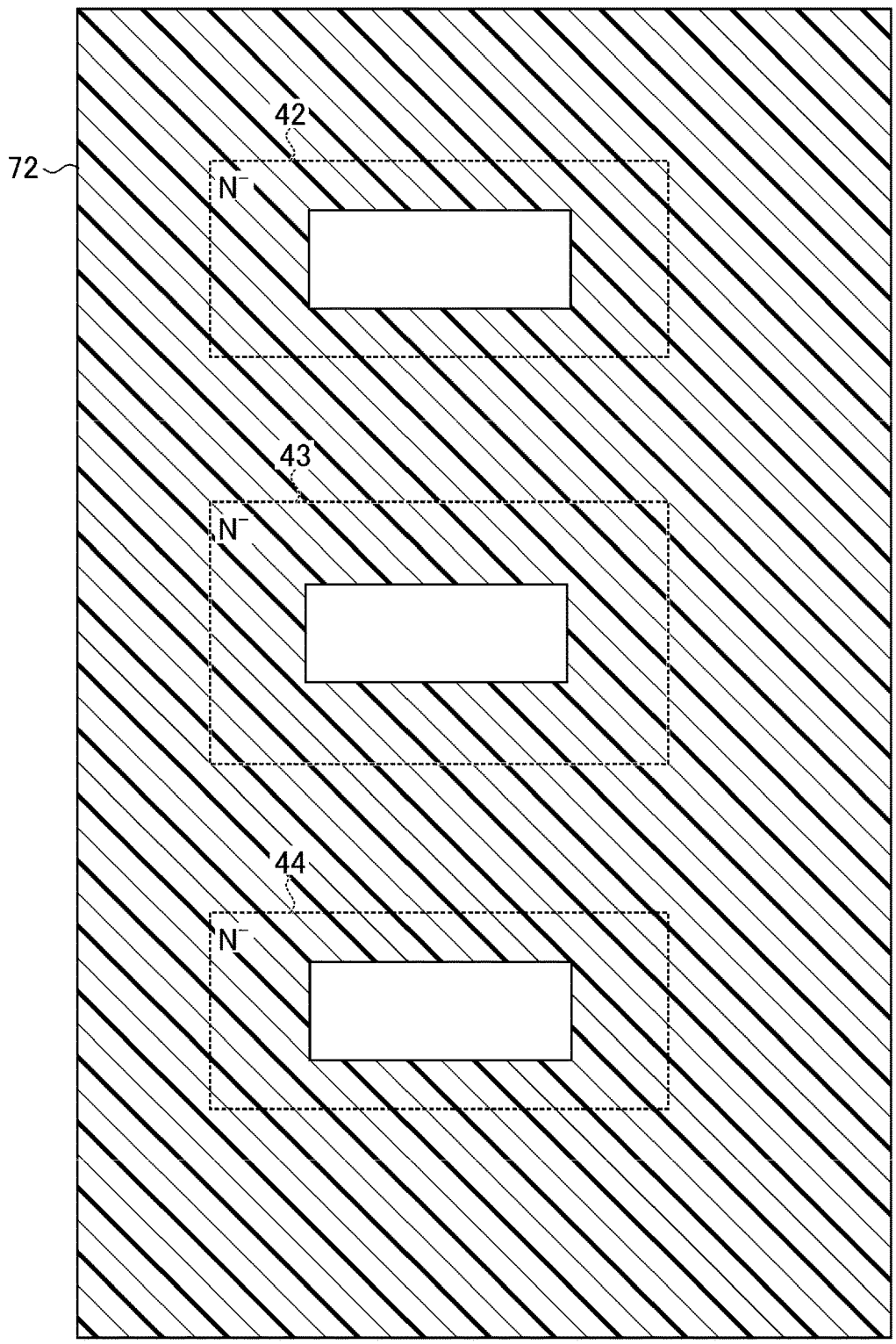
FIG. 21 is a plan view showing an example of a structure in the process of manufacturing the transfer transistor provided in the semiconductor storage device according to the embodiment.
Figure 22:
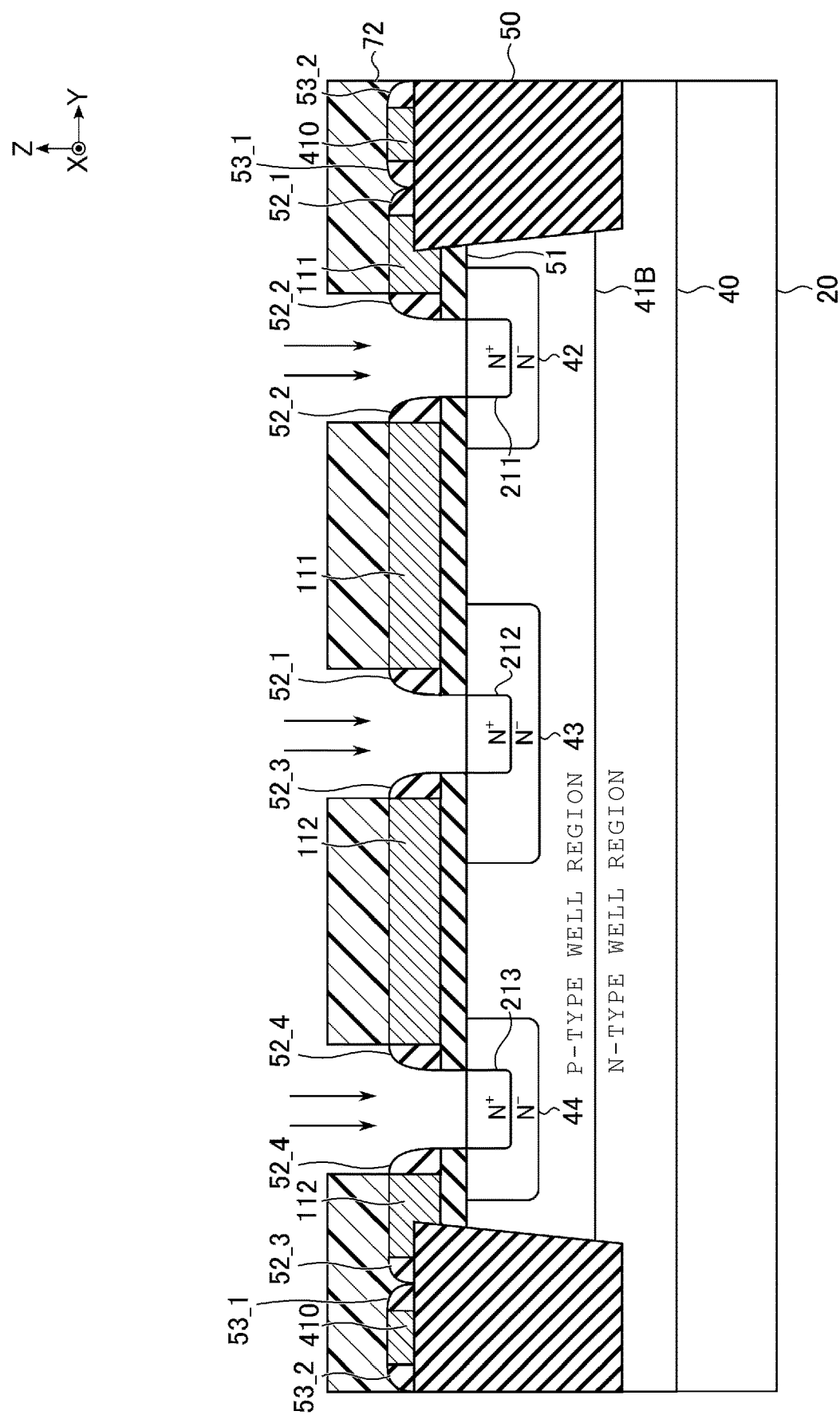
FIG. 22 is a cross-sectional view showing an example of a structure in the process of manufacturing the transfer transistor provided in the semiconductor storage device according to the embodiment.

More specifically, resist material 72 is formed on the structure after the portion of the gate insulating film 51 is removed. As shown in FIG. 21, the portion of the resist material 72 formed on the region where the electrodes 201, 202, and 203 are to be formed is removed by, for example, photolithography, and the N⁻ impurity diffusion regions 42, 43, and 44 of the removed region are exposed. Then, as shown in FIG. 22, N-type impurities are selectively ion-implanted into the exposed N⁻ impurity diffusion regions 42, 43, and 44 to form N⁺ impurity diffusion regions 211, 212, and 213. After the N⁺ impurity diffusion regions 211, 212, and 213 are formed, the resist material 72 is removed.

Figure 23:
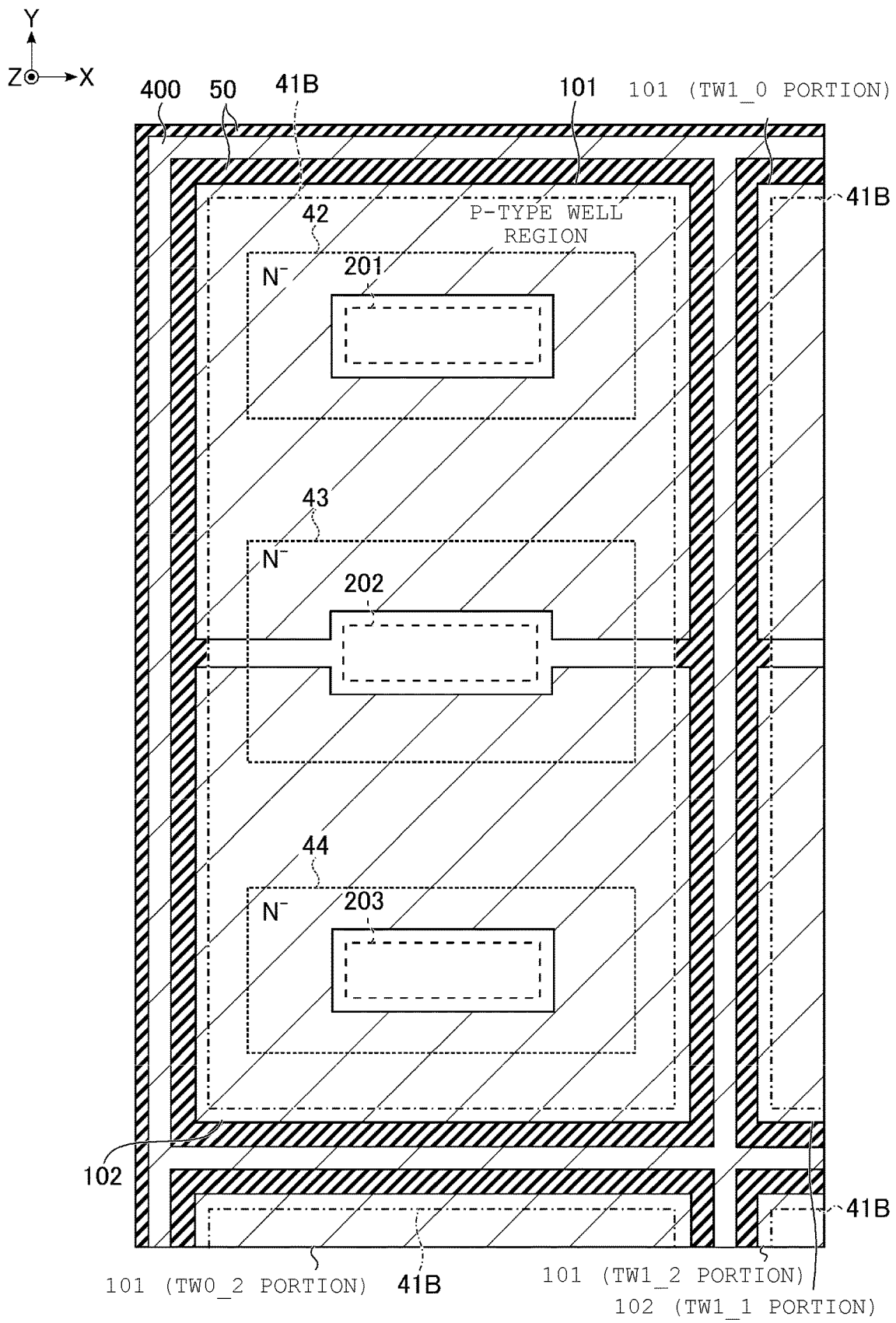
FIG. 23 is a plan view showing an example of a structure in the process of manufacturing the transfer transistor provided in the semiconductor storage device according to the embodiment.

Then, the salicide forming process is executed (S17). By this process, as shown in FIG. 23, the electrodes 101, 102, 201, 202, and 203, and the shield conductor layer 400 are formed.

Figure 24:
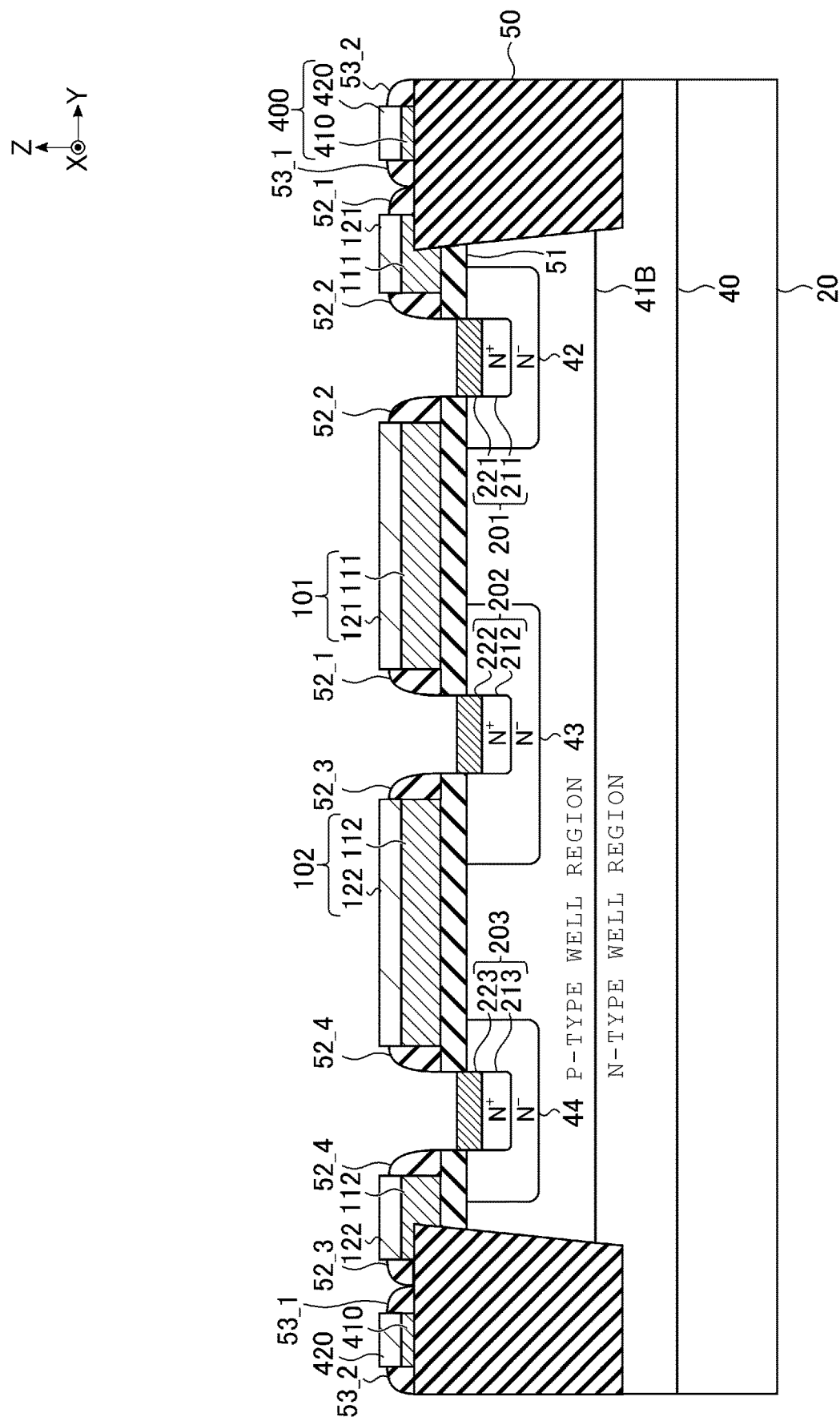
FIG. 24 is a cross-sectional view showing an example of a structure in the process of manufacturing the transfer transistor provided in the semiconductor storage device according to the embodiment.

More specifically, a metal film is stacked on the structure after the N⁺ impurity diffusion regions 211, 212, and 213 are formed. The metal film is, for example, a film containing nickel (Ni), nickel platinum (NiPt), and cobalt (Co). Then, by anisotropic etching using a pattern of the resist material, the portion of the metal film stacked on the outside of the region where the transfer transistors TW, TS, and TD are to be provided is removed in a plan view. The anisotropic etching in this step is, for example, RIE. Then, by heat process of the structure on which the metal film is formed, the silicon contained in the respective conductor layers 111, 112, and 410, and N⁺ impurity diffusion regions 211, 212, and 213 is caused to react with the metal element contained in the metal film. By this process, silicides (conductor layers 121, 122, 420, 221, 222, and 223) are formed on the upper surfaces of the conductor layers 111, 112, and 410, and the N⁺ impurity diffusion regions 211, 212, and 213, respectively. After the conductor layers 121, 122, 420, 221, 222, and 223 are formed, the unreacted metal film is removed. By such a salicide forming process, as shown in FIG. 24, the conductor layers 121, 122, 420, 221, 222, and 223 are formed on the upper surfaces of the conductor layers 111, 112, and 410, and the N⁺ impurity diffusion regions 211, 212, and 213, respectively.

Next, the contacts 61 to 65 are formed.

By the above steps, the transfer transistors TW0_0 and TW0_1 are formed.

1.3 Effect Related to Embodiment

According to the embodiment, it is possible to reduce a decrease in the reliability of the semiconductor storage device. The effects of the embodiments will be described below.

In the semiconductor storage device 1 according to the embodiment, the P-type well region 41B is provided with the N⁻ impurity diffusion regions 42, 43, and 44 located apart from each other in this order along the Y direction. The electrodes 201, 202, and 203 are provided in the N⁻ impurity diffusion regions 42, 43, and 44, respectively. The electrode 201 functions as a first end of the transfer transistor TW0_0. The electrode 203 functions as a first end of the transfer transistor TW0_1. The electrode 202 functions as a second end of the transfer transistor TW0_0 and a second end of the transfer transistor TW0_1. The electrode 201 is connected to the word line WL0 of the block BLK corresponding to the transfer transistor TW0_0 via the contact 61. The electrode 202 is connected to the signal line CG0 via the contact 62. The electrode 203 is connected to the word line WL0 of the block BLK corresponding to the transfer transistor TW0_1 via the contact 63. Above the P-type well region 41B, the electrode 101 that has an opening surrounding the contact 61 and functions as a gate for the transfer transistor TW0_0, and the electrode 102 that has an opening surrounding the contact 63 and functions as a gate for the transfer transistor TW0_1 are provided. With such a structure of the electrodes 101 and 102, it is possible to reduce a change in the characteristics of the transfer transistors TW0_0 and TW0_1 due to a change in the potential of each conductor layer 66 provided above the transfer transistors TW0_0 and TW0_1. Therefore, it is possible to reduce a decrease in the reliability of the semiconductor storage device 1.

To be supplemental, when the conductor layer functioning as a gate is provided only between adjacent N⁻ impurity diffusion regions, for example, the resistance value of the N⁻ impurity diffusion region is affected by changes in voltage of the conductor layer (wiring) provided above the transistor. Such an effect is not preferable because it may not be negligible from the viewpoint of breakdown voltage and reliability, especially in a transistor having a high breakdown voltage having a relatively high resistance value in the N⁻ impurity diffusion region. As a method of reducing such a change in the resistance value of the N⁻ impurity diffusion region, a method of providing wiring at a high position with respect to the N⁻ impurity diffusion region to the extent that the influence can be ignored is known. However, when this method is used, the large aspect ratio of the contact may make it difficult to form the contact and the characteristics of the semiconductor storage device may deteriorate.

With the semiconductor storage device 1 according to the embodiment, the electrode 101 surrounds the contact 61. Further, the electrode 102 surrounds the contact 63. With such a configuration of the electrodes 101 and 102, the electrodes 101 and 102 can completely cover the upper surfaces of the N⁻ impurity diffusion regions 42, 43, and 44, respectively. Further, during various operations such as write operation, read operation, and erasing operation, a voltage equal to or higher than the ground voltage VSS is applied to the electrodes 101 and 102, respectively. As a result, the electrodes 101 and 102 can shield the electric field formed by the conductor layer 66. Therefore, it is possible to reduce changes in the resistance values of the N⁻ impurity diffusion regions 42, 43, and 44 due to changes in the voltage of the conductor layer 66 during various operations such as write operation, read operation, and erasing operation. Therefore, it is possible to reduce a decrease in reliability of the transfer transistors TW0_0 and TW0_1 due to a change in the potential of each conductor layer 66 while reducing an increase in the aspect ratio of the contact.

Further, according to the embodiment, the transfer transistors TW0_0 and TW0_1 share the electrode 202. With such a configuration, it is possible to reduce an increase in the area occupied by the transfer transistors TW0_0 and TW0_1 in the semiconductor substrate 20. Therefore, it is possible to reduce an increase in the size of the semiconductor storage device 1.

2. Modifications

The above-described embodiment may be modified in various ways.

The semiconductor storage device according to the modifications will be described below. Hereinafter, the configuration and manufacturing method of the semiconductor storage device according to the modifications will be described focusing on the differences from the semiconductor storage device 1 according to the embodiment. The semiconductor storage device according to the modifications also has the same effect as that of the embodiment.

2.1 First Modification

In the above-described embodiment, the electrodes 101 and 102 are provided on the gate insulating film 51 in the P-type well region 41B but the present disclosure is not limited thereto. In addition to the electrodes 101 and 102, a conductor layer different from the electrodes 101 and 102 may be provided on the gate insulating film 51.

In the following description, the configuration of the transfer transistor according to the first modification will be mainly described with respect to the configuration different from the configuration of the embodiment. Since the method for manufacturing the transfer transistor according to the first modification is substantially the same as the method for manufacturing the transfer transistor according to the embodiment, the description thereof will be omitted.

Figure 25:
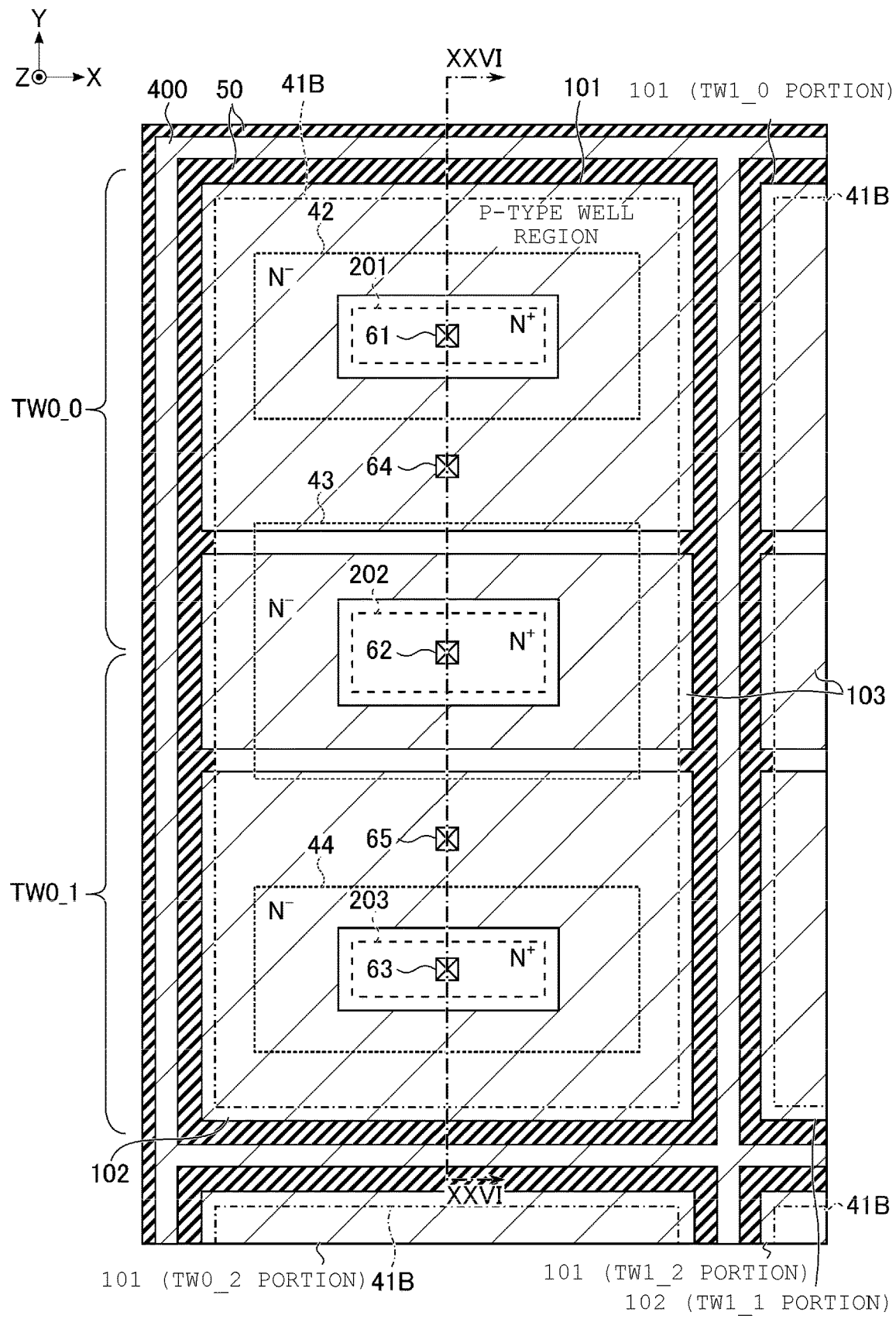
FIG. 25 is a plan view showing an example of a planar structure of a transfer transistor provided in a semiconductor storage device according to a first modification.

The planar structure of the transfer transistors TW0_0 and TW0_1 according to the first modification will be described with reference to FIG. 25. FIG. 25 is a plan view showing an example of the planar structure of the transfer transistor provided in the semiconductor storage device according to the first modification.

Above the P-type well region 41B, in addition to the electrodes 101 and 102, a conductor layer 103 is provided via the gate insulating film 51 (not shown in FIG. 25). The conductor layer 103 is sandwiched between the electrodes 101 and 102 along the Y direction. The conductor layer 103 has an opening that is open to surround the contact 62. The opening corresponds to the region where the electrode 202 is provided. A sidewall (not shown in FIG. 25) is provided on the outer circumference of the conductor layer 103 and the inner circumference of the conductor layer 103 corresponding to the opening.

Figure 26:
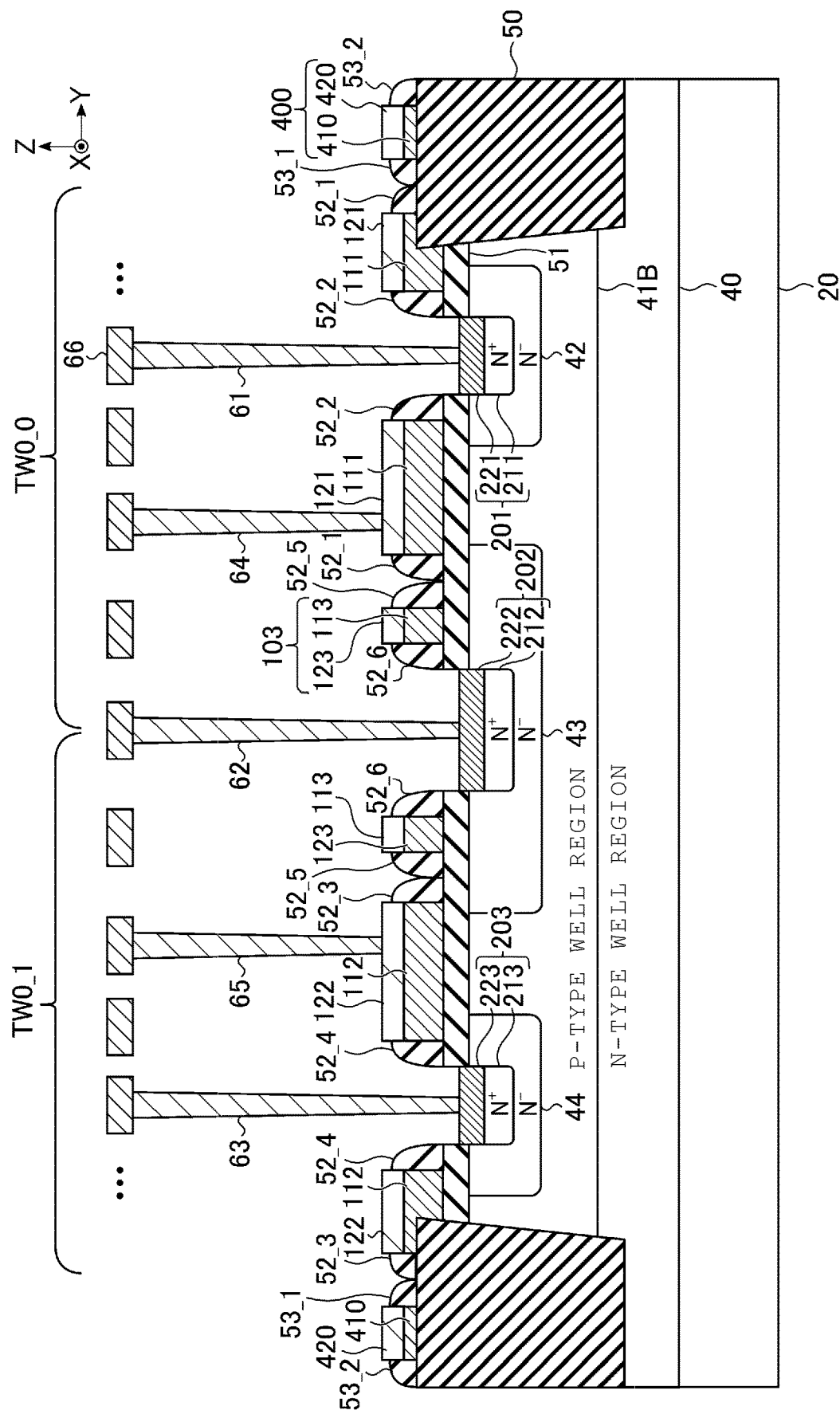
FIG. 26 is a cross-sectional view taken along the line XXVI-XXVI of FIG. 25, showing an example of the cross-sectional structure of the transfer transistor provided in the semiconductor storage device according to the first modification.

The cross-sectional structure of the transfer transistors TW0_0 and TW0_1 according to the first modification will be described with reference to FIG. 26. FIG. 26 is a cross-sectional view taken along the line XXVI-XXVI of FIG. 25, showing an example of the cross-sectional structure of the transfer transistor provided in the semiconductor storage device according to the first modification. In the following, the structure of the transfer transistor in the cross section shown in FIG. 26 will be described.

The conductor layer 103 includes conductor layers 113 and 123. The upper end of the conductor layer 113 is provided at a position above the upper end of the insulator layer 50. The conductor layer 113 is provided on the upper surface of the portion of the gate insulating film 51 between the electrodes 201 and 202 on the other end side of the electrode 101, and on the upper surface of the portion of the gate insulating film 51 between the electrodes 202 and 203 on one end side of the electrode 102. The conductor layer 123 is provided on the upper surface of the conductor layer 113. The conductor layer 113 contains, for example, polysilicon. The conductor layer 123 contains, for example, nickel silicide (NiSi), nickel platinum silicide (NiPtSi), and cobalt silicide (CoSi).

Sidewalls 52_5 and 52_6 are provided on the side surface of the conductor layer 103. The upper ends of the sidewalls 52_5 and 52_6 are located at a height equal to or lower than the upper end of the conductor layer 103.

The sidewall 52_5 includes a first portion and a second portion. The first portion of the sidewall 52_5 is provided on the upper surface of the gate insulating film 51 so as to be in contact with one end of the portion of the conductor layer 103 provided further on one end side than the electrode 202 in the Y direction. Further, the second portion of the sidewall 52_5 is provided on the upper surface of the gate insulating film 51 so as to be in contact with the other end of the portion of the conductor layer 103 provided further on the other end side than the electrode 202 in the Y direction. The first portion of the sidewall 52_5 is adjacent to and in contact with the second portion of the sidewall 52_1 along the Y direction. The second portion of the sidewall 52_5 is adjacent to and in contact with the first portion of the sidewall 52_3 along the Y direction.

The sidewall 52_6 includes a first portion and a second portion. The first portion of the sidewall 52_6 is provided on the upper surface of the gate insulating film 51 so as to be in contact with the other end of the portion of the conductor layer 103 provided further on one end side than the electrode 202 in the Y direction. Further, the second portion of the sidewall 52_6 is provided on the upper surface of the gate insulating film 51 so as to be in contact with one end of the portion of the conductor layer 103 provided further on the other end side than the electrode 202 in the Y direction. The first portion of the sidewall 52_6 and the second portion of the sidewall 52_6 are adjacent to the electrode 202 along the Y direction.

In FIG. 25, the contact is not connected to the conductor layer 103 and the conductor layer 103 is electrically floating. However, a contact may be connected to the conductor layer 103, and for example, a ground voltage VSS (0 V) may be applied.

Even with the above-mentioned configuration of the transfer transistor, the same effect as that of the embodiment can be obtained.

Further, since the region between the electrode 101 and the conductor layer 103 and the region between the electrode 102 and the conductor layer 103 each have a linear shape, for example, when forming the conductor layer 111, 112, 113, and 410 in the step corresponding to S14 of the embodiment, it is possible to prevent the processing from becoming more difficult. Further, since the electrode 202 is surrounded by the conductor layer 103 in a plan view, when forming the N$^+$ impurity diffusion regions 211, 212, and 213 in the step corresponding to S16 of the embodiment, it is possible to prevent the processing from becoming more difficult.

2.2 Second Modification

In the above-described embodiment and the first modification, the contact connected to the first end of the transfer transistor and the contact connected to the second end of the transfer transistor are each connected to the N$^+$ impurity diffusion region via silicide, but the present disclosure is not limited thereto. For example, the contact connected to the first end of the transfer transistor and the contact connected to the second end of the transfer transistor may each be directly connected to the N$^+$ impurity diffusion region.

In the following description, the configuration and manufacturing method of the transfer transistors TW0_0 and TW0_1 according to the second modification will be mainly described with respect to the differences from the configuration and manufacturing method of the transfer transistors TW0_0 and TW0_1 according to the embodiment.

2.2.1 Configuration

Figure 27:
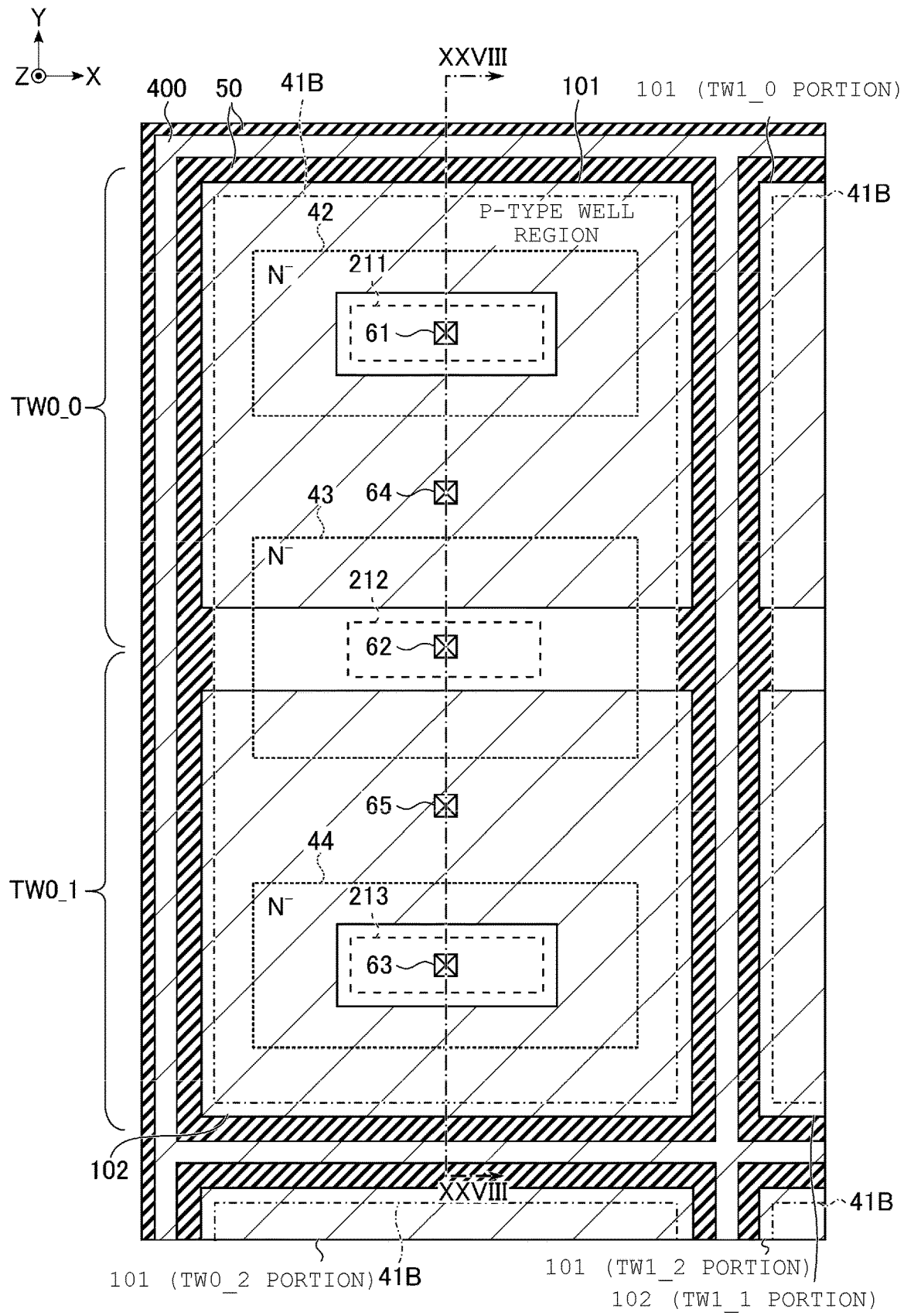
FIG. 27 is a plan view showing an example of a planar structure of a transfer transistor provided in a semiconductor storage device according to a second modification.

The planar structure of the transfer transistors TW0_0 and TW0_1 according to the second modification will be described with reference to FIG. 27. FIG. 27 is a plan view showing an example of the planar structure of the transfer transistor provided in the semiconductor storage device according to the second modification.

In the second modification, the N$^+$ impurity diffusion regions 211, 212, and 213 function as electrodes, respectively. More specifically, the N$^+$ impurity diffusion region 211 functions as a first end of the transfer transistor TW0_0. The N$^+$ impurity diffusion region 213 functions as a first end of the transfer transistor TW0_1. The N$^+$ impurity diffusion region 212 functions as a second end of the transfer transistor TW0_0 and a second end of the transfer transistor TW0_1.

The contact 61 is in contact with the upper surface of the N$^+$ impurity diffusion region 211. The contact 62 is in contact with the upper surface of the N$^+$ impurity diffusion region 212. The contact 63 is in contact with the upper surface of the N$^+$ impurity diffusion region 213.

The electrode 101 has a rectangular shape including an opening corresponding to the N$^+$ impurity diffusion region 211. Further, the electrode 102 has a rectangular shape including an opening corresponding to the N$^+$ impurity diffusion region 213. The electrodes 101 and 102 sandwich the N$^+$ impurity diffusion region 212 in the Y direction.

Figure 28:
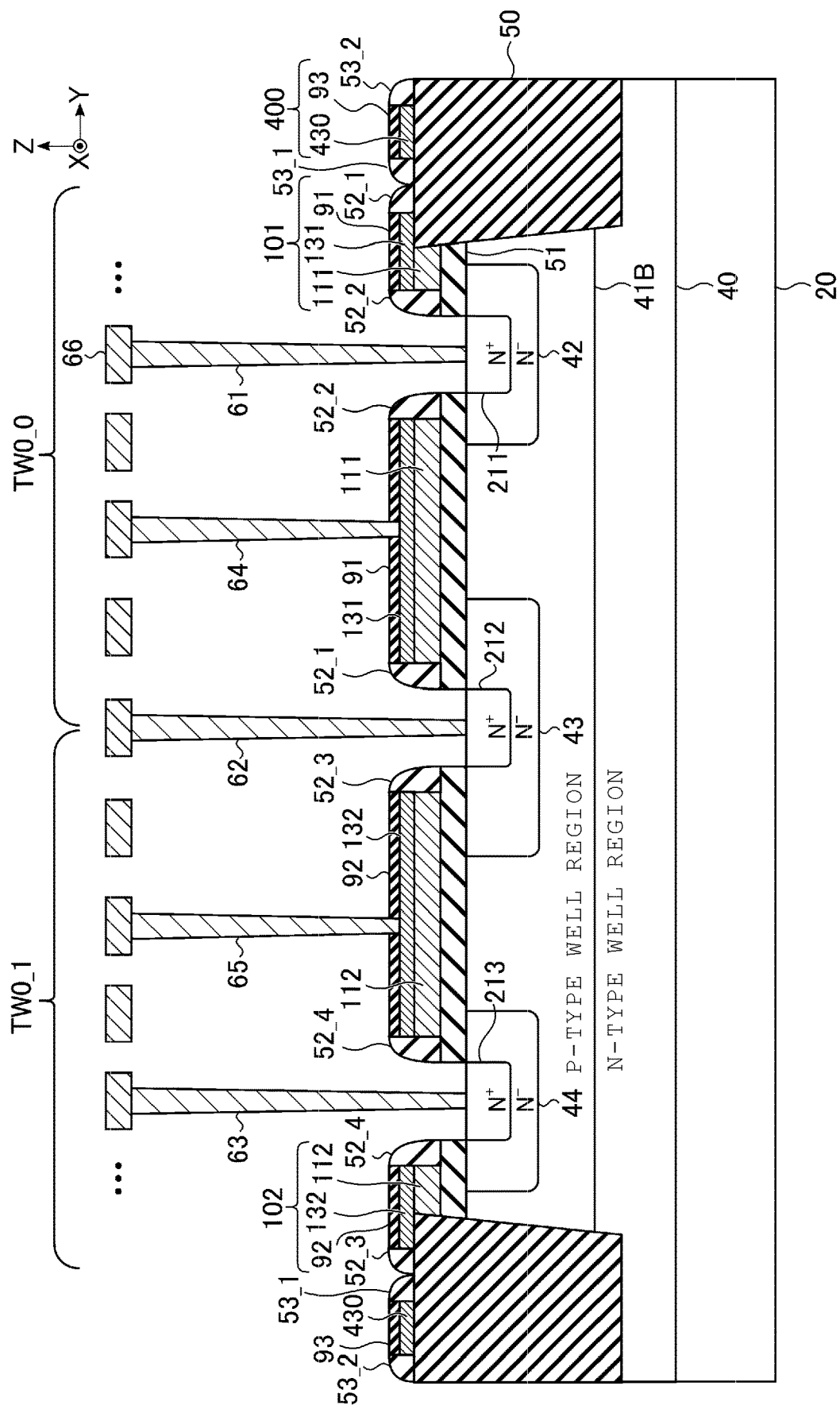
FIG. 28 is a cross-sectional view taken along the line XXVIII-XXVIII of FIG. 27 showing an example of the cross-sectional structure of the transfer transistor provided in the semiconductor storage device according to the second modification.

The cross-sectional structure of the transfer transistors TW0_0 and TW0_1 according to the second modification will be described with reference to FIG. 28. FIG. 28 is a cross-sectional view taken along the line XXVIII-XXVIII of FIG. 27, showing an example of the cross-sectional structure of the transfer transistor provided in the semiconductor storage device according to the second modification. In the following, the structure of the transfer transistor in the cross section shown in FIG. 28 will be described.

The electrode 101 includes conductor layers 111 and 131, and an insulator layer 91. The upper end of the conductor layer 111 is located at the same height as the upper end of the insulator layer 50, for example. The conductor layer 111 is provided on the upper surface of the portion of the gate insulating film 51 provided further on one end side than the N$^+$ impurity diffusion region 212. The conductor layer 131 is provided on the upper surface of the conductor layer 111 and on the upper surface of the portion on the other end side of the portion of the insulator layer 50 provided further on one end side than the P-type well region 41B. The insulator layer 91 is provided on the upper surface of the conductor layer 131. The conductor layer 131 contains, for example, tungsten (W) and tungsten silicide (WSi). The insulator layer 91 contains, for example, silicon nitride (SiN).

The electrode 102 includes conductor layers 112 and 132, and an insulator layer 92. The upper end of the conductor layer 112 is located at the same height as the upper end of the insulator layer 50, for example. The conductor layer 112 is provided on the upper surface of the portion of the gate insulating film 51 provided further on the other end side than the N$^+$ impurity diffusion region 212. The conductor layer 132 is provided on the upper surface of the conductor layer 112 and on the upper surface of the portion on one end side of the portion of the insulator layer 50 provided further on the other end side than the P-type well region 41B. The insulator layer 92 is provided on the upper surface of the conductor layer 132. The conductor layer 132 contains, for example, tungsten (W) and tungsten silicide (WSi). The insulator layer 92 contains, for example, silicon nitride (SiN).

The shield conductor layer 400 includes a conductor layer 430 and an insulator layer 93. The conductor layer 430 is provided on the upper surface of the portion of the insulator layer 50 provided further on one end side than the P-type well region 41B, and on the upper surface of the portion of the insulator layer 50 provided further on the other end side than the P-type well region 41B. The insulator layer 93 is provided on the upper surface of the conductor layer 430. The conductor layer 430 contains, for example, tungsten (W) and tungsten silicide (WSi). The insulator layer 93 contains, for example, silicon nitride (SiN).

The lower end of the contact 64 penetrates the insulator layer 91 and comes into contact with the conductor layer 131. The lower end of the contact 65 penetrates the insulator layer 92 and comes into contact with the conductor layer 132.

2.2.2 Manufacturing Method of Transfer Transistor

The method for manufacturing the transfer transistor according to the second modification will be mainly described with respect to the difference from the method for manufacturing the transfer transistor according to the embodiment.

Figure 29:
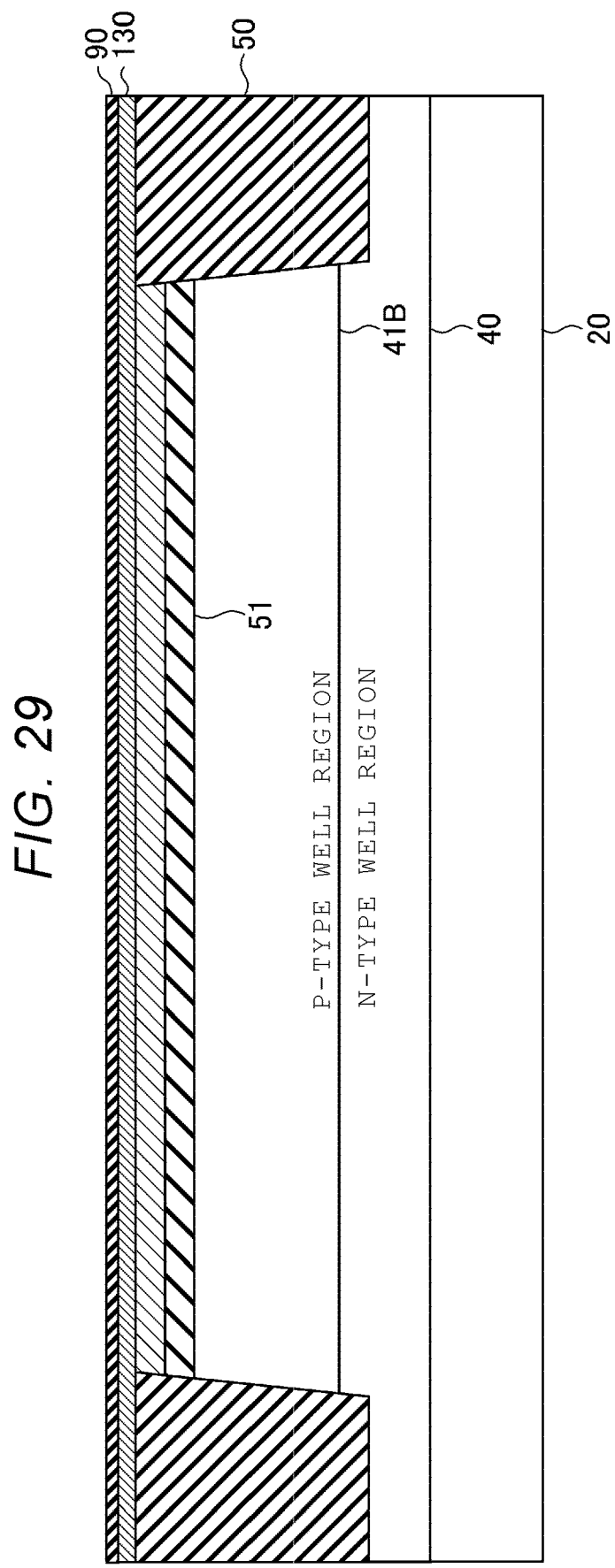
FIG. 29 is a cross-sectional view for illustrating an example of a structure in the process of manufacturing the transfer transistor provided in the semiconductor storage device according to the second modification.
Figure 30:
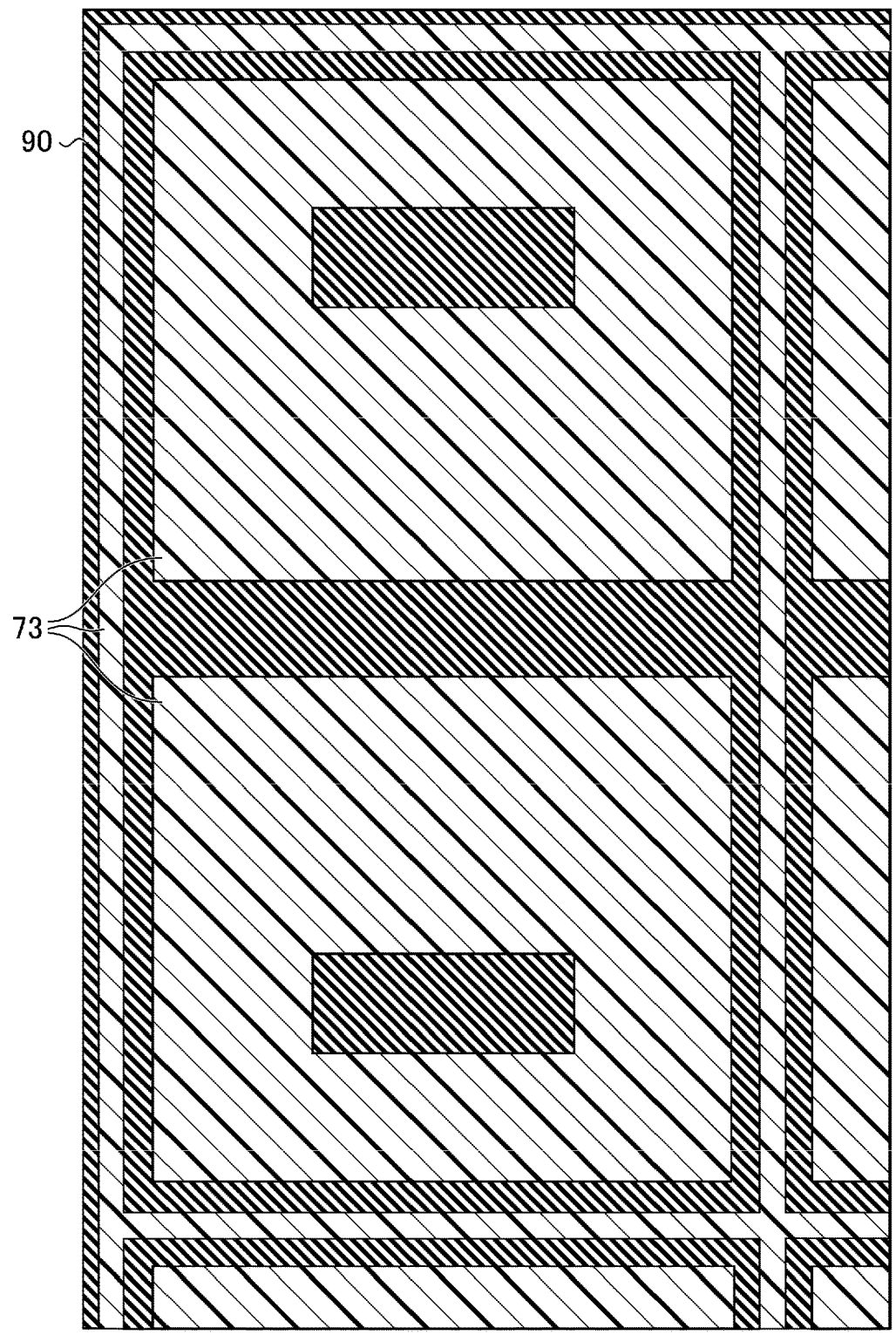
FIG. 30 is a plan view for illustrating an example of a structure in the process of manufacturing the transfer transistor provided in the semiconductor storage device according to the second modification.
Figure 31:
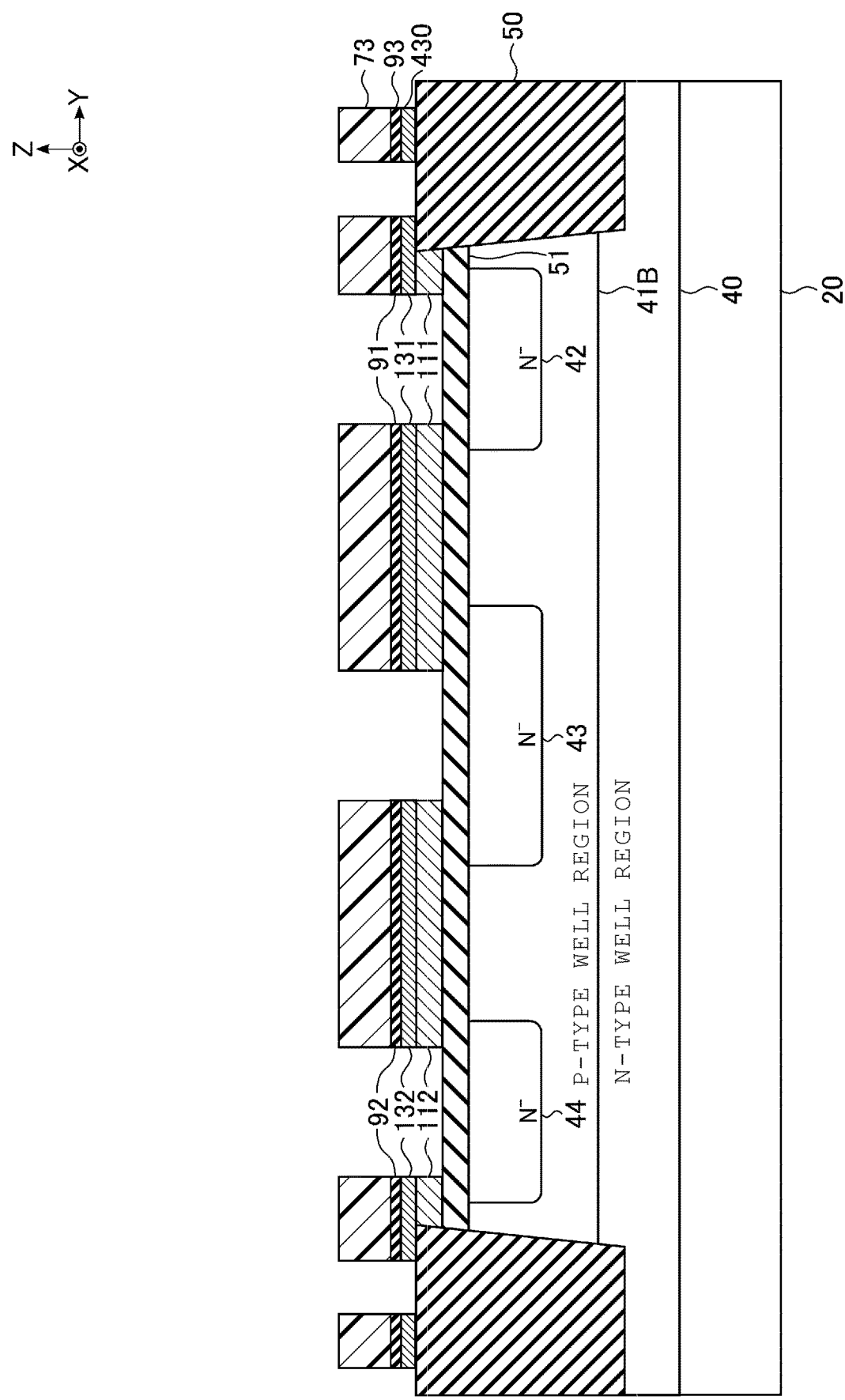
FIG. 31 is a cross-sectional view for illustrating an example of a structure in the process of manufacturing the transfer transistor provided in the semiconductor storage device according to the second modification.

FIGS. 29 to 31 are plan views or cross-sectional views showing an example of a structure in the process of manufacturing the transfer transistors TW0_0 and TW0_1 provided in the semiconductor storage device 1 according to the embodiment. The plan view shown in FIG. 30 shows the region corresponding to FIG. 27. The cross-sectional views shown in FIGS. 29 and 31 show the region corresponding to FIG. 28. Hereinafter, an example of a manufacturing method relating to the formation of the transfer transistor TW in the semiconductor storage device 1 according to the second modification will be mainly described with respect to differences from the manufacturing method according to the embodiment.

In the step corresponding to the process (S13) for forming the element isolation area of the embodiment, after the planarization process is executed, the conductor layer 130 and the insulator layer 90 are stacked on the conductor layer 110, and the insulator layer 50 in this order as shown in FIG. 29.

In the step corresponding to the process (S14) for forming the structure corresponding to the gate of the embodiment, as shown in FIG. 30, a pattern of the resist material 73 in which the regions where the openings of the electrodes 101 and 102 are provided, the region to be sandwiched in the Y direction by the electrodes 101 and 102, the region to be sandwiched in the X and Y directions by the shield conductor layer 400 and the electrodes 101 and 102, and the region outside the region where the shield conductor layer 400 is to be provided are removed is formed, and the insulator layer 90 is exposed. Then, the portion of the conductor layer 110, the portion of the conductor layer 130, and the portion of the insulator layer 90 are removed by anisotropic etching using the pattern of the resist material 73. As a result, as shown in FIG. 31, the conductor layer 110 is separated into the conductor layers 111 and 112. Further, the conductor layer 130 is separated into the conductor layers 131, 132, and 430. Further, the insulator layer 90 is separated into the insulator layers 91, 92, and 93. After the portion of the conductor layer 110, the portion of the conductor layer 130, and the portion of the insulator layer 90 are removed, the resist material 73 is removed.

After the process (S16) for forming the N$^+$ impurity diffusion region in the embodiment is executed, the contacts 61 to 65 are formed.

As described above, the transfer transistors TW0_0 and TW0_1 according to the second modification are formed.

Even with the above-mentioned configuration of the transfer transistor, the same effect as that of the embodiment and the first modification can be obtained.

2.3 Third Modification

In the above-described embodiment, the first modification, and the second modification, the two transfer transistors share one electrode functioning as the second end, but the present disclosure is not limited thereto. The first and second ends of each transfer transistor may be provided as separate electrodes, which are different from the first and second ends of the other transfer transistors, respectively.

In the following description, the configuration of the transfer transistor according to the third modification will be mainly described with respect to the configuration different from the configuration of the embodiment. Since the method for manufacturing the transfer transistor according to the third modification is substantially the same as the method for manufacturing the transfer transistor according to the embodiment, the description thereof will be omitted.

2.3.1 Row Decoder Module

Figure 32:
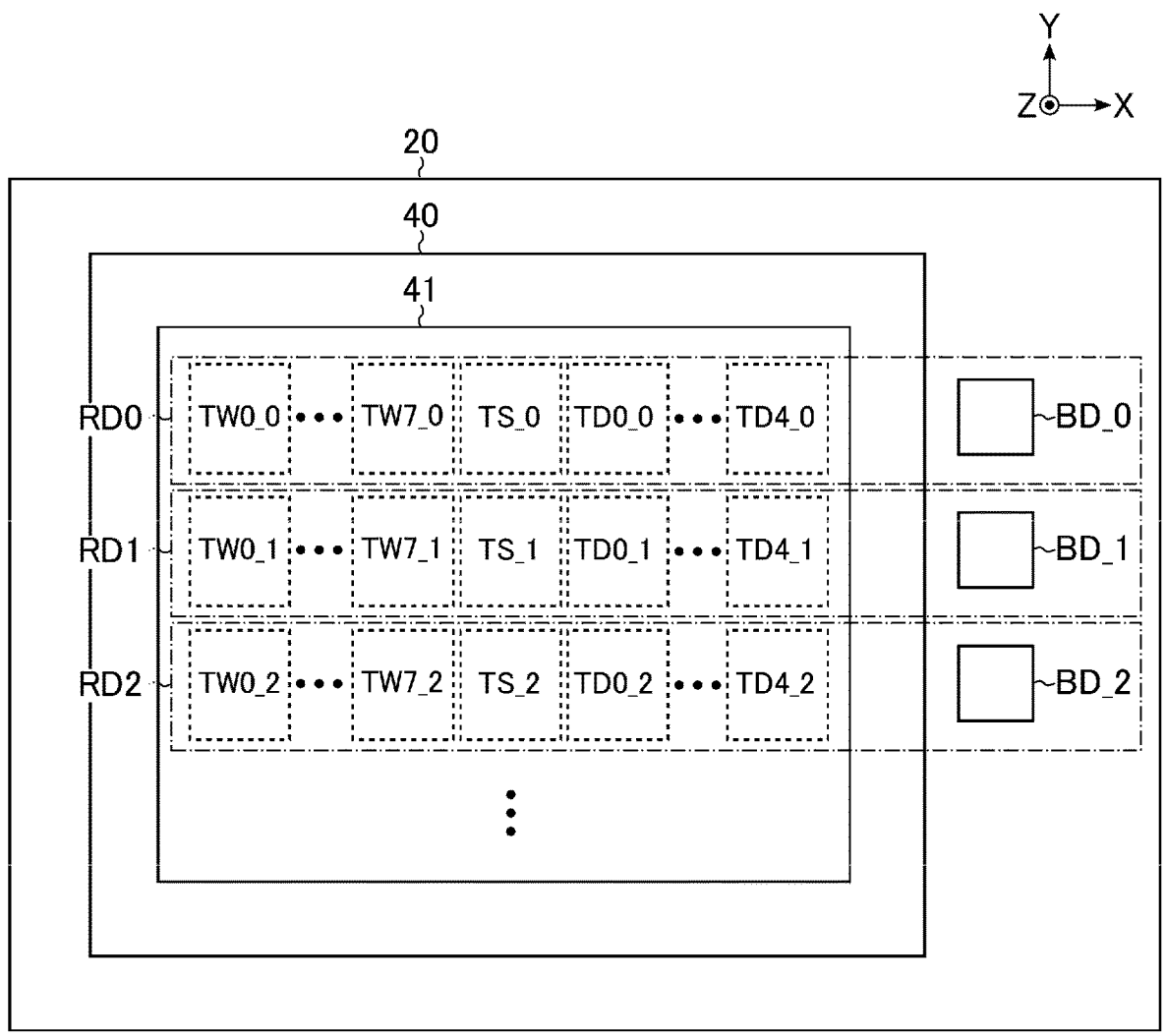
FIG. 32 is a plan view showing an example of a planar structure of a row decoder module of a semiconductor storage device according to a third modification.

The planar structure of the row decoder module 15 of the semiconductor storage device 1 according to the third modification will be described with reference to FIG. 32. FIG. 32 is a plan view showing an example of the planar structure of the row decoder module of the semiconductor storage device according to the third modification.

In the third modification, each row decoder RD is provided in, for example, a rectangular region.

The row decoders RD0, RD1, RD2 . . . are located in this order, for example, along the Y direction.

In each row decoder RD, the transfer transistors TW, TS, and TD are provided in, for example, a rectangular region.

The plurality of transfer transistors TW, TS, and TD are provided in a matrix lined up in the X direction and the Y direction, for example.

2.3.2 Transfer Transistor

The configuration of the transfer transistors TW, TS, and TD provided in the semiconductor storage device 1 according to the third modification will be described.

(Planar Structure)

Figure 33:
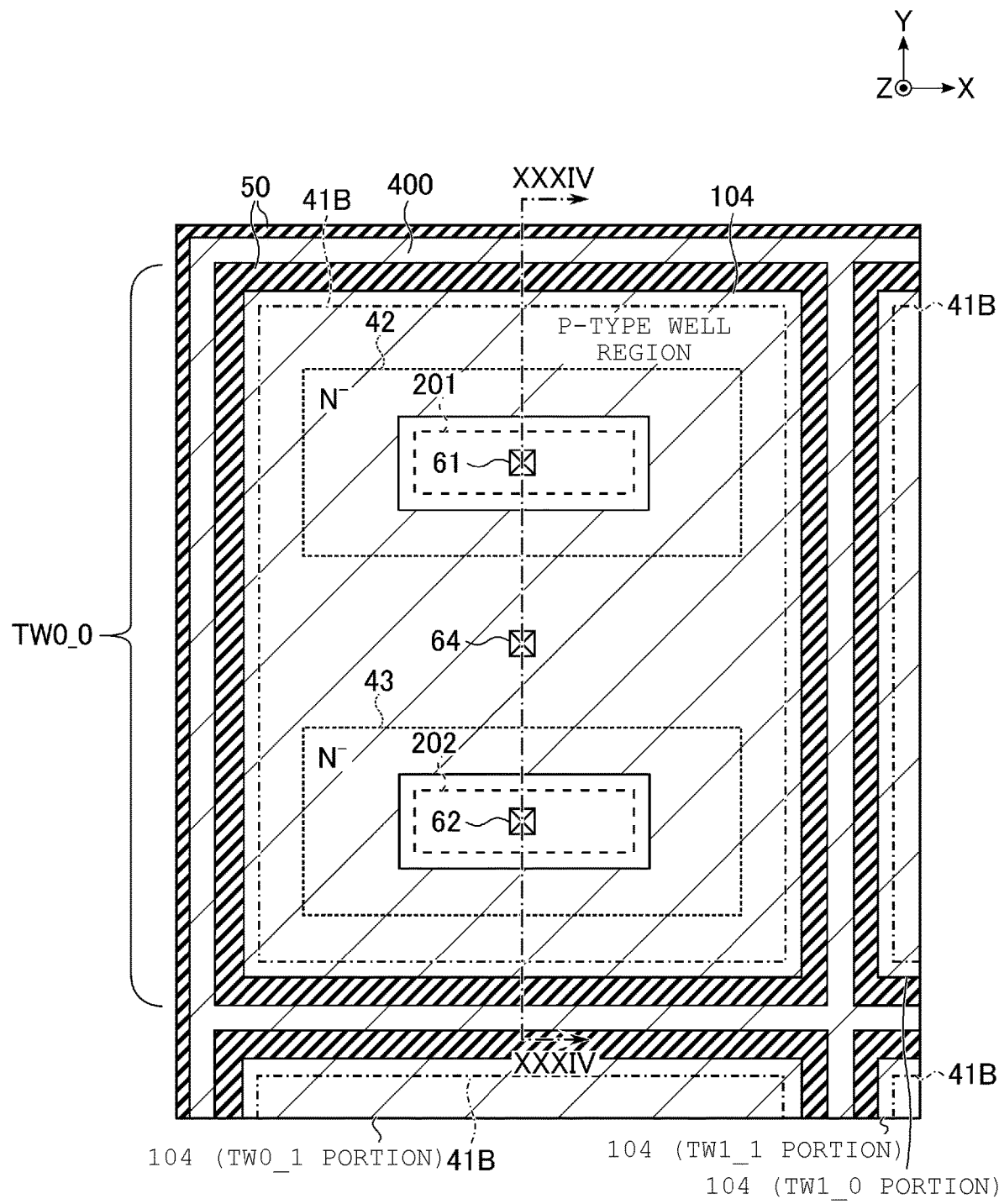
FIG. 33 is a plan view showing an example of a planar structure of a transfer transistor provided in the semiconductor storage device according to the third modification.

The planar structure of the transfer transistors TW, TS, and TD according to the third modification will be described with reference to FIG. 33. FIG. 33 is a plan view showing an example of the planar structure of the transfer transistor provided in the semiconductor storage device according to the third modification. In the example shown in FIG. 33, among the configurations shown in FIG. 32, a planar structure including the transfer transistor TW0_0 is mainly shown. In FIG. 33, the portion of the transfer transistor TW1_0, the portion of the transfer transistor TW0_1, and the portion of the transfer transistor TW1_1 are also shown. The structures of the transfer transistors TW, TS, and TD have substantially the same structure. In the following, the structure of the transfer transistor TW0_0 will be mainly described.

The insulator layer 50 in the third modification surrounds the transfer transistor TW0_0 in a plan view. The insulator layer 50 is provided in a grid pattern to separate a plurality of transfer transistors located in a matrix, for example.

The N⁻ impurity diffusion regions 42 and 43 are formed in the P-type well region 41B apart from each other.

An electrode 104 is provided above the P-type well region 41B. The electrode 104 functions as a gate for the transfer transistor TW0_0. In plan view, the electrode 104 has an opening that is open to surround the contact 61 and an opening that is open to surround the contact 62. The opening corresponding to the contact 61 corresponds to the region where the electrode 201 is provided. The opening corresponding to the contact 62 corresponds to the region where the electrode 202 is provided. A sidewall (not shown in FIG. 33) is provided on the outer peripheral side surface of the electrode 104 and the inner peripheral side surface of the electrode 104 corresponding to each of the above two openings.

A contact 64 is provided on the electrode 104.

Normally, a voltage equal to or higher than the ground voltage VSS is applied to the electrode 104 during various operations such as a write operation, a read operation, and an erasing operation.

(Cross-Sectional Structure)

Figure 34:
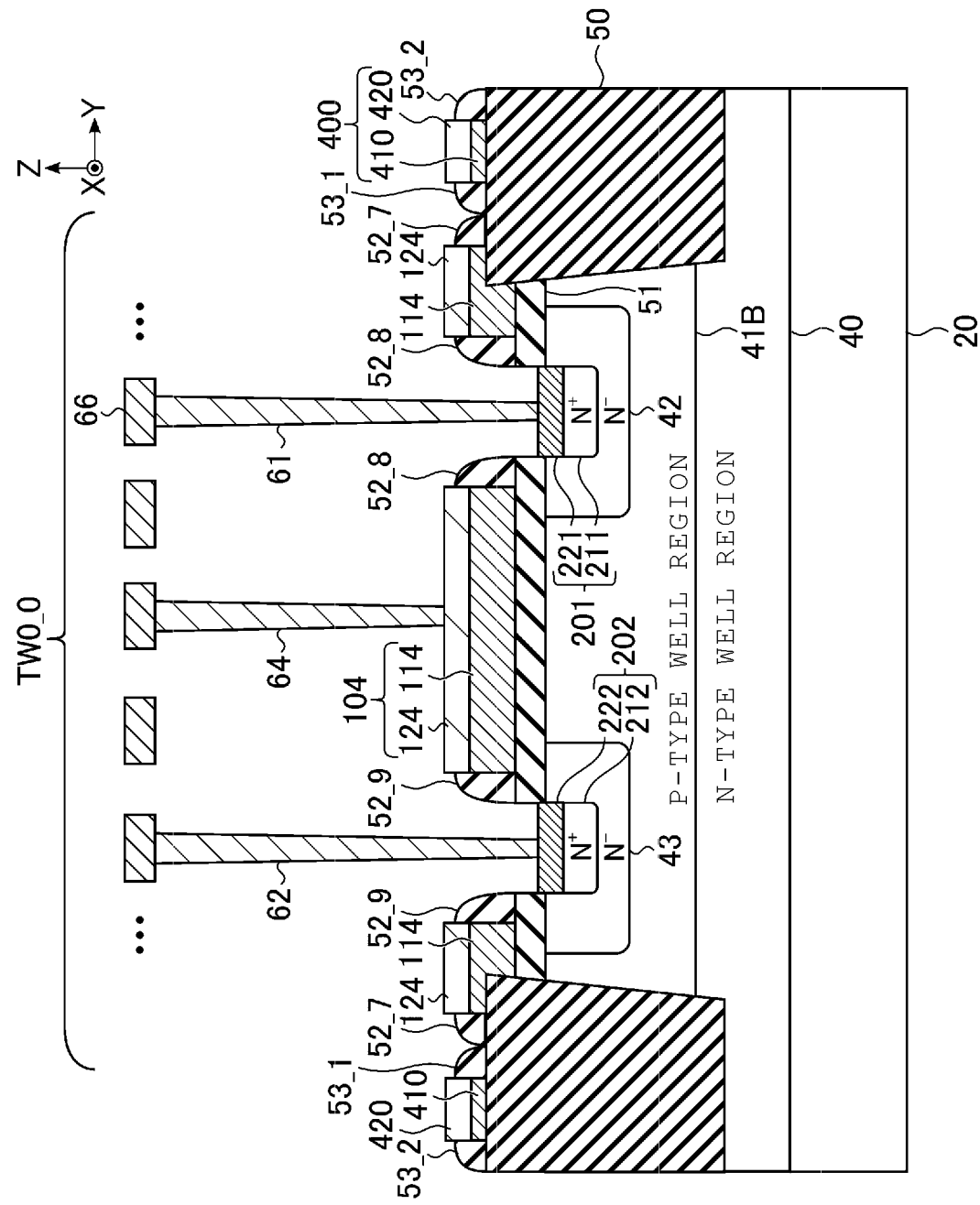
FIG. 34 is a cross-sectional view taken along the line XXXIV-XXXIV of FIG. 33, showing an example of the cross-sectional structure of the transfer transistor provided in the semiconductor storage device according to the third modification.

The cross-sectional structure of the transfer transistor TW0_0 will be described with reference to FIG. 34. FIG. 34 is a cross-sectional view taken along the line XXXIV-XXXIV of FIG. 33, showing an example of the cross-sectional structure of the transfer transistor provided in the semiconductor storage device according to the third modification. In the following, the structure of the transfer transistor in the cross section shown in FIG. 34 will be described.

The gate insulating film 51 is provided on the upper surface of the P-type well region 41B excluding the electrodes 201 and 202.

The electrode 104 includes conductor layers 114 and 124. The upper end of the conductor layer 114 is provided at a position above the upper end of the insulator layer 50. The conductor layer 114 is provided on the upper surface of the gate insulating film 51, on the upper surface of the portion on the other end side of the portion of the insulator layer 50 provided further on one end side than the P-type well region 41B, and on the upper surface of the portion on one end side of the portion of the insulator layer 50 provided further on the other end side than the P-type well region 41B. The conductor layer 124 is provided on the upper surface of the conductor layer 114. The conductor layer 114 contains, for example, polysilicon. The conductor layer 124 contains, for example, nickel silicide (NiSi), nickel platinum silicide (NiPtSi), and cobalt silicide (CoSi).

Sidewalls 52_7, 52_8, and 52_9 are provided on the side surface of the electrode 104. In the following description, when the sidewalls 52_7, 52_8, and 52_9 are not distinguished, they are simply referred to as the sidewall 52.

More specifically, the sidewall 52_7 includes a first portion and a second portion. The first portion of the sidewall 52_7 is provided on the upper surface of the insulator layer 50 so as to be in contact with one end of the portion of the electrode 104 provided further on one end side than the electrode 201 in the Y direction. Further, the second portion of the sidewall 52_7 is provided on the upper surface of the insulator layer 50 so as to be in contact with the other end of the portion of the electrode 104 provided further on the other end side than the electrode 202 in the Y direction. The first portion of the sidewall 52_7 is in contact with the first portion of the sidewall 53_1 in the Y direction. The second portion of the sidewall 52_7 is in contact with the second portion of the sidewall 53_1 in the Y direction.

The sidewall 52_8 includes a first portion and a second portion. The first portion of the sidewall 52_8 is provided on the upper surface of the gate insulating film 51 so as to be in contact with the other end of the portion of the electrode 104 provided further on one end side than the electrode 201 in the Y direction. Further, the second portion of the sidewall 52_8 is provided on the upper surface of the gate insulating film 51 so as to be in contact with one end of the portion of the electrode 104 provided between the electrodes 201 and 202 in the Y direction. The first portion of the sidewall 52_8 and the second portion of the sidewall 52_8 are adjacent to the electrode 201 along the Y direction.

The sidewall 52_9 includes a first portion and a second portion. The first portion of the sidewall 52_9 is provided on the upper surface of the gate insulating film 51 so as to be in contact with the other end of the portion of the electrode 104 provided between the electrodes 201 and 202 in the Y direction. Further, the second portion of the sidewall 52_9 is provided on the upper surface of the gate insulating film 51 so as to be in contact with one end of the portion of the electrode 104 provided further on the other end side than the electrode 202 in the Y direction. The first portion of the sidewall 52_9 and the second portion of the sidewall 52_9 are adjacent to the electrode 202 along the Y direction.

Even with the above-mentioned configuration of the transfer transistor, it is possible to reduce a decrease in reliability of the semiconductor storage device as in the embodiment, the first modification, and the second modification.

2.4 Fourth Modification

In the above-described embodiment, first modification, second modification, and third modification, the contacts 61, 62, and 63 are provided apart from the sidewall 52 in the X direction and the Y direction, but the present disclosure is not limited thereto. The contacts 61, 62, and 63 may be in contact with the sidewall 52 in the X and Y directions.

In the following description, the configuration of the transfer transistor according to the fourth modification will be mainly described with respect to the configuration different from the configuration of the embodiment. Since the method for manufacturing the transfer transistor according to the fourth modification is substantially the same as the method for manufacturing the transfer transistor according to the embodiment, the description thereof will be omitted.

Figure 35:
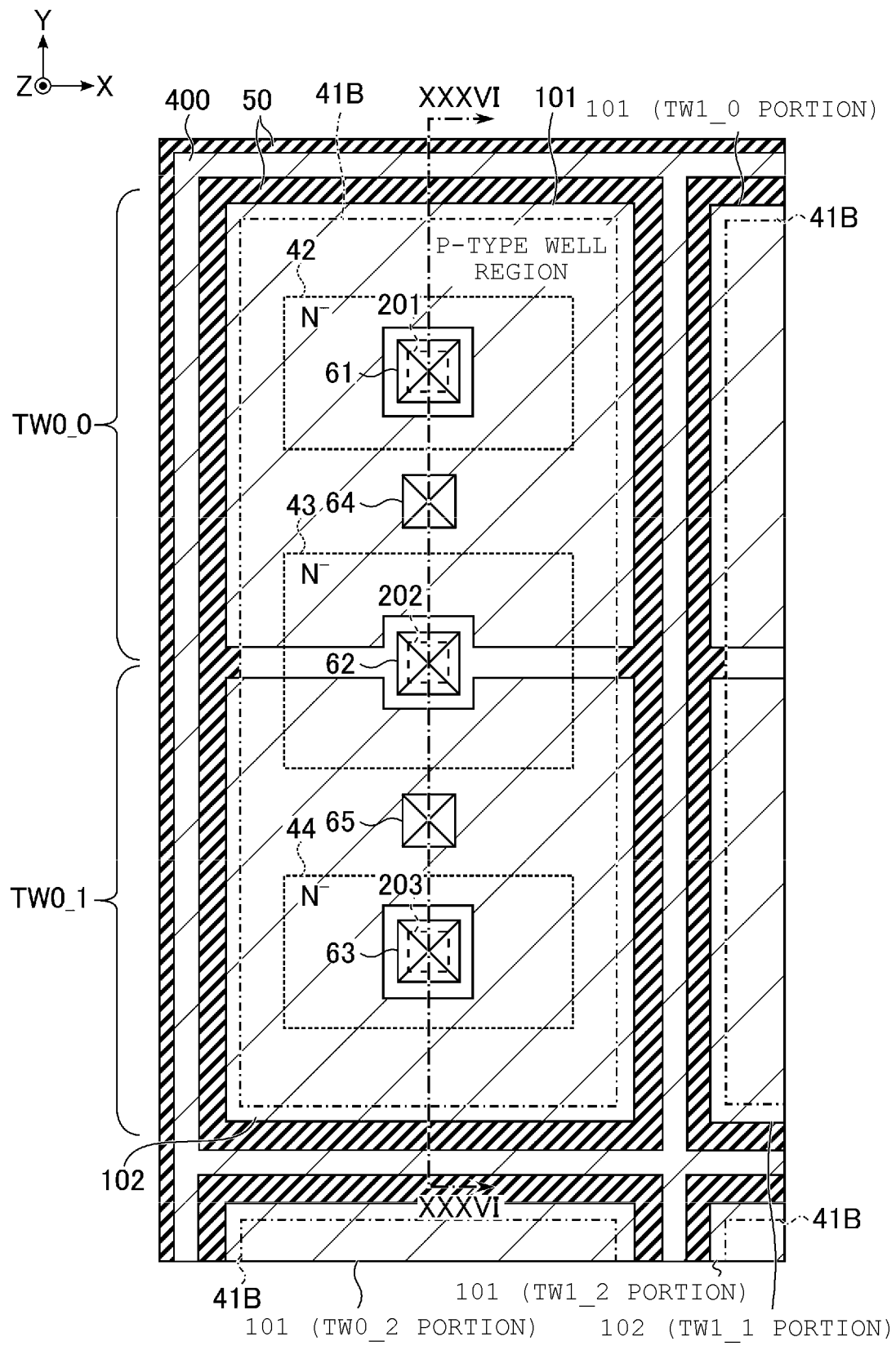
FIG. 35 is a plan view showing an example of a planar structure of a transfer transistor provided in a semiconductor storage device according to a fourth modification.

The planar structure of the transfer transistors TW0_0 and TW0_1 according to the fourth modification will be described with reference to FIG. 35. FIG. 35 is a plan view showing an example of the planar structure of the transfer transistor provided in the semiconductor storage device according to the fourth modification.

In the fourth modification, the electrode 201 is provided in a region equal to or smaller than the contact 61, for example.

Further, the electrode 202 is provided in a region equal to or smaller than the contact 62, for example.

Further, the electrode 203 is provided in a region equal to or smaller than the bottom surface of the contact 63, for example.

Figure 36:
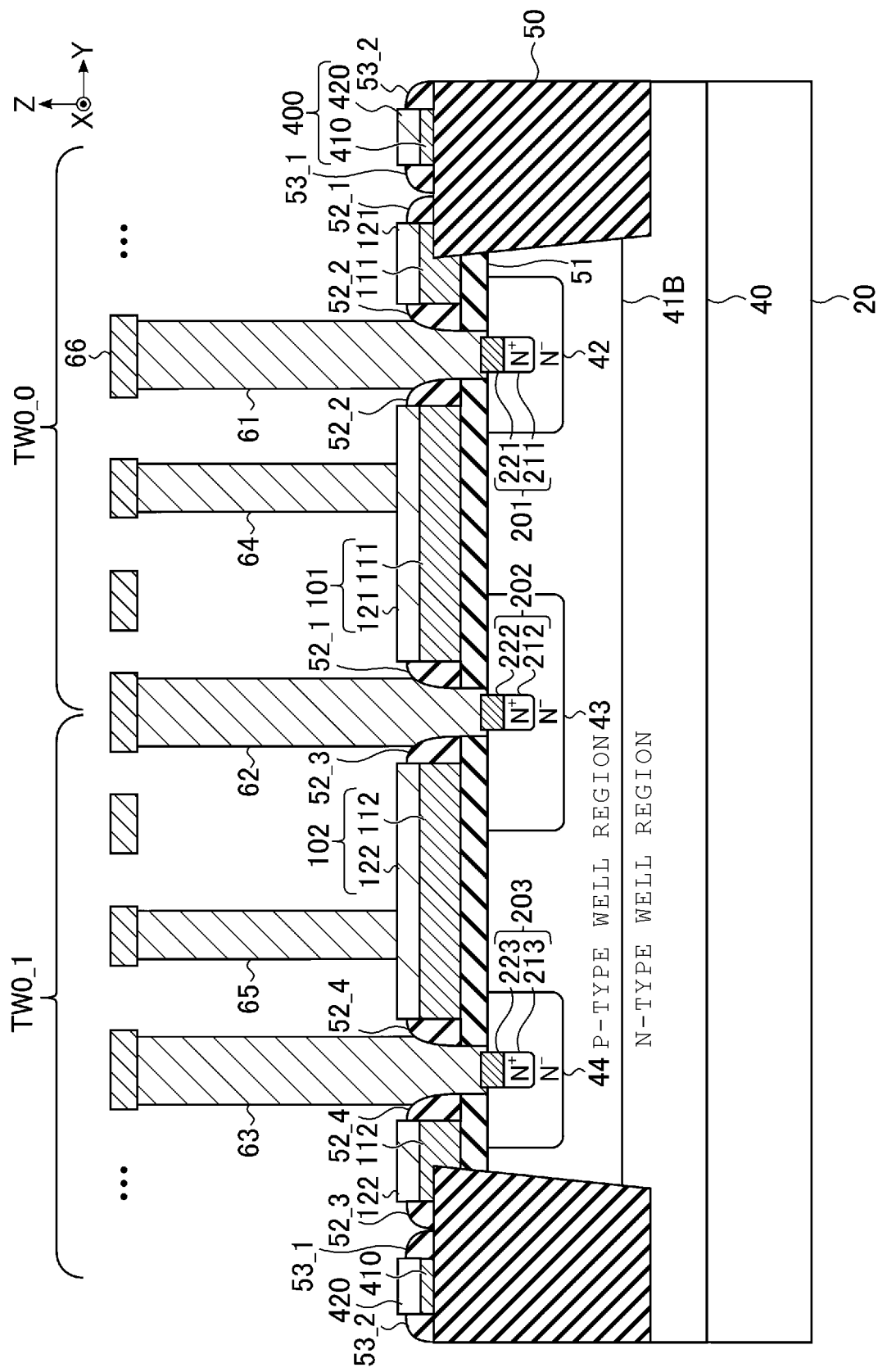
FIG. 36 is a cross-sectional view taken along the line XXXVI-XXXVI of FIG. 35, showing an example of the cross-sectional structure of the transfer transistor provided in the semiconductor storage device according to the fourth modification.

The cross-sectional structure of the transfer transistors TW0_0 and TW0_1 according to the fourth modification will be described with reference to FIG. 36. FIG. 36 is a cross-sectional view taken along the line XXXVI-XXXVI of FIG. 35, showing an example of the cross-sectional structure of the transfer transistor provided in the semiconductor storage device according to the fourth modification.

In the cross section shown in FIG. 36, the contact 61 is in contact with the first portion of the sidewall 52_2 and the second portion of the sidewall 52_2.

The contact 62 is in contact with the second portion of the sidewall 52_1 and the first portion of the sidewall 52_3.

The contact 63 is in contact with the first portion of the sidewall 52_4 and the second portion of the sidewall 52_4.

The lower surface of the contact 61 is in contact with, for example, the entire upper surface of the conductor layer 221. The lower surface of the contact 62 is in contact with, for example, the entire upper surface of the conductor layer 222. The lower surface of the contact 63 is in contact with, for example, the entire upper surface of the conductor layer 223.

In a cross section along the X direction (not shown), each of the contacts 61 to 63 is in contact with the sidewall 52 at both ends of the contact along the X direction.

Even with the above-mentioned configuration of the transfer transistor, the same effect as that of the embodiment, the first modification, and the second modification can be obtained.

Further, according to the fourth modification, each of the contacts 61 to 63 connected to each of the electrodes 201 to 203 can be in contact with the sidewall 52. This makes it possible to reduce an increase in the size of the openings of the electrodes 101 and 102. Therefore, according to the fourth modification, the increase in the size of the semiconductor storage device 1 can be reduced by reducing the increase in the size of the electrodes 101 and 102.

In the fourth modification, each of the contacts 61 to 63 is in contact with the sidewall 52 at both ends of the contact along the X direction and at both ends of the contact along the Y direction, but the present disclosure is not limited thereto. Each of the contacts 61 to 63 may be in contact with the sidewall 52 only at either end of the contact along the X direction. Further, each of the contacts 61 to 63 may be in contact with the sidewall 52 only at either end of the contact along the Y direction.

Further, in the fourth modification, when two transfer transistors are provided in the P-type well region 41B, the contacts 61, 62, and 63 are in contact with the sidewall 52 in the X direction and the Y direction, but the present disclosure is not limited thereto. For example, when one transfer transistor is provided in the P-type well region 41B as in the third modification, the contacts 61 and 62 may be in contact with the sidewall 52 in the X direction and the Y direction.

2.5 Fifth Modification

In the above-described embodiment, the first modification, the second modification, the third modification, and the fourth modification, the shield conductor layer 400 is provided on the upper surface of the insulator layer 50, but the present disclosure is not limited thereto. The shield conductor layer 400 may not be provided on the upper surface of the insulator layer 50.

In the following description, the configuration of the transfer transistor according to the fifth modification will be mainly described with respect to the configuration different from the configuration of the embodiment. Since the method for manufacturing the transfer transistor according to the fifth modification is substantially the same as the method for manufacturing the transfer transistor according to the embodiment except that the shield conductor layer 400 is not formed, the description thereof will be omitted.

Figure 37:
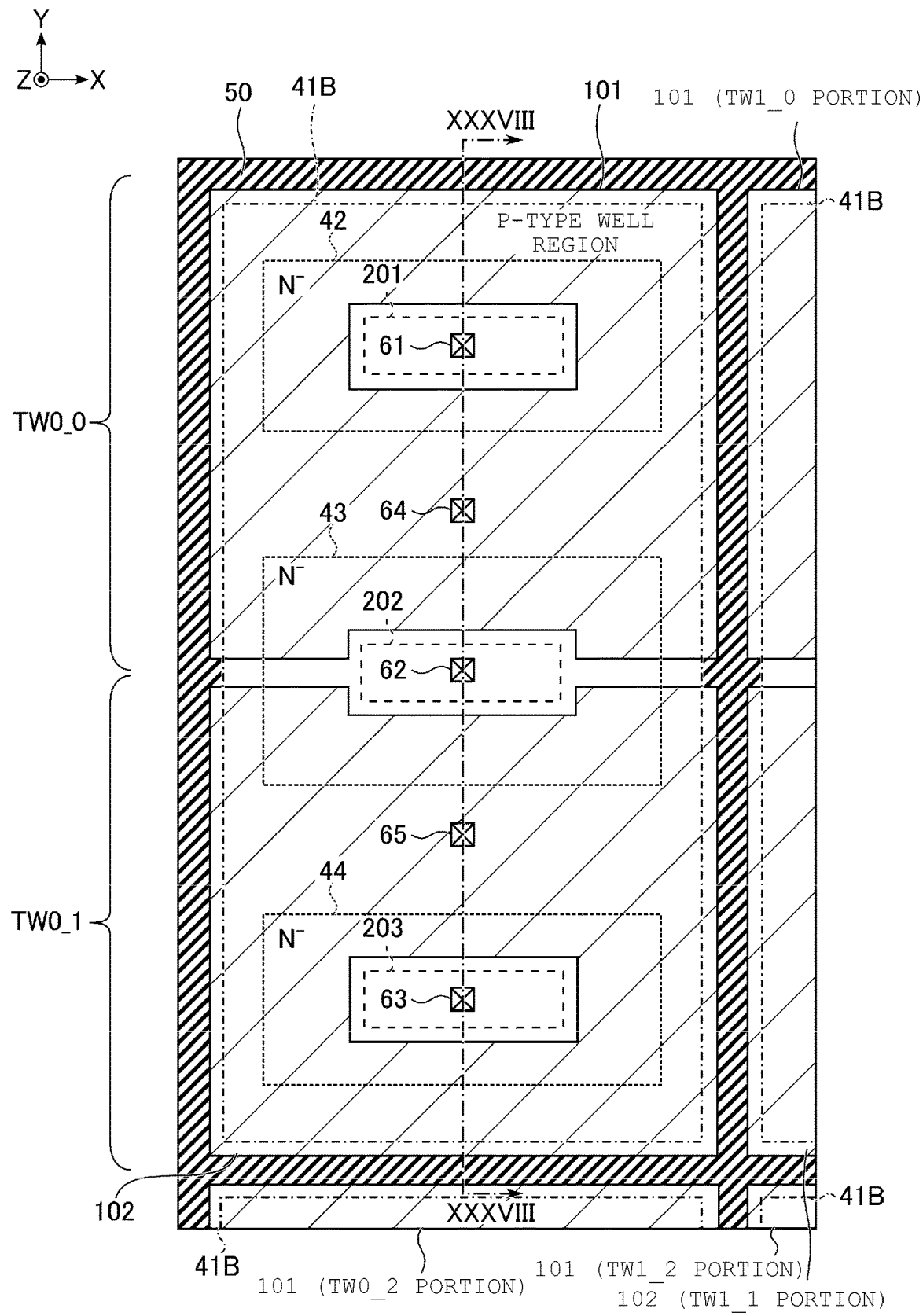
FIG. 37 is a plan view showing an example of a planar structure of a transfer transistor provided in a semiconductor storage device according to a fifth modification.

The planar structure of the transfer transistor TW according to the fifth modification will be described with reference to FIG. 37. FIG. 37 is a plan view showing an example of the planar structure of the transfer transistor provided in the semiconductor storage device according to the fifth modification.

As shown in FIG. 37, the shield conductor layer is not provided on the upper surface of the insulator layer 50. For example, the region including the transfer transistors TW0_0 and TW0_1 and the region including the transfer transistors TW1_0 and TW1_1 are adjacent to each other without sandwiching the shield conductor layer. Further, for example, the region including the transfer transistors TW0_0 and TW0_1 and the electrode 101 provided in the transfer transistor TW0_2 are adjacent to each other without sandwiching the shield conductor layer.

Figure 38:
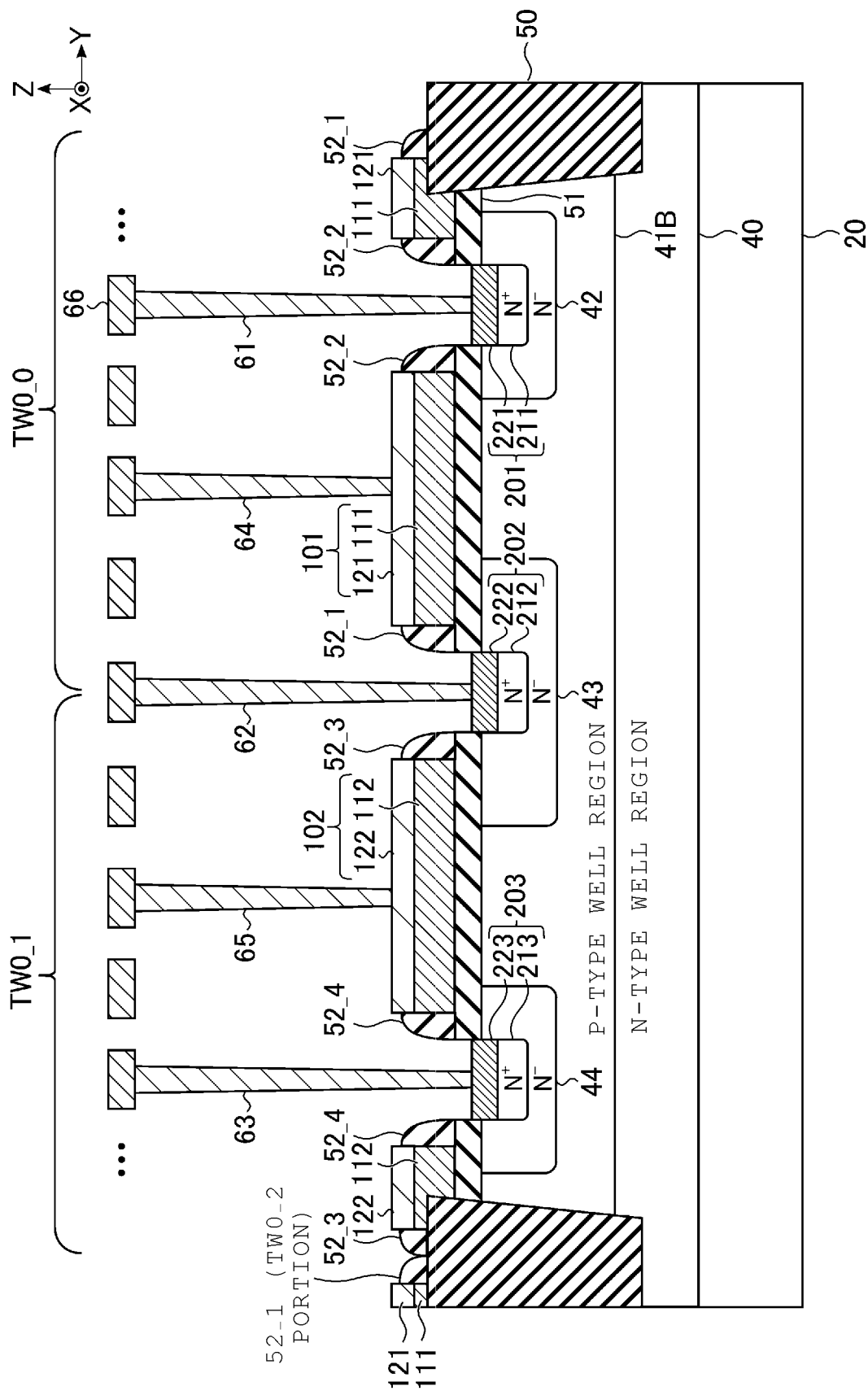
FIG. 38 is a cross-sectional view taken along the line XXXVIII-XXXVIII of FIG. 37, showing an example of the cross-sectional structure of the transfer transistor provided in the semiconductor storage device according to the fifth modification.

The cross-sectional structure of the transfer transistors TW0_0 and TW0_1 according to the fifth modification will be described with reference to FIG. 38. FIG. 38 is a cross-sectional view taken along the line XXXVIII-XXXVIII of FIG. 37, showing an example of the cross-sectional structure of the transfer transistor provided in the semiconductor storage device according to the fifth modification.

As shown in FIG. 38, the first portion of the sidewall 52_3 provided in the transfer transistors TW0_0 and TW0_1 is in contact with the first portion of the sidewall 52_1 provided in the electrode 101 provided in the transfer transistor TW0_2. That is, the sidewalls 52 provided in each of the two sets of transfer transistors TW adjacent to each other in the Y direction are adjacent to each other.

Although not shown, for example, even in the cross-sectional structure of the transfer transistor TW along the XZ plane, the sidewalls 52 provided in each of the two sets of transfer transistors TW adjacent to each other in the X direction are adjacent to each other. More specifically, for example, the sidewalls 52_1 and 52_3 provided in the transfer transistors TW0_0 and TW0_1 are adjacent to the sidewalls 52_1 and 52_3 provided in the transfer transistors TW1_0 and TW1_1, respectively, in the X direction.

Even with the configuration of the transfer transistor as described above, the same effect as that of the embodiment, the first modification, the second modification, and the fourth modification can be obtained.

3. Other Embodiments

In the above-described embodiments and modifications, the memory cell array 10 is provided above the semiconductor substrate 20 on which the peripheral circuit PERI has been formed, but the present disclosure is not limited thereto. The semiconductor storage device 1 may have, for example, a configuration in which a circuit chip including a peripheral circuit PERI and a memory chip including a memory cell array 10 are bonded together.

Figure 39:
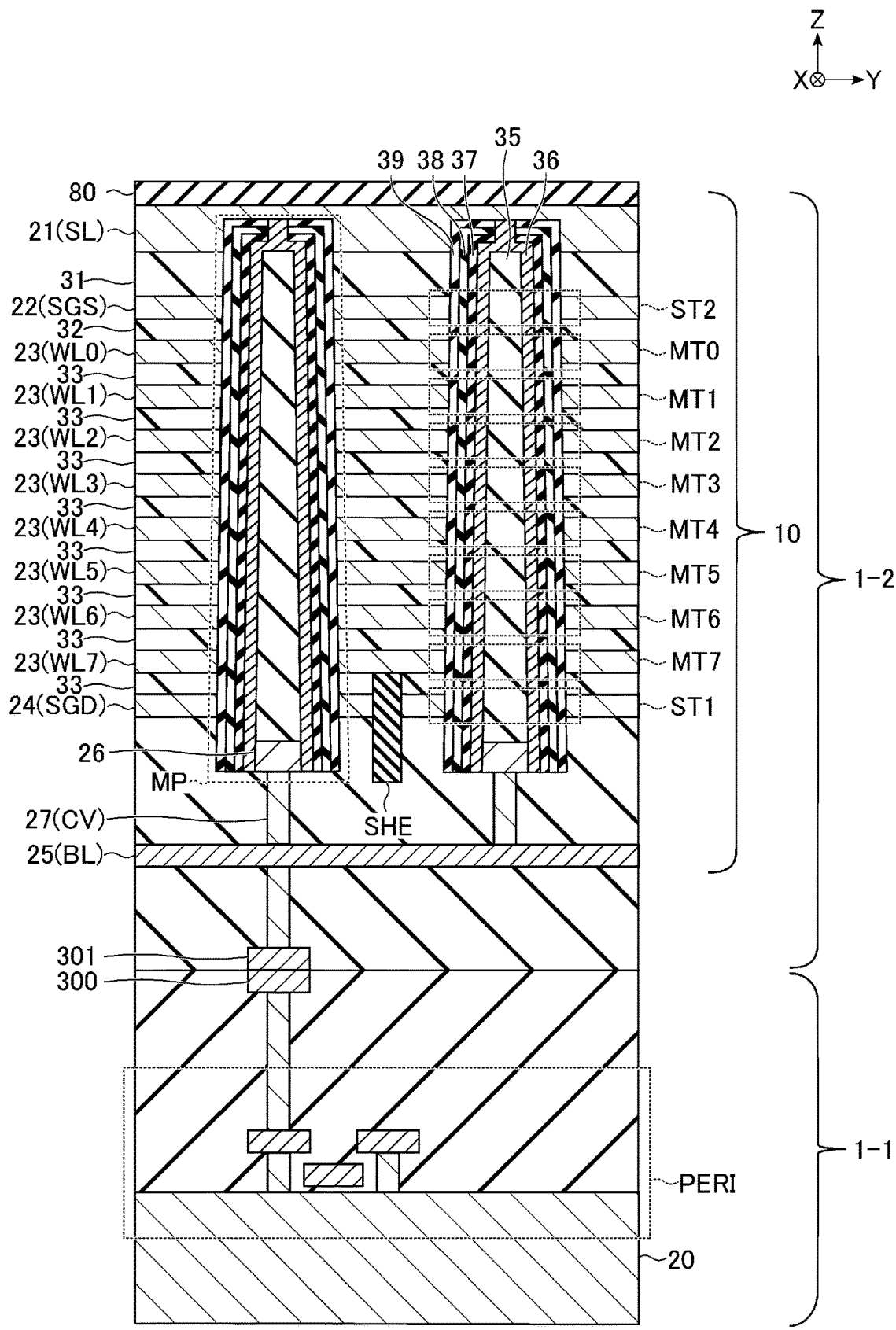
FIG. 39 is a cross-sectional view showing an example of a cross-sectional structure of a semiconductor storage device according to another embodiment.

The cross-sectional structure of the semiconductor storage device 1 when the circuit chip and the memory chip are bonded to each other will be described with reference to FIG. 39. FIG. 39 is a cross-sectional view showing an example of the cross-sectional structure of the semiconductor storage device according to another embodiment.

As shown in FIG. 39, the semiconductor storage device 1 has a configuration in which the upper surface of a circuit chip 1-1 and the lower surface of a memory chip 1-2 are bonded together. The circuit chip 1-1 includes a semiconductor substrate 20, a conductor layer 300, and a peripheral circuit PERI. The memory chip 1-2 includes a conductor layer 301 and a memory cell array 10.

The cross-sectional structure of the circuit chip 1-1 will be described.

The peripheral circuit PERI is formed on the semiconductor substrate 20. In FIG. 39, one transistor is shown as an example of the configuration provided in the peripheral circuit PERI.

The conductor layer 300 is connected to one transistor in the peripheral circuit PERI. The conductor layer 300 is provided so that the upper surface thereof is flush with the upper surface of the circuit chip 1-1. The conductor layer 300 functions as a connection pad for electrically connecting the circuit chip 1-1 and the memory chip 1-2.

Next, the cross-sectional structure of the memory chip 1-2 will be described.

The conductor layer 301 is provided so that the lower surface thereof is flush with the lower surface of the memory chip 1-2. The conductor layer 301 is in contact with the conductor layer 300. As a result, the conductor layer 301 functions as a connection pad for electrically connecting the circuit chip 1-1 and the memory chip 1-2.

The conductor layer 301 is connected to the memory cell array 10. Since the memory cell array 10 according to another embodiment is equivalent to the memory cell array 10 according to the embodiment formed in the opposite direction along the Z direction, the description thereof will be omitted.

An insulator layer 80 is provided on the upper surface of the conductor layer 21 of the memory cell array 10.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor storage device comprising:
   a semiconductor substrate including a first region, a second region, and a third region located apart from each other in such an order in a first direction in an element region, each of the first to third regions including a source and/or drain region;
   a first conductor layer provided above the element region and having a first opening;
   a second conductor layer provided above the element region, having a second opening, and located apart from the first conductor layer in the first direction;
   a first contact, in the first opening, that is connected to the first region;
   a second contact, in the second opening, that is connected to the third region;
   a first memory cell connected to the first contact; and
   a second memory cell connected to the second contact; wherein
   the semiconductor substrate includes a fourth region including the element region,
   the element region is a first conductive type region, and
   the fourth region is a second conductive type region.

2. The semiconductor storage device according to claim 1, further comprising:
   a third contact connected to the second region and passing between the first conductor layer and the second conductor layer.

3. The semiconductor storage device according to claim 2, further comprising:
   a fifth region provided in the first region and having an impurity concentration higher than an impurity concentration in the first region;
   a sixth region provided in the second region and having an impurity concentration higher than an impurity concentration in the second region; and a seventh region provided in the third region and having an impurity concentration higher than an impurity concentration in the third region, wherein
the first contact is connected to the fifth region,
the second contact is connected to the seventh region, and
the third contact is connected to the sixth region.

4. The semiconductor storage device according to claim 3, further comprising:
a first insulator layer provided on a side surface of the first opening;
a second insulator layer provided on a side surface of the second opening;
a third conductor layer provided on an upper surface of the fifth region and connected to the first contact; and
a fourth conductor layer provided on an upper surface of the seventh region and connected to the second contact, wherein
in the first direction,
the third conductor layer is adjacent to the first insulator layer, and
the fourth conductor layer is adjacent to the second insulator layer.

5. The semiconductor storage device according to claim 4, further comprising:
a third insulator layer provided on an outer side surface of the first conductor layer; and
a fourth insulator layer provided on an outer side surface of the second conductor layer, wherein
in the first direction,
the third insulator layer is adjacent to the fourth insulator layer.

6. The semiconductor storage device according to claim 5, further comprising:
a fifth conductor layer provided on an upper surface of the sixth region and connected to the third contact, wherein
in the first direction,
the fifth conductor layer is adjacent to the third insulator layer and the fourth insulator layer,
a portion of the third insulator layer and a portion of the fourth insulator layer are in contact with each other.

7. The semiconductor storage device according to claim 6, further comprising:
a sixth conductor layer provided on an upper surface of the first conductor layer; and
a seventh conductor layer provided on an upper surface of the second conductor layer.

8. The semiconductor storage device according to claim 7, wherein
the third conductor layer, the fourth conductor layer, the fifth conductor layer, the sixth conductor layer, and the seventh conductor layer include silicide.

9. The semiconductor storage device according to claim 6, wherein
the first contact is in contact with the first insulator layer,
the second contact is in contact with the second insulator layer, and
the third contact is in contact with the third insulator layer and the fourth insulator layer.

10. The semiconductor storage device according to claim 5, further comprising:
a third conductor layer provided above the element region, sandwiched between the first conductor layer and the second conductor layer along the first direction, and having a third opening, wherein
the third contact passes through the third opening.

11. The semiconductor storage device according to claim 10, further comprising:
a fifth insulator layer provided on an outer side surface of the third conductor layer, wherein
the fifth insulator layer is in contact with the third insulator layer and the fourth insulator layer between the first conductor layer and the third conductor layer, and between the second conductor layer and the third conductor layer, respectively.

12. The semiconductor storage device according to claim 11, further comprising:
a sixth insulator layer provided on a side surface of the third opening; and
a fifth conductor layer provided on an upper surface of the sixth region and connected to the third contact, wherein
in the first direction, the fifth conductor layer is adjacent to the sixth insulator layer.

13. The semiconductor storage device according to claim 2, wherein
the first conductor layer includes a first portion, a second portion connected to one end of the first portion in the first direction, and a third portion sandwiched at least a portion of the second region together with the second portion in a second direction in an upper surface of the semiconductor substrate orthogonal to the first direction, and connected to the one end of the first portion in the first direction, and
the second conductor layer includes a first portion, a second portion connected to one end of the first portion in the first direction, and a third portion sandwiched at least a portion of the second region together with the second portion in the second direction, and connected to one end of the second portion in the first direction.

14. The semiconductor storage device according to claim 1, wherein
a voltage equal to or higher than a ground voltage is applied to the first conductor layer and the second conductor layer in the write operation, read operation, and erasing operation of the semiconductor storage device, respectively.

15. The semiconductor storage device according to claim 5, further comprising:
a seventh insulator layer surrounded the outer periphery of the element region;
an eighth conductor layer provided on an upper surface of the seventh insulator layer; and
an eighth insulator layer including a portion in contact with the third insulator layer and provided on a side surface of the eighth conductor layer.

16. A semiconductor storage device comprising:
a semiconductor substrate including an element region, wherein the semiconductor substrate further includes a first region and a second region, located apart from each other in such an order in a first direction in the element region, each of the first and second regions including a source and/or drain region;
a first conductor layer provided above the element region and having a first opening and a second opening;
a second conductor layer provided on an upper surface of the first region;
a third conductor layer provided on an upper surface of the second region;
a first insulator layer provided on a side surface of the first opening;
a second insulator layer provided on the side surface of the second opening;
a first contact, in the first opening, that is connected to the second conductor layer;

a second contact, in the second opening, that is connected to the third conductor layer; and a first memory cell provided above the semiconductor substrate and connected to the first contact, wherein in the first direction, the second conductor layer is adjacent to the first insulator layer, and the third conductor layer is adjacent to the second insulator layer, wherein the semiconductor substrate further includes a third region including the element region, the element region is a first conductive type region, and the third region is a second conductive type region.

17. The semiconductor storage device according to claim 16, further comprising:

a fourth conductor layer provided on an upper surface of the first conductor layer, wherein the second conductor layer, the third conductor layer, and the fourth conductor layer include silicide.

18. The semiconductor storage device according to claim 16, wherein the first contact is in contact with the first insulator layer, and the second contact is in contact with the second insulator layer.

19. The semiconductor storage device according to claim 16, further comprising:

a third insulator layer provided on an outer side surface of the first conductor layer;

a fourth insulator layer surrounded the outer periphery of the element region;

a fifth conductor layer provided on an upper surface of the fourth insulator layer; and a fifth insulator layer having a portion in contact with the third insulator layer and provided on a side surface of the fifth conductor layer.

* * * * *